(12) United States Patent
Kim et al.

(10) Patent No.: US 12,535,903 B2
(45) Date of Patent: Jan. 27, 2026

(54) DISPLAY APPARATUS HAVING A CONNECTING ELECTRODE WHICH CROSSES A BENDING AREA

(71) Applicant: LG Display Co., Ltd., Seoul (KR)

(72) Inventors: Jeong-Oh Kim, Goyang-si (KR); Seung-Chan Choi, Paju-si (KR); Jei-Hyun Lee, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/826,798

(22) Filed: Sep. 6, 2024

(65) Prior Publication Data

US 2024/0431166 A1 Dec. 26, 2024

Related U.S. Application Data

(63) Continuation of application No. 18/081,349, filed on Dec. 14, 2022, now Pat. No. 12,114,548, which is a
(Continued)

(30) Foreign Application Priority Data

Dec. 31, 2019 (KR) ........................ 10-2019-0180184
Nov. 27, 2020 (KR) ........................ 10-2020-0162230

(51) Int. Cl.
*G06F 3/041* (2006.01)
*G06F 3/044* (2006.01)
(Continued)

(52) U.S. Cl.
CPC .......... *G06F 3/0412* (2013.01); *G06F 3/0446* (2019.05); *H10K 59/1213* (2023.02);
(Continued)

(58) Field of Classification Search
None
See application file for complete search history.

(56) References Cited

U.S. PATENT DOCUMENTS 10,475,874 B2   11/2019   Rhe et al.
10,790,349 B2    9/2020   Rhe et al.
(Continued)

FOREIGN PATENT DOCUMENTS

CN   107230680 A   10/2017
CN   108110031 A    6/2018
(Continued)

OTHER PUBLICATIONS

China National Intellectual Property Administration, Office Action, Chinese Patent Application No. 202011518204.6, Dec. 25, 2023, 15 pages.
(Continued)

*Primary Examiner* — Christopher R Lamb
(74) *Attorney, Agent, or Firm* — Fenwick & West LLP

(57) ABSTRACT

A display apparatus having a connection electrode which crosses a bending area may be provided. The connection electrode may be disposed on a device substrate including a bending area between a display area and a pad area. The connection electrode may connect the display area and the pad area across the bending area. The connection electrode may have a stacked structure of the lower connecting electrode and the upper connecting electrode. A light-emitting device, an encapsulating element and a touch electrode may be sequentially stacked on the display area of the device substrate. The upper connecting electrode may include the same material as the touch electrode. Thus, in the display apparatus, the disconnection of the connection electrode due to bending stress and external impact may be reduced.

9 Claims, 47 Drawing Sheets

Related U.S. Application Data continuation of application No. 17/135,719, filed on Dec. 28, 2020, now Pat. No. 11,557,643.

(51) Int. Cl.
    *H10D 30/67*    (2025.01)
    *H10D 86/40*    (2025.01)
    *H10D 86/60*    (2025.01)
    *H10K 59/12*    (2023.01)
    *H10K 59/121*   (2023.01)
    *H10K 59/124*   (2023.01)
    *H10K 59/131*   (2023.01)
    *H10K 59/40*    (2023.01)
    *H10K 59/80*    (2023.01)
    *H10K 77/10*    (2023.01)
    *H10K 102/00*   (2023.01)

(52) U.S. Cl.
    CPC ......... *H10K 59/124* (2023.02); *H10K 59/131* (2023.02); *H10K 59/40* (2023.02); *H10K 59/873* (2023.02); *H10K 77/111* (2023.02); *H10D 30/6731* (2025.01); *H10D 30/6745* (2025.01); *H10D 30/6755* (2025.01); *H10D 86/423* (2025.01); *H10D 86/471* (2025.01); *H10D 86/60* (2025.01); *H10K 59/1201* (2023.02); *H10K 2102/311* (2023.02)

(56) References Cited

U.S. PATENT DOCUMENTS

| | | | |
|---|---|---|---|
| 10,963,076 | B2 | 3/2021 | Choi et al. |
| 11,322,573 | B2 | 5/2022 | Rhe et al. |
| 11,678,545 | B2 | 6/2023 | Rhe et al. |
| 2015/0301685 | A1 | 10/2015 | Kim et al. |
| 2016/0181346 | A1 | 6/2016 | Kwon et al. |
| 2016/0307938 | A1 | 10/2016 | Jin |
| 2017/0179432 | A1 | 6/2017 | Visweswaran et al. |
| 2017/0277288 | A1 | 9/2017 | Choi et al. |
| 2017/0294502 | A1* | 10/2017 | Ka .................. H10K 59/131 |
| 2017/0358641 | A1* | 12/2017 | Park .................. G09G 3/3233 |
| 2017/0358772 | A1 | 12/2017 | Sung et al. |
| 2018/0033821 | A1* | 2/2018 | Kim .................. H10D 86/441 |
| 2018/0108722 | A1 | 4/2018 | Nishikawa |
| 2018/0151125 | A1 | 5/2018 | Lee |
| 2018/0151662 | A1 | 5/2018 | Rhe et al. |
| 2019/0074304 | A1* | 3/2019 | Lee .................. H10D 86/60 |
| 2019/0095007 | A1 | 3/2019 | Jeong et al. |
| 2019/0107748 | A1 | 4/2019 | Zhang et al. |
| 2019/0179466 | A1 | 6/2019 | Kim et al. |
| 2019/0326361 | A1 | 10/2019 | Gwon et al. |
| 2020/0066824 | A1 | 2/2020 | Rhe et al. |
| 2020/0388667 | A1 | 12/2020 | Rhe et al. |
| 2020/0411598 | A1 | 12/2020 | Gwon et al. |
| 2022/0190287 | A1 | 6/2022 | Hanamoto |
| 2022/0231112 | A1 | 7/2022 | Rhe et al. |

FOREIGN PATENT DOCUMENTS

| | | |
|---|---|---|
| CN | 110400823 A | 11/2019 |
| EP | 3757734 A1 | 12/2020 |
| JP | 2018-063386 A | 4/2018 |
| KR | 10-2017-0095809 A | 8/2017 |
| KR | 10-2017-0139189 A | 12/2017 |
| KR | 10-2018-0061524 A | 6/2018 |
| KR | 10-2019-0035995 A | 4/2019 |
| KR | 10-2021-0001535 A | 1/2021 |

OTHER PUBLICATIONS

United States Office Action, U.S. Appl. No. 17/135,719, filed Jul. 8, 2022, 15 pages.
United States Office Action, U.S. Appl. No. 17/135,719, filed Feb. 2, 2022, 13 pages.
United States Office Action, U.S. Appl. No. 18/081,349, filed May 25, 2023, 12 pages.
United States Office Action, U.S. Appl. No. 18/081,349, filed Nov. 7, 2023, 14 pages.
United States Office Action, U.S. Appl. No. 18/081,349, filed Mar. 14, 2024, 13 pages.
Korean Intellectual Property Office, Office Action, Korean Patent Application No. 10-2020-0162230, May 21, 2025, 13 pages.

* cited by examiner

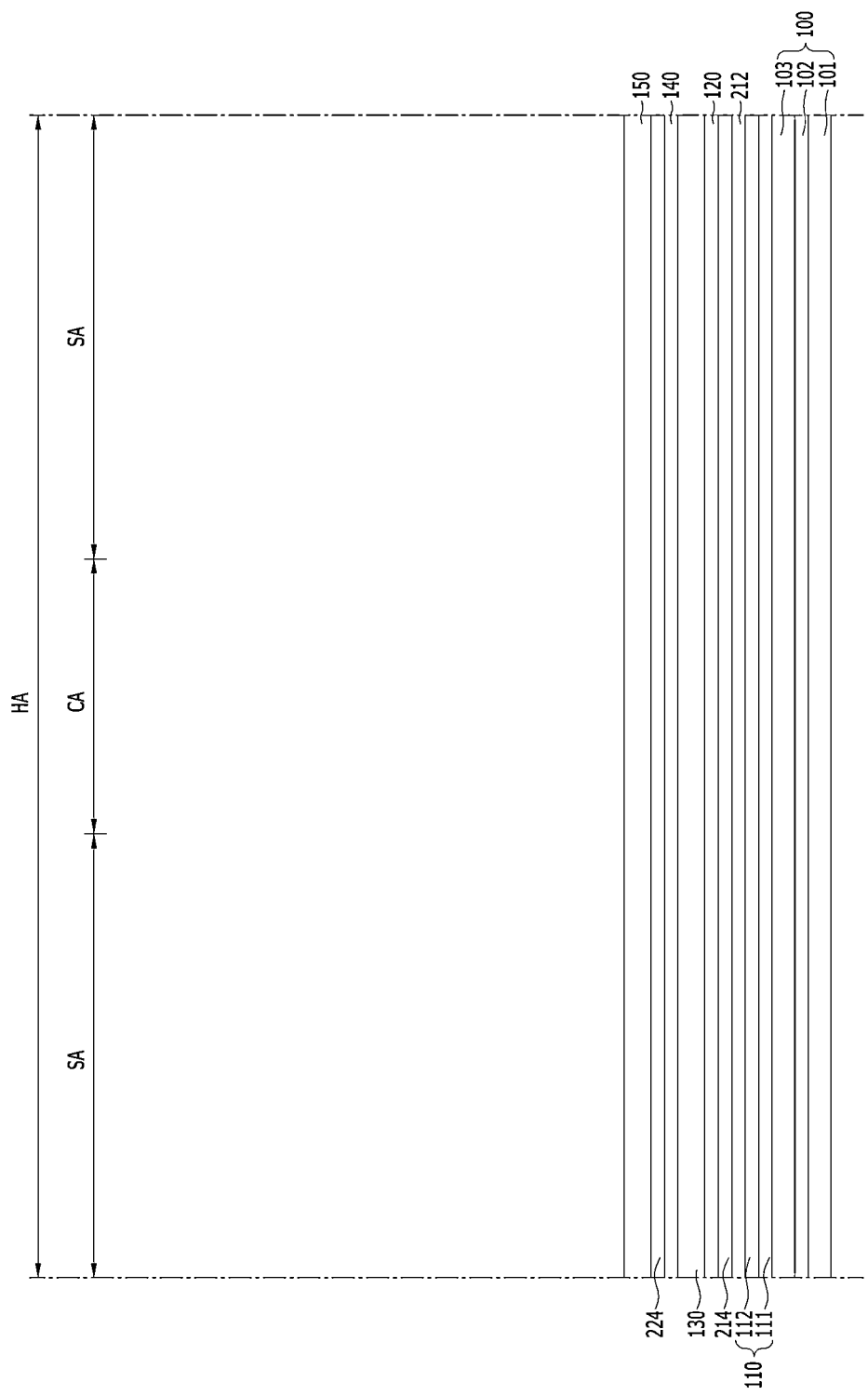

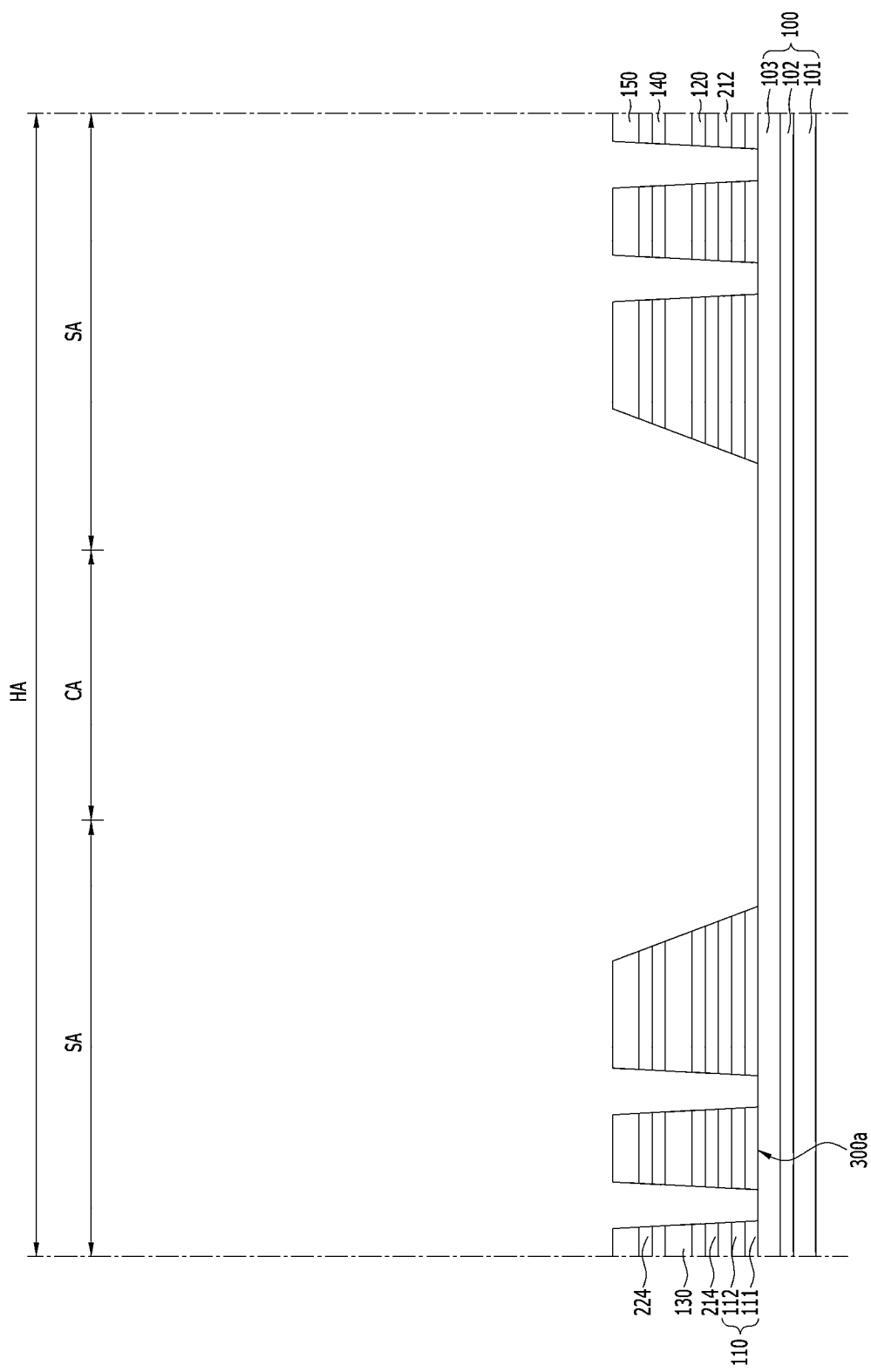

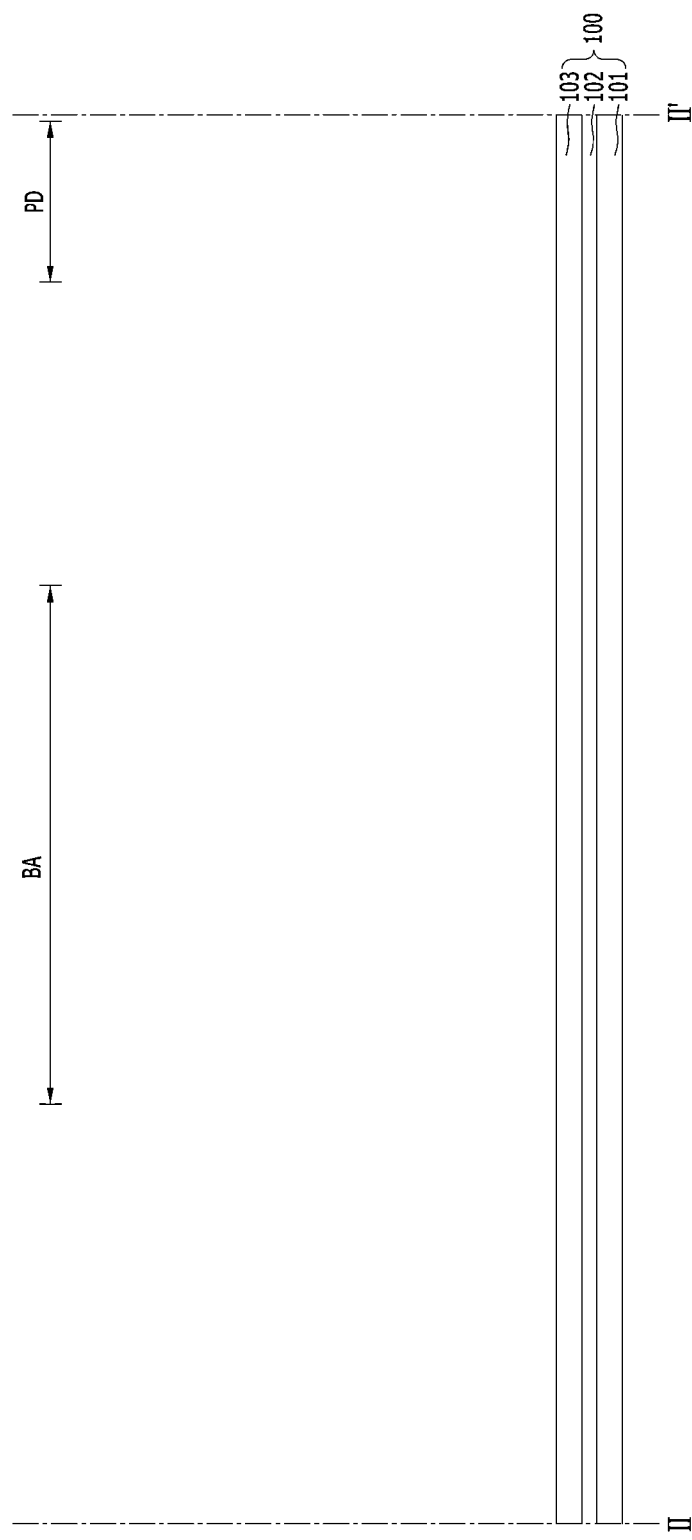

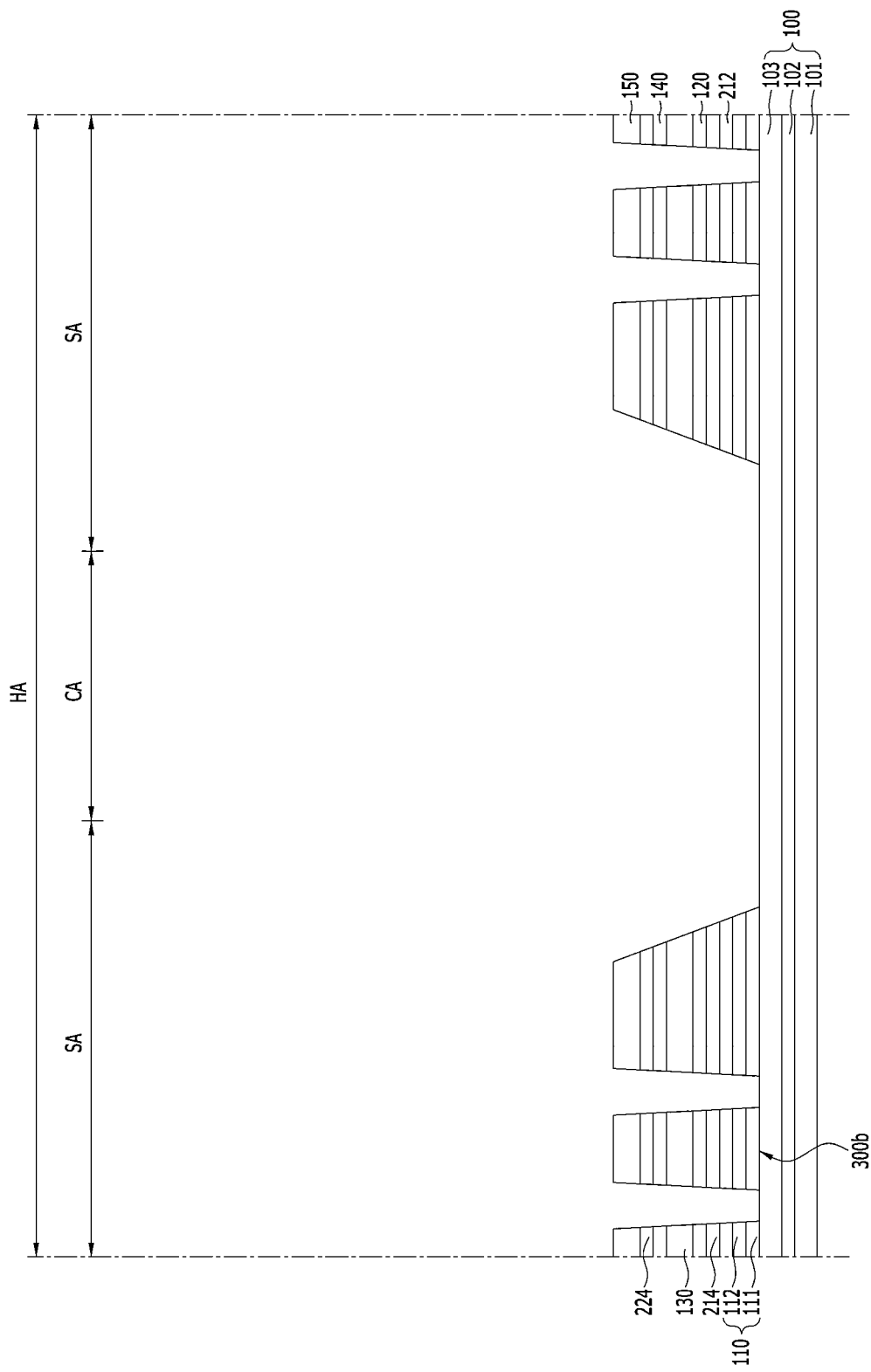

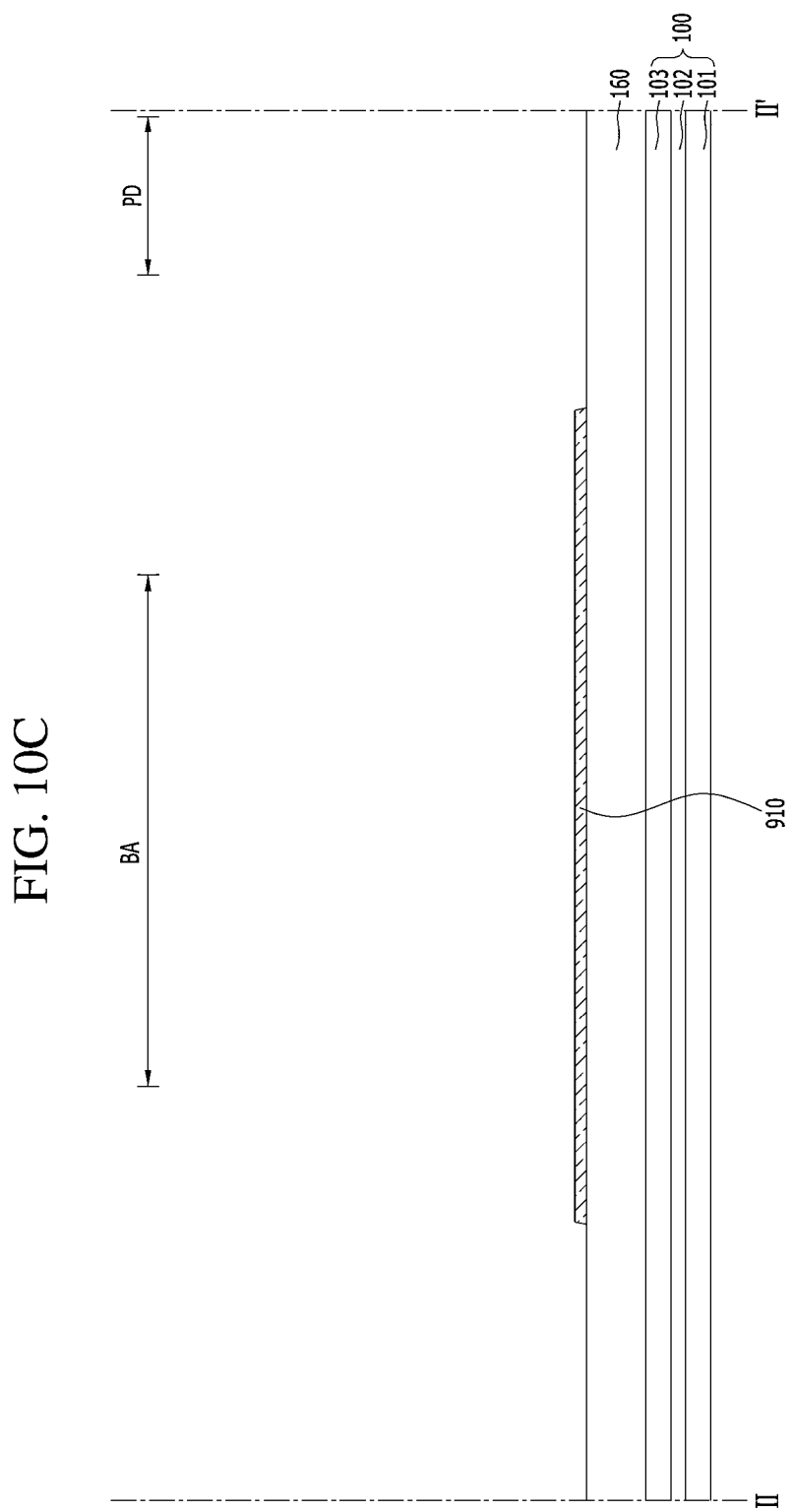

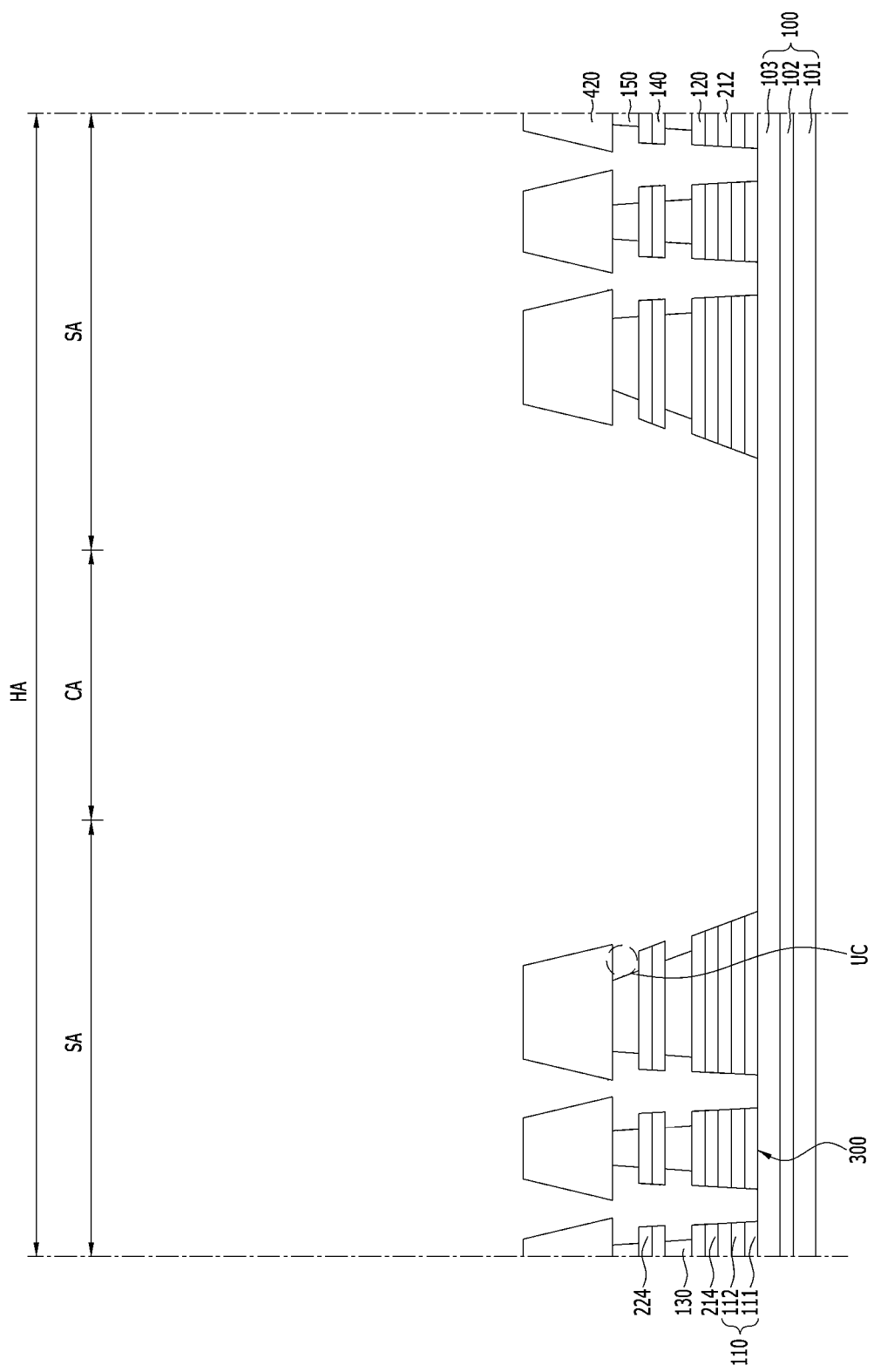

DISPLAY APPARATUS HAVING A CONNECTING ELECTRODE WHICH CROSSES A BENDING AREA

CROSS-REFERENCE TO RELATED APPLICATIONS

This application is a continuation of U.S. patent application Ser. No. 18/081,349 filed on Dec. 14, 2022, which is a continuation of U.S. patent application Ser. No. 17/135,719 filed on Dec. 28, 2020, which claims the priority benefit of Republic of Korea Patent Application No. 10-2019-0180184 filed on Dec. 31, 2019, and Republic of Korea Patent Application No. 10-2020-0162230 filed on Nov. 27, 2020, each of which are hereby incorporated by reference in its entirety.

BACKGROUND

Field of Technology

The present disclosure relates to a display apparatus in which a connection electrode connects a display area and a pad area across a bending area.

Discussion of the Related Art

Generally, an electronic appliance, such as a monitor, a television (TV), a laptop computer, and a digital camera, includes a display apparatus to display an image. For example, the display apparatus may include at least one light-emitting device. The light-emitting device may emit light displaying a specific color. For example, the light-emitting device may include a light-emitting layer between a first emission electrode and a second emission electrode.

The display apparatus may include a bending area between a display area and a pad area. The light-emitting device may be disposed on the display area. A pad to which an external signal is applied may be disposed on the pad area. The device substrate supporting the light-emitting device and the pad may be bent in the bending area. A connection electrode connecting the display area and the pad area may cross the bending area. Thus, in the display apparatus, the connection electrode may be disconnected due to bending stress or external impact.

SUMMARY DISCLOSURE

Accordingly, the present disclosure is directed to a display apparatus that substantially obviates one or more problems due to limitations and disadvantages of the related art.

An object of the present disclosure is to provide a display apparatus preventing the disconnection of the connection electrode due to the bending stress and the external impact.

Another object of the present disclosure is to provide a display apparatus in which the display area and the pad area may be stably connected by the connection electrode crossing the bending area.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, there is provided a display apparatus including a device substrate. The device substrate includes a display area and a bending area. A light-emitting device is disposed on the display area of the device substrate. An encapsulating element is disposed on the light-emitting device. A touch structure is disposed on the encapsulating element. The touch structure includes a touch electrode. A lower connecting electrode is disposed on the device substrate. The lower connecting electrode crosses the bending area of the device substrate. A crack preventing layer is disposed on the lower connecting electrode. The crack preventing layer includes a region overlapping with the bending area. An upper connecting electrode is disposed on the crack preventing layer. The upper connecting electrode crosses the bending area. The upper connecting electrode includes the same material as the touch electrode.

The upper connecting electrode may include a region overlapping with the lower connecting electrode.

The crack preventing layer may include a connection contact hole exposing a portion of the lower connecting electrode. The upper connecting electrode may be connected to the lower connecting electrode through the connection contact hole.

The connection contact hole may be disposed outside the bending area.

Thin film transistors may be disposed between the device substrate and the light-emitting device. The light-emitting device may be connected to one of the thin film transistors by an intermediate contact electrode. The lower connecting electrode may include the same material as the intermediate contact electrode.

The upper connecting electrode may be connected to the lower connecting electrode by a middle connecting electrode. The middle connecting electrode may include the same material as a first emission electrode of the light-emitting device.

In another aspect, a display apparatus comprises a device substrate. The device substrate includes a bending area disposed between a display area and a pad area. A light-emitting device, an encapsulating element, a crack preventing layer and a connection electrode are disposed on the device substrate. The light-emitting device is disposed on the display area. The encapsulating element covers the light-emitting device. A touch electrode is disposed on the encapsulating element. The touch electrode overlaps the display area. The touch electrode is connected to a link line. The link line extends outside the display area along a surface of the encapsulating element. The crack preventing layer is spaced away from the encapsulating element. The crack preventing layer includes a region overlapping with the bending area. The connection electrode connects the display area and the pad area across the bending area. The connection electrode has a stacked structure of a lower connecting electrode and an upper connecting electrode. The lower connecting electrode is disposed between the device substrate and the crack preventing layer. The upper connecting electrode is disposed on the crack preventing layer. The touch electrode, the link line and the upper connecting electrode include the same material.

The link line may be in direct contact with the upper connecting electrode.

A driving circuit may be disposed between the display area of the device substrate and the light-emitting device. The driving circuit may include a first thin film transistor and a second thin film transistor. The first thin film transistor may be connected to the light-emitting device. The second thin film transistor may be connected to the first thin film transistor. A second semiconductor pattern of the second thin film transistor may include a material different from a first semiconductor pattern of the first thin film transistor.

The second semiconductor pattern of the second thin film transistor may include a metal oxide.

A first over-coat layer may be disposed between the device substrate and the light-emitting device. The first over-coat layer may cover the driving circuit. A second over-coat layer may be disposed between the first over-coat layer and the light-emitting device. The crack preventing layer may include the same material as the second over-coat layer.

A gate driver may be disposed on the device substrate. The gate driver may be spaced away from the display area, the pad area and the bending area. The gate driver may include at least third thin film transistor. A third semiconductor pattern of the third thin film transistor may include the same material as the first semiconductor pattern of the first thin film transistor.

A touch buffer layer may be disposed between the encapsulating element and the touch electrode. The touch buffer layer may extend between the encapsulating element and the link line, and between the crack preventing layer and the upper connecting electrode.

The connection electrode may further include a middle connecting electrode connecting the lower connecting electrode and the upper connecting electrode. The middle connecting electrode may penetrate the crack preventing layer at the outside of the bending area.

A substrate hole may penetrate the device substrate. The light-emitting device may be spaced away from the substrate hole. A separating device may be disposed between the light-emitting device and the substrate hole. The separating device may have at least one under-cut structure.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings:

FIGS. 4A-17A, 4B-17B and 4C-17C are views sequentially showing a method of forming the display apparatus according to the embodiment of the present disclosure.

DETAILED DESCRIPTION

Figure 1:
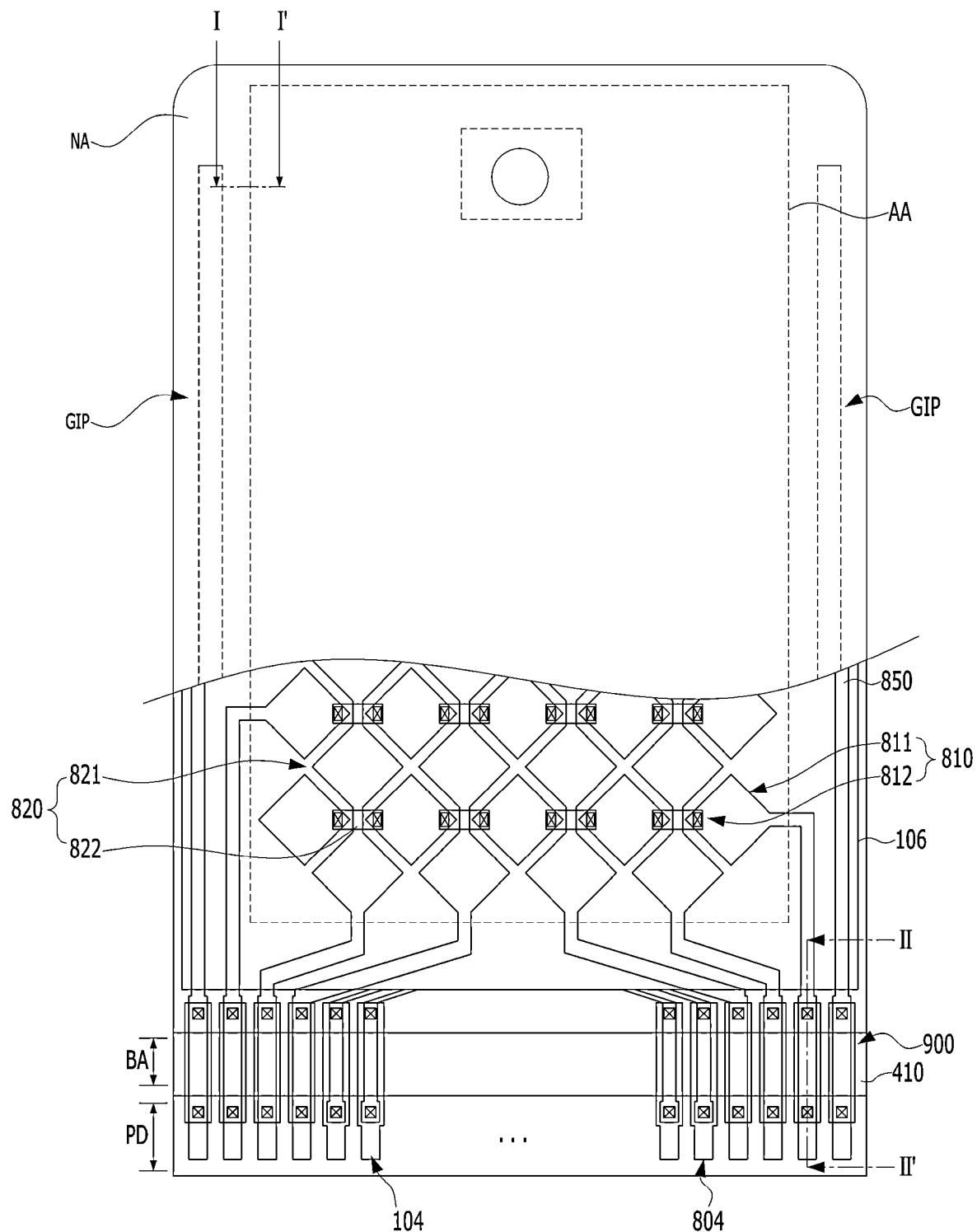
FIG. 1 is a view schematically showing a display apparatus according to an embodiment of the present disclosure.

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be satisfactorily transferred to those skilled in the art, and thus the present disclosure may be embodied in other forms and is not limited to the embodiments described below.

In addition, the same or extremely similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

EMBODIMENT

Figure 2:
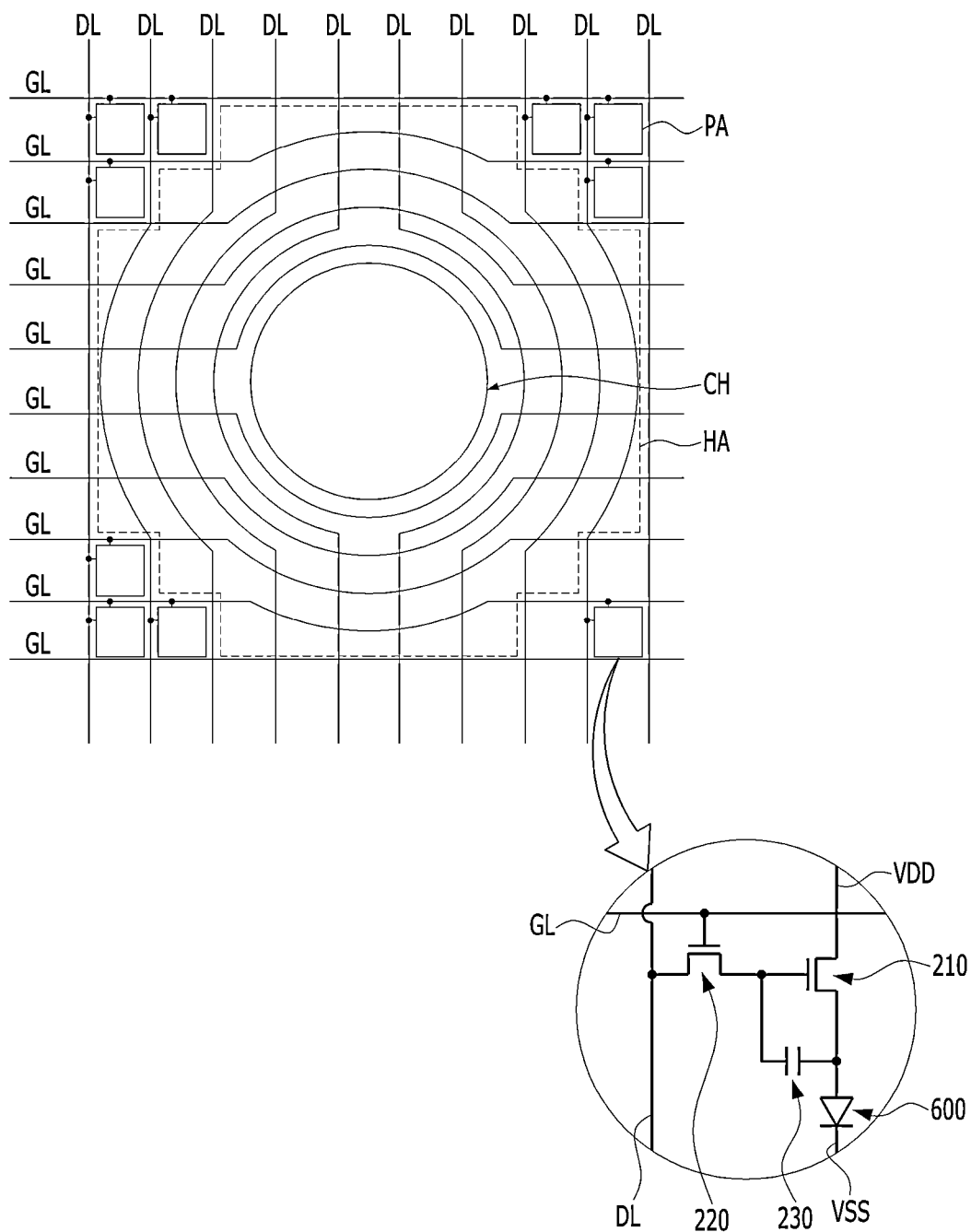
FIG. 2 is a view schematically showing a hole peripheral area of the display apparatus according to the embodiment of the present disclosure.
Figure 3A:
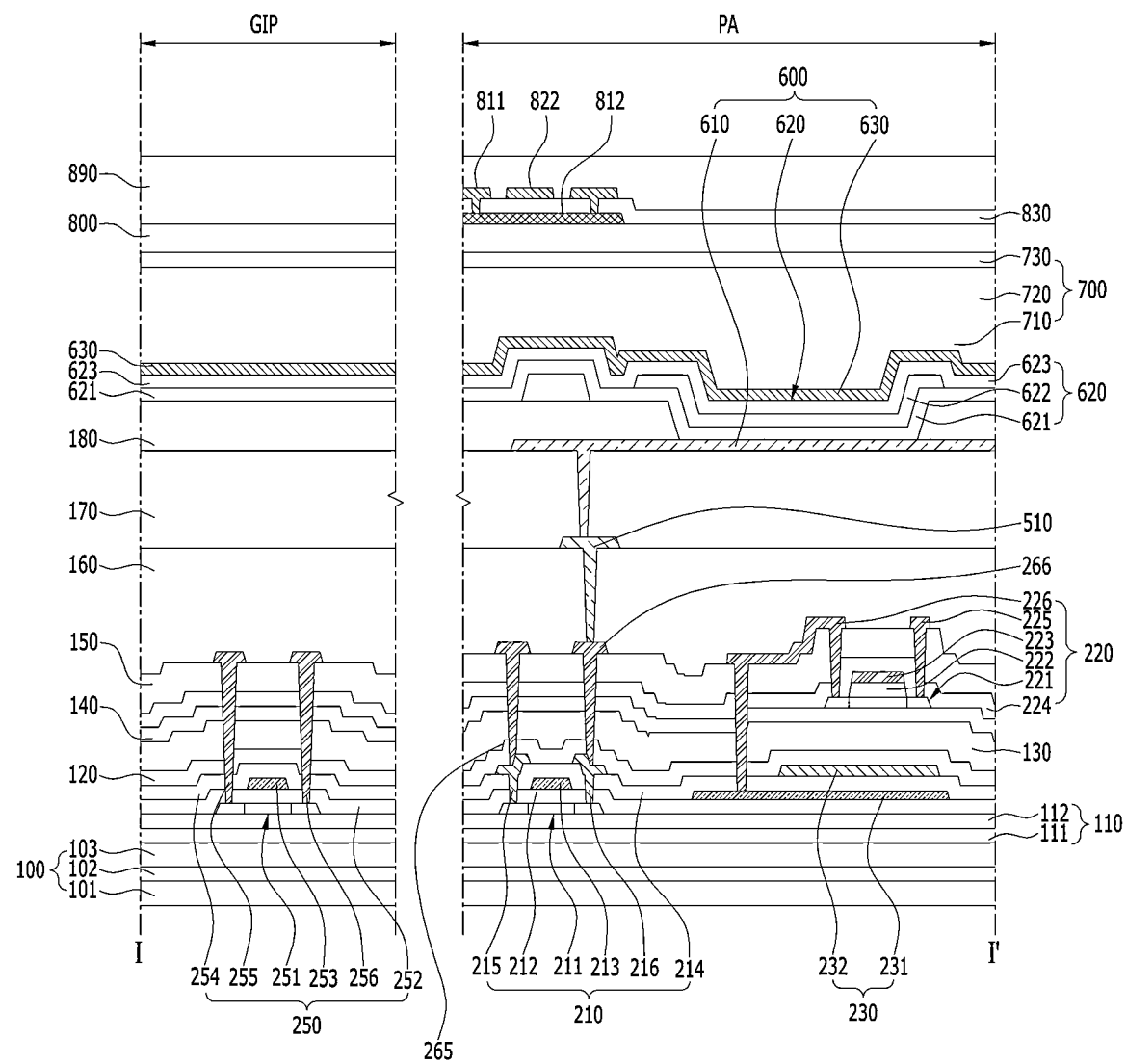
FIG. 3A is a view showing a cross-section taken along I-I' of FIG. 1 according to the embodiment of the present disclosure.
Figure 3B:
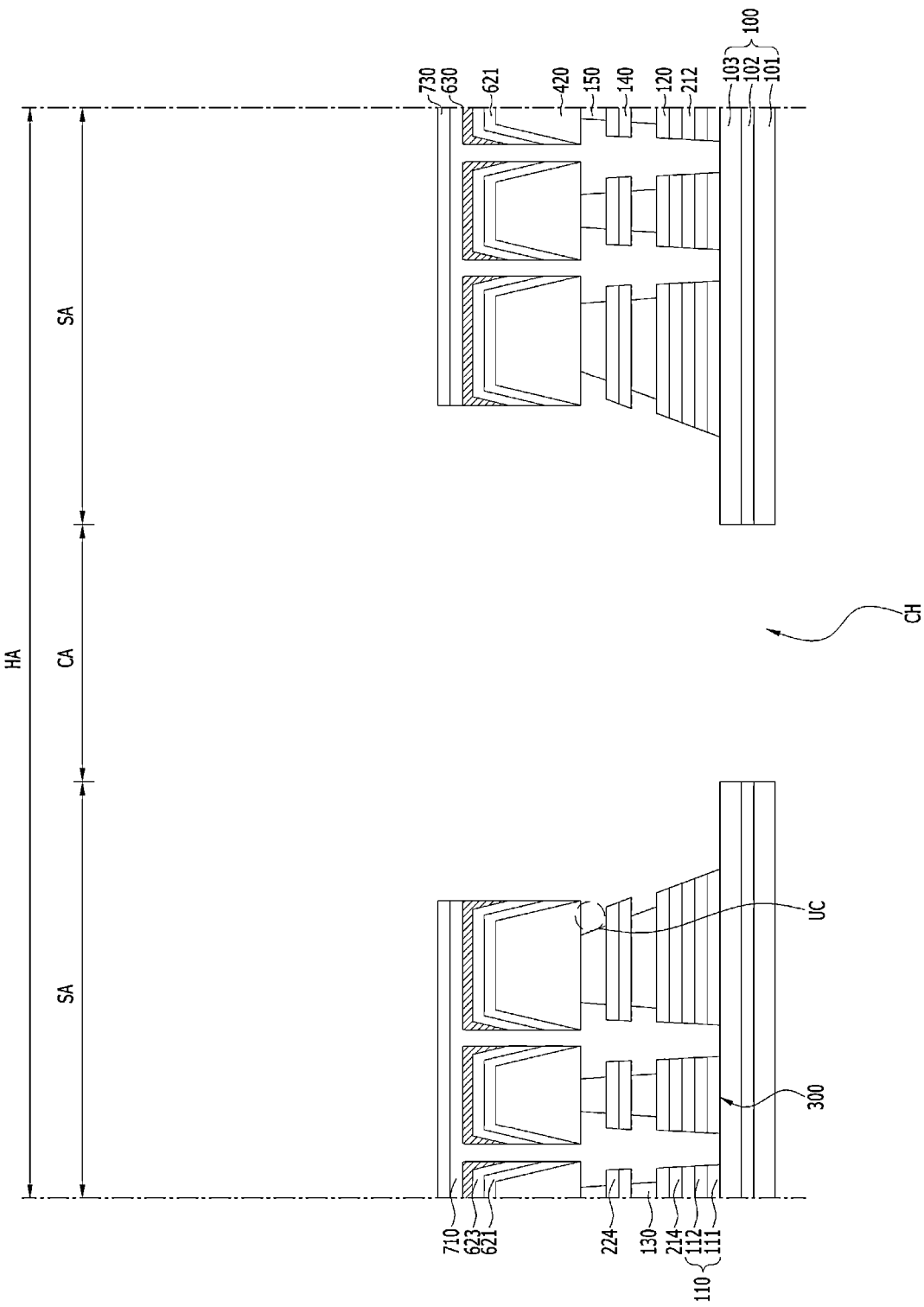
FIG. 3B is a view showing a cross-section of the hole peripheral area in the display apparatus according to the embodiment of the present disclosure.
Figure 3C:
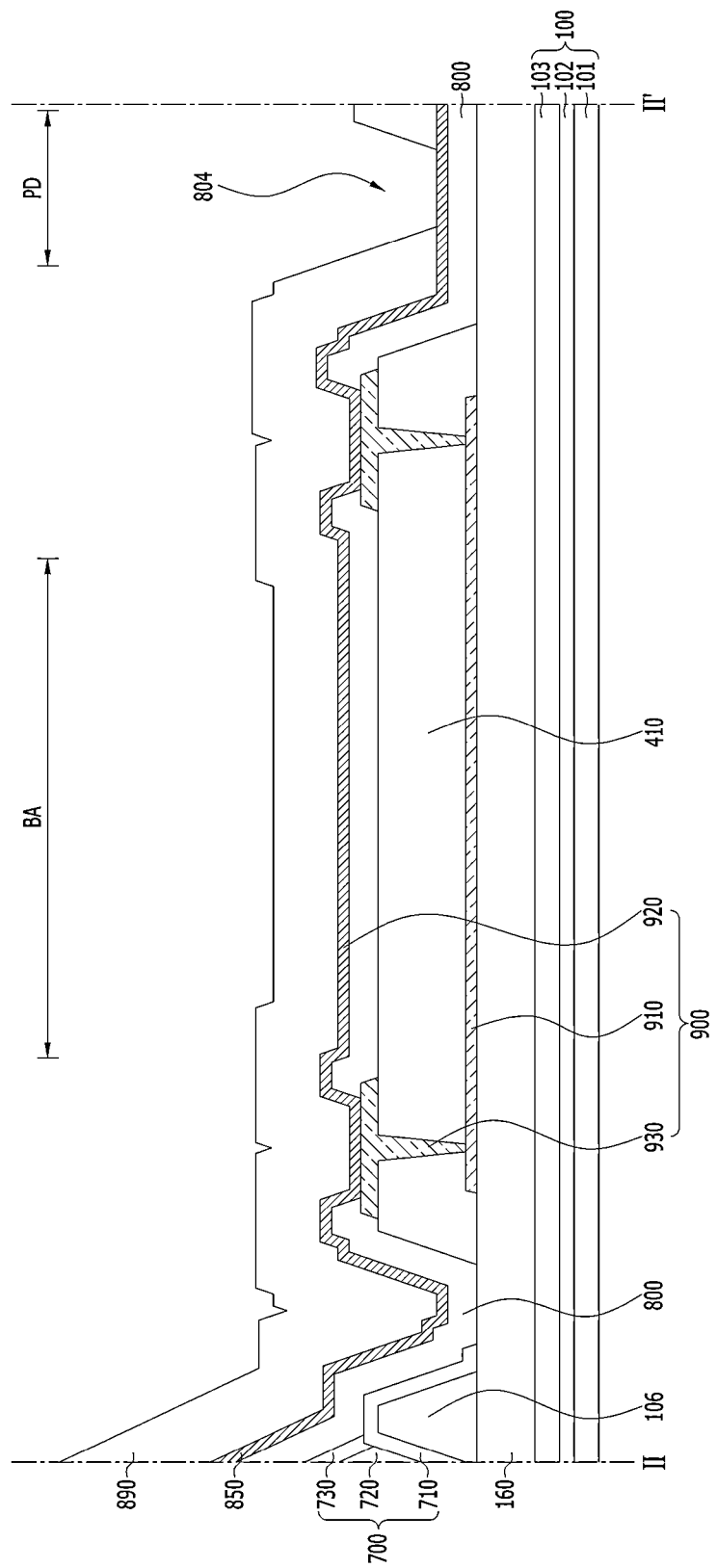
FIG. 3C is a view showing a cross-section taken along II-II' of FIG. 1 according to the embodiment of the present disclosure.

FIG. 1 is a view schematically showing a display apparatus according to an embodiment of the present disclosure. FIG. 2 is a view schematically showing a hole peripheral area of the display apparatus according to the embodiment of the present disclosure. FIG. 3A is a view showing a cross-section taken along I-I' of FIG. 1 according to an embodiment of the present disclosure. FIG. 3B is a view showing a cross-section of the hole peripheral area in the display apparatus according to the embodiment of the present disclosure. FIG. 3C is a view showing a cross-section taken along II-II' of FIG. 1 according to an embodiment of the present disclosure.

Referring to FIGS. 1, 2 and 3A to 3C, the display apparatus according to the embodiment of the present disclosure may include a device substrate 100. The device substrate 100 may include an insulating material. For example, the device substrate 100 may include glass or plastic. The device substrate 100 may have a multi-layer structure. For example, the device substrate 100 may include a structure in which a first substrate layer 101, a substrate insulating layer 102, and a second substrate layer 103 are sequentially stacked. The second substrate layer 103 may include the same material as the first substrate layer 101. For example, the first substrate layer 101 and the second substrate layer 103 may include a polymer material such as polyimide (PI). The substrate insulating layer 102 may include an insulating material. Thus, in the display apparatus according to the embodiment of the present disclosure, the device substrate 100 may have flexibility. Therefore, in the display apparatus according to the embodiment of the present disclosure, the damage of the device substrate 100 due to bending stress may be prevented.

The device substrate 100 may include a display area AA, a bending area BA, and a pad area PD. An image provided to the user may be realized in the display area AA. For example, the display area AA may include a plurality of pixel areas PA. Each of the pixel areas PA may display a specific color. For example, a light-emitting device 600 may be disposed on each pixel area PA. The light-emitting device 600 may emit light displaying the specific color. For example, the light-emitting device 600 may include a first emission electrode 610, a light-emitting layer 620 and a second emission electrode 630, which are sequentially stacked on the device substrate 100.

The first emission electrode 610 may include a conductive material. The first emission electrode 610 may have a high-reflectance. For example, the first emission electrode 610 may include a metal such as aluminum (Al) and a silver (Ag). The first emission electrode 610 may have a multi-layer structure. For example, the first emission electrode 610 may have a structure in which a reflective electrode formed of a metal is disposed between transparent electrodes formed of a transparent conductive material such as ITO and IZO.

The light-emitting layer 620 may generate light having luminance corresponding to a voltage difference between the first emission electrode 610 and the second emission electrode 630. For example, the light-emitting layer 620 may include an emission material layer (EML) 622 having an emission material. The emission material may include an organic material, an inorganic material or a hybrid material. For example, the display apparatus according to the embodiment of the present disclosure may be an organic light-emitting display apparatus having the emission material layer 622 formed of an organic material. The light-emitting layer 620 may have a multi-layer structure. For example, the light-emitting layer 620 may include at least one of a first emitting common layer 621 between the first emission electrode 610 and the emission material layer 622, and a second emitting common layer 623 between the emission material layer 622 and the second emission electrode 630. Each of the first emitting common layer 621 and the second emitting common layer 623 may include at least one of a hole injection layer (HIL), a hole transport layer (HTL), an electron transport layer (ETL), and an electron injection layer (EIL). For example, in the display apparatus according to the embodiment of the present disclosure, the first emitting common layer 621 may include at least one of the hole injection layer (HIL) and the hole transport layer (HTL), and the second emitting common layer 623 may include at least one of the electron transport layer (ETL) and the electron injection layer (EIL). Thus, in the display apparatus according to the embodiment of the present disclosure, luminous efficiency of the light-emitting device 600 may be increased.

The second emission electrode 630 may include a conductive material. The second emission electrode 630 may include a material different from the first emission electrode 610. For example, the second emission electrode 630 may be a transparent electrode formed of a transparent conductive material such as ITO and IZO. The second emission electrode 630 may have a higher transmittance than the first emission electrode 610. Thus, in the display apparatus according to the embodiment of the present disclosure, the light generated from the light-emitting layer 620 may be emitted though the second emission electrode 630.

A driving circuit may be disposed in each pixel area PA. The driving circuit may generate a driving current provided to the light-emitting device 600. The driving circuit may be connected to signal lines GL, DL, VDD and VSS. For example, each of the pixel areas PA may be defined by the signal lines GL, DL, VDD and VSS. The signal lines GL, DL, VDD and VSS may transmit various signals for realizing an image. For example, the signal lines GL, DL, VDD and VSS may include a gate line GL for applying a gate signal, a data line DL for applying a data signal, and power supply lines VDD and VSS for supplying a power voltage. The driving circuit may generate the driving current corresponding the data signal according to the gate signal. The operation of the light-emitting device 600 may be maintained for one frame. For example, the driving circuit may include a first thin film transistor 210, a second thin film transistor 220 and a storage capacitor 230.

The first thin film transistor 210 may be electrically connected to the light-emitting device 600. The first thin film transistor 210 may supply the driving current corresponding to the data signal to the light-emitting device 600. For example, the first thin film transistor 210 may be disposed between the light-emitting device 600 and one of the power supply lines VDD and VSS. The first thin film transistor 210 may include a first semiconductor pattern 211, a first gate insulating layer 212, a first gate electrode 213, a first interlayer insulating layer 214, a first source electrode 215 and a first drain electrode 216.

The first semiconductor pattern 211 may be disposed close to the device substrate 100. The first semiconductor pattern 211 may include a semiconductor material. For example, the first semiconductor pattern 211 may include silicon. The first semiconductor pattern 211 may include a poly-crystalline semiconductor. For example, the first semiconductor pattern 211 may include a low temperature poly-Si (LTPS). The first semiconductor pattern 211 may include a first source region, a first drain region and a first channel region. The first channel region may be disposed between the first source region and the first drain region. The first channel region may have a lower electrical conductivity than the first source region and the first drain region. For example, the first source region and the first drain region may contain a higher content of conductive impurities than the first channel region.

The first gate insulating layer 212 may be disposed on the first semiconductor pattern 211. The first gate insulating layer 212 may extend beyond the first semiconductor pattern 211. For example, a side of the first semiconductor pattern 211 may be covered by the first gate insulating layer 212. The first gate insulating layer 212 may include an insulating material. For example, the first gate insulating layer 212 may include silicon oxide (SiO) and/or silicon nitride (SiN). The silicon oxide (SiO) may include silicon dioxide ($SiO_2$). The first gate insulating layer 212 may include a material having a high dielectric constant. For example, the first gate insulating layer 212 may include a high-K material, such as hafnium oxide (HfO).

The first gate electrode 213 may be disposed on the first gate insulating layer 212. The first gate electrode 213 may include a conductive material. For example, the first gate electrode 213 may include a metal, such as aluminum (Al), chromium (Cr), copper (Cu), titanium (Ti), molybdenum (Mo) or tungsten (W). The first gate electrode 213 may be insulated from the first semiconductor patter 211 by the first gate insulating layer 212. The first gate electrode 213 may overlap with the first channel region of the first semiconductor pattern 211. For example, the first channel region of the first semiconductor pattern 211 may have an electrical conductivity corresponding to a voltage applied to the first gate electrode 213.

The first interlayer insulating layer 214 may be disposed on the first gate electrode 213. The first interlayer insulating layer 214 may extend beyond the first gate electrode 213. For example, a side of the first gate electrode 213 may be covered by the first interlayer insulating layer 214. The first interlayer insulating layer 214 may extend along the first gate insulating layer 212. The first interlayer insulating layer 214 may include an insulating material. For example, the first interlayer insulating layer 214 may include silicon oxide (SiO).

The first source electrode 215 may be disposed on the first interlayer insulating layer 214. The first source electrode 215 may include a conductive material. For example, the first source electrode 215 may include a metal, such as aluminum (Al), chromium (Cr), copper (Cu), titanium (Ti), molybdenum (Mo) or tungsten (W). The first source electrode 215 may be insulated from the first gate electrode 213 by the first interlayer insulating layer 214. The first source electrode 215 may include a material different from the first gate electrode 213. The first source electrode 215 may be electrically connected to the first source region of the first semiconductor pattern 211. For example, the first gate insulating layer 212 and the first interlayer insulating layer 214 may include a first source contact hole partially exposing the first source region of the first semiconductor pattern 211. The first source electrode 215 may include a region overlapping with the first source region of the first semiconductor pattern 211. For example, the first source electrode 215 may be in direct contact with the first source region of the first semiconductor pattern 211 in the first source contact hole.

The first drain electrode 216 may be disposed on the first interlayer insulating layer 214. The first drain electrode 216 may include a conductive material. For example, the first drain electrode 216 may include a metal, such as aluminum (Al), chromium (Cr), copper (Cu), titanium (Ti), molybdenum (Mo) or tungsten (W). The first drain electrode 216 may be insulated from the first gate electrode 213 by the first interlayer insulating layer 214. The first drain electrode 216 may include a material different from the first gate electrode 213. For example, the first drain electrode 216 may include the same material as the first source electrode 215. The first drain electrode 216 may be formed by the same process as the first source electrode 215. The first drain electrode 216 may be electrically connected to the first drain region of the first semiconductor pattern 211. The first drain electrode 216 may be spaced away from the first source electrode 215. For example, the first gate insulating layer 212 and the first interlayer insulating layer 214 may include a first drain contact hole partially exposing the first drain region of the first semiconductor pattern 211. The first drain electrode 216 may include a region overlapping with the first drain region of the first semiconductor pattern 211. For example, the first drain electrode 216 may be in direct contact with the first drain region of the first semiconductor pattern 211 in the first drain contact hole.

The second thin film transistor 220 may be electrically connected to the first thin film transistor 210. The second thin film transistor 220 may transmit the data signal to the first thin film transistor 210 according to the scan signal. For example, the second thin film transistor 220 may be disposed between the data line DL and the first gate electrode 213 of the first thin film transistor 210. A structure of the second thin film transistor 220 may be the same as a structure of the first thin film transistor 210. For example, the second thin film transistor 220 may include a second semiconductor pattern 221, a second gate insulating layer 222, a second gate electrode 223, a second interlayer insulating layer 224, a second source electrode 225 and a second drain electrode 226.

The second semiconductor pattern 221 may include a semiconductor material. The second semiconductor pattern 221 may include a material different from the first semiconductor pattern 211. For example, the second semiconductor pattern 221 may include an oxide semiconductor formed of a metal oxide such as IGZO. The second semiconductor pattern 221 may be disposed on a layer different from the first semiconductor pattern 211. For example, a separation insulating layer 140 may be disposed on the first thin film transistor 210, and the second semiconductor pattern 221 may be disposed on the separation insulating layer 140. Thus, in the display apparatus according to the embodiment of the present disclosure, the damage of the second semiconductor pattern 221 due to a process of forming the first semiconductor pattern 211 may be reduced. The second semiconductor pattern 221 may include a second source region, a second drain region and a second channel region. The second channel region may be disposed between the second source region and the second drain region. The second source region and the second drain region may have a lower resistance than the second channel region. For example, the second source region and the second drain region may include a conductorized portion of an oxide semiconductor. The second channel region may be a region of the oxide semiconductor which is not conductorized.

The second gate insulating layer 222 may be disposed on the second semiconductor pattern 221. The second gate insulating layer 222 may overlap with the second channel region of the second semiconductor pattern 221. The second source region and the second drain region of the second semiconductor pattern 221 may not overlap with the second gate insulating layer 222. For example, the second gate insulating layer 222 may expose the second source region and the second drain region of the second semiconductor pattern 221. The second source region and the second drain region of the second semiconductor pattern 221 may be disposed outside the second gate insulating layer 222. For example, the second source region and the second drain region of the second semiconductor pattern 221 may be conductorized by an etchant used in a process of patterning the second gate insulating layer 222. The second gate insulating layer 222 may include an insulating material. The second gate insulating layer 222 may include the same material as the first gate insulating layer 221. For example, the second gate insulating layer may have a multi-layer structure.

The second gate electrode 223 may be disposed on the second gate insulating layer 222. For example, the second gate electrode 223 may overlap with the second channel region of the second semiconductor pattern 221. The second gate electrode 223 may include a conductive material. For example, the second gate electrode 223 may include a metal, such as aluminum (Al), chromium (Cr), copper (Cu), titanium (Ti), molybdenum (Mo) or tungsten (W). The second gate electrode 223 may include the same material as the first gate electrode 213. The second gate electrode 223 may be insulated from the second semiconductor pattern 221 by the second gate insulating layer 222. For example, the second channel region of the semiconductor pattern 221 may have an electrical conductivity corresponding a voltage applied to the second gate electrode 223.

The second interlayer insulating layer 224 may be disposed on the second gate electrode 223. The second interlayer insulating layer 224 may extend beyond the second gate electrode 223. For example, the second source region and the second drain region of the second semiconductor pattern 221 and a side of the second gate electrode 223 may be covered by the second interlayer insulating layer 224. The second interlayer insulating layer 224 may include an insulating material. The second interlayer insulating layer 224 may include the same material as the first interlayer insulating layer 214. For example, the second interlayer insulating layer 224 may include silicon oxide (SiO).

The second source electrode 225 may be disposed on the second interlayer insulating layer 224. The second source electrode 225 may include a conductive material. For example, the second source electrode 225 may include a metal, such as aluminum (Al), chromium (Cr), copper (Cu), titanium (Ti), molybdenum (Mo) or tungsten (W). The second source electrode 225 may include the same material as the first source electrode 215. The second source electrode 225 may be insulated from the second gate electrode 223 by the second interlayer insulating layer 224. The second source electrode 225 may include a material different from the second gate electrode 223. The second source electrode 225 may be electrically connected to the second source region of the second semiconductor pattern 221. For example, the second interlayer insulating layer 224 may include a second source contact hole partially exposing the second source region of the second semiconductor pattern 221. The second source electrode 225 may include a region overlapping with the second source region of the second semiconductor pattern 221. For example, the second source electrode 225 may be in direct contact with the second source region of the second semiconductor pattern 221 in the second source contact hole.

The second drain electrode 226 may be disposed on the second interlayer insulating layer 224. The second drain electrode 226 may include a conductive material. For example, the second drain electrode 226 may include a metal, such as aluminum (Al), chromium (Cr), copper (Cu), titanium (Ti), molybdenum (Mo) or tungsten (W). The second drain electrode 226 may include the same material as the first drain electrode 216. The second drain electrode 226 may be insulated from the second gate electrode 223 by the second interlayer insulating layer 224. The second drain electrode 226 may include a material different from the second gate electrode 223. For example, the second drain electrode 226 may include the same material as the second source electrode 225. The second drain electrode 226 may be formed by the same process as the second source electrode 225. The second drain electrode 226 may be electrically connected to the second drain region of the second semiconductor pattern 221. The second drain electrode 226 may be spaced away from the second source electrode 225. For example, the second interlayer insulating layer 224 may include a second drain contact hole partially exposing the second drain region of the second semiconductor pattern 221. The second drain electrode 226 may include a region overlapping with the second drain region of the second semiconductor pattern 221. For example, the second drain electrode 226 may be in direct contact with the second drain region of the second semiconductor pattern 221 in the second drain contact hole.

The storage capacitor 230 may maintain the operation of the first thin film transistor 210 for one frame. For example, the storage capacitor 230 may be connected between the first gate electrode 213 and the first drain electrode 216 of the first thin film transistor 210. The storage capacitor 230 may include a first storage electrode 231 and a second storage electrode 232, which are sequentially stacked. The first storage electrode 231 and the second storage electrode 232 may include a conductive material. For example, the first storage electrode 231 and the second storage electrode 232 may include a metal, such as aluminum (Al), chromium (Cr), copper (Cu), titanium (Ti), molybdenum (Mo) or tungsten (W).

The storage capacitor 230 may be formed using a process of forming the first thin film transistor 210 or the second thin film transistor 220. For example, the storage capacitor 230 may be disposed between the device substrate 100 and the separation insulating layer 140. The storage capacitor 230 may be disposed side by side with the first thin film transistor 210. The first storage electrode 231 may include the same material as the first gate electrode 213. The first storage electrode 231 may be disposed on the same layer as the first gate electrode 213. For example, the first storage electrode 231 may be formed by the same process as the first gate electrode 213. The second storage electrode 232 may include the same material as the first source electrode 215 and the first drain electrode 216. The second storage electrode 232 may be formed by the same process as the first source electrode 215 and the first drain electrode 216. For example, the first interlayer insulating layer 214 may extend between the first storage electrode 231 and the second storage electrode 232. The second storage electrode 232 may include a material different from the first storage electrode 231.

The second thin film transistor 220 may be disposed on the storage capacitor 230. For example, the second semiconductor pattern 221 may overlap with the second storage electrode 232 of the storage capacitor 230. Thus, in the display apparatus according to the embodiment of the present disclosure, light passing through the device substrate 100 and traveling toward the second semiconductor pattern 221 may be blocked by the storage capacitor 230. Therefore, in the display apparatus according to the embodiment of the present disclosure, a change in characteristics of the second thin film transistor 220 due to the external light may be reduced. The storage capacitor 230 may be electrically connected to the second drain electrode 226 of the second thin film transistor 220. For example, the first interlayer insulating layer 214, the separation insulating layer 140 and the second interlayer insulating layer 224 may include a storage contact hole partially exposing the first storage electrode 231 of the storage capacitor 230. The second drain electrode 226 may extend in the storage contact hole. For example, the second drain electrode 226 may be in direct contact with the first storage electrode 231 in the storage contact hole.

A device buffer layer 110 may be disposed between the device substrate 100 and the driving circuit of each pixel area PA. The device buffer layer 110 may reduce pollution from the device substrate 100 during a process of forming the driving circuits. For example, the device buffer layer 110 may completely cover the display area AA of the device substrate 100. The device buffer layer 110 may be disposed between the device substrate 100 and the first semiconductor pattern 211 of each pixel area PA. The device buffer layer 110 may include an insulating material. For example, the device buffer layer 110 may include an inorganic insulating material, such as silicon oxide (SiO) and silicon nitride (SiN). The device buffer layer 110 may have a multi-layer structure. For example, the device buffer layer 110 may have a stacked structure of a first buffer layer 111 and a second buffer layer 112 including a material different from the first buffer layer 111.

A first lower passivation layer 120 and a second lower passivation layer 130 may be sequentially stacked between the first thin film transistor 210 of each pixel area PA and the separation insulating layer 140. The first lower passivation layer 120 and the second lower passivation layer 130 may reduce the damage of the thin film transistors 210 due to the external impact and moisture. The first lower passivation layer 120 and the second lower passivation layer 130 may extend between the storage capacitor 230 of each pixel area PA and the separation insulating layer 140. For example, the storage contact hole of each pixel area PA may penetrate the first lower passivation layer 120 and the second lower passivation layer 130. The first lower passivation layer 120 and the second lower passivation layer 130 may include an insulating material. For example, the first lower passivation layer 120 and the second lower passivation layer 130 may include an inorganic material, such as silicon oxide (SiO) and silicon nitride (SIN). The second lower passivation layer 130 may include a material different from the first lower passivation layer 120. For example, the first lower passivation layer 120 may include silicon oxide (SiO), and the second lower passivation layer 130 may include silicon nitride (SIN). Thus, in the display apparatus according to the embodiment of the present disclosure, the damage of the first thin film transistors 210 and the storage capacitors 230 due to the external impact and moisture may be effectively reduced.

A third lower passivation layer 150 may be disposed between the second interlayer insulating layer 224 of each pixel area PA and the second source electrode 225, and between the second interlayer insulating layer 224 of each pixel area PA and the second drain electrode 226. The third lower passivation layer 150 may reduce the damage of the second thin film transistor 220 due to the external impact and moisture. For example, the third lower passivation layer 150 may extend beyond the second semiconductor pattern 221 along the second interlayer insulating layer 224. The third lower passivation layer 150 may include an insulating material. The third lower passivation layer 150 may include a material different from the second interlayer insulating layer 224. For example, the third lower passivation layer 150 may include silicon nitride (SiN). Thus, in the display apparatus according to the embodiment of the present disclosure, the damage of the second semiconductor pattern 221 due to the external impact and moisture may be effectively prevented.

An intermediate source electrode 265 and an intermediate drain electrode 266 may be disposed on the third lower passivation layer of each pixel area PA. The intermediate source electrode 265 and the intermediate drain electrode 266 may include a conductive material. For example, the intermediate source electrode 265 and the intermediate drain electrode 266 may include a metal, such as aluminum (Al), chromium (Cr), copper (Cu), titanium (Ti), molybdenum (Mo) or tungsten (W). The intermediate drain electrode 266 may include the same material as the intermediate source electrode 265. For example, the intermediate drain electrode 266 may be formed by the same process as the intermediate source electrode 265. The intermediate source electrode 265 and the intermediate drain electrode 266 may include the same material as the second source electrode 225 and the second drain electrode 226. For example, the intermediate drain electrode 266, the intermediate source electrode 265, the second source electrode 225 and the second drain electrode 226 may be formed at the same time.

The intermediate source electrode 265 may be electrically connected to the first source electrode 215 of the first thin film transistor 210. For example, the first lower passivation layer 120, the second lower passivation layer 130, the separation insulating layer 140, the second interlayer insulating layer 224 and the third lower passivation layer 150 may include a first intermediate contact hole partially exposing the first source electrode 215 of the first thin film transistor 210. The intermediate source electrode 265 may include a region overlapping with the first source electrode 215 of the first thin film transistor 210. For example, the intermediate source electrode 265 may be in direct contact with the first source electrode 215 of the first thin film transistor 210 in the first intermediate contact hole.

The intermediate drain electrode 266 may be electrically connected to the first drain electrode 216 of the first thin film transistor 210. For example, the first lower passivation layer 120, the second lower passivation layer 130, the separation insulating layer 140, the second interlayer insulating layer 224 and the third lower passivation layer 150 may include a second intermediate contact hole partially exposing the first drain electrode 216 of the first thin film transistor 210. The intermediate drain electrode 266 may be spaced away from the intermediate source electrode 265. The intermediate drain electrode 266 may include a region overlapping with the first drain electrode 216 of the first thin film transistor 210. For example, the intermediate drain electrode 266 may be in direct contact with the first drain electrode 216 of the first thin film transistor 210 in the second intermediate contact hole.

The light-emitting device 600 of each pixel area PA may be disposed on the driving circuit of the corresponding pixel area PA. For example, the first thin film transistor 210, the second thin film transistor 220 and the storage capacitor 230 of each pixel area PA may be disposed between the device substrate 100 and the first emission electrode 610 of the corresponding pixel area PA. Thus, in the display apparatus according to the embodiment of the present disclosure, an area occupied by each pixel area PA may be reduced. Therefore, in the display apparatus according to the embodiment of the present disclosure, the resolution may be improved.

A first over-coat layer 160 and a second over-coat layer 170 may be sequentially stacked between the driving circuit and the light-emitting device 600 of each pixel area PA. For example, the first emission electrode 610, the light-emitting layer 620 and the second emission electrode 630 of each pixel area PA may be sequentially stacked on the second over-coat layer 170 of the corresponding pixel area PA. The first over-coat layer 160 and the second over-coat layer 170 may remove a thickness difference due to the driving circuits. For example, an upper surface of the second over-coat layer 170 toward the light-emitting device 600 of each pixel area PA may be a flat surface. The first over-coat layer 160 and the second over-coat layer 170 may include an insulating material. The first over-coat layer 160 and the second over-coat layer 170 may be made of a material having a high fluidity. For example, the first over-coat layer 160 and the second over-coat layer 170 may include an organic insulating material. The second over-coat layer 170 may include a material different from the first over-coat layer 160. Thus, in the display apparatus according to the embodiment of the present disclosure, the thickness difference due to the driving circuits may be effectively removed.

An intermediate contact electrode 510 may be disposed between the first over-coat layer 160 and the second over-coat layer 170 of each pixel area PA. The light-emitting device 600 may be electrically connected to the first drain electrode 216 of the first thin film transistor 210 via the intermediate contact electrode 510. For example, the intermediate contact electrode 510 may be connected to the intermediate drain electrode 266 by penetrating the first over-coat layer 160, and the first emission electrode 610 of the light-emitting device 600 may be connected to the intermediate contact electrode 510 by penetrating the second over-coat layer 170. The intermediate contact electrode 510 may include a region overlapping with the intermediate drain electrode 266, and a region overlapping with the first emission electrode 610. For example, the intermediate contact electrode 510 may be disposed between the intermediate drain electrode 266 and the first emission electrode 610. The intermediate contact electrode 510 may be in direct contact with the intermediate drain electrode 266. The first emission electrode 610 may be in direct contact with the intermediate contact electrode 510. The intermediate contact electrode 510 may include a conductive material. For example, the intermediate contact electrode 510 may include a metal, such as aluminum (Al), chromium (Cr), copper (Cu), titanium (Ti), molybdenum (Mo) or tungsten (W). The intermediate contact electrode 510 may include a material different from the intermediate drain electrode 266 and the first emission electrode 610.

A bank insulating layer 180 may be disposed on the second over-coat layer 170 of each pixel area PA. The bank insulating layer 180 may include an insulating material. For example, the bank insulating layer 180 may include an organic insulating material. The bank insulating layer 180 may include a material different from the first over-coat layer 160 and the second over-coat layer 170. The bank insulating layer 180 may cover an edge of each first emission electrode 610. The light-emitting layer 620 and the second emission electrode 630 of each pixel area PA may be stacked on a portion of the corresponding first emission electrode 610 exposed by the bank insulating layer 180. For example, the bank insulating layer 180 may define an emission region in each pixel area PA.

The light-emitting layer 620 of each pixel area PA may extend on the bank insulating layer 180. Each of the pixel areas PA may display a color different from adjacent pixel area PA. For example, the emission material layer 622 of each pixel area PA may be separated from the emission material layer 622 of adjacent pixel area PA. The emission material layer 622 of each pixel area PA may include an end in the corresponding pixel area PA. The emission material layer 622 may be formed by using a fine metal mask (FMM). The end of each emission material layer 622 may be disposed on the bank insulating layer 180. For example, a spacer may be disposed on the bank insulating layer 180. The spacer may reduce the damage of the bank insulating layer 180 and the emission material layer 622 formed on adjacent pixel area PA due to the fine metal mask. The first emitting common layer 621 and the second emitting common layer 623 of each emission material layer 622 may extend along a surface of the bank insulating layer 180. For example, the first emitting common layer 621 and the second emitting common layer 623 of each pixel area PA may be connected to the first emitting common layer 621 and the second emitting common layer 623 of adjacent pixel area PA. Thus, in the display apparatus according to the embodiment of the present disclosure, the process efficiency may be improved.

A voltage applied to the second emission electrode 630 of each pixel area PA may be the same as a voltage applied to the second emission electrode 630 of adjacent pixel area PA. For example, the second emission electrode 630 of each pixel area PA may be connected to the second emission electrode 630 of adjacent pixel area PA. Thus, the display apparatus according to the embodiment of the present disclosure may adjust the luminance of each pixel area PA by the gate signal and the data signal applied to the corresponding pixel area PA. The second emission electrode 630 of each pixel area PA may be in direct contact with the second emission electrode 630 of adjacent pixel area PA.

An encapsulating element 700 may be disposed on the light-emitting device 600 of each pixel area PA. The encapsulating element 700 may reduce the damage of the light-emitting devices 600 due to the external impact and moisture. The encapsulating element 700 may have a multi-layer structure. For example, the encapsulating element 700 may include a first encapsulating layer 710, a second encapsulating layer 720 and a third encapsulating layer 730, which are sequentially stacked. The first encapsulating layer 710, the second encapsulating layer 720 and the third encapsulating layer 730 may include an insulating material. The second encapsulating layer 720 may include a material different from the first encapsulating layer 710 and the third encapsulating layer 730. For example, the first encapsulating layer 710 and the third encapsulating layer 730 may include an inorganic insulating material, and the second encapsulating layer 720 may include an organic insulating material. Thus, in the display apparatus according to the embodiment of the present disclosure, the damage of the light-emitting devices 600 due to the external impact and moisture may effectively reduced. A thickness difference due to the light-emitting device 600 of each pixel area PA may be removed by the encapsulating element 700. For example, an upper surface of the encapsulating element 700 opposite to the device substrate 100 may be a flat surface.

The encapsulating element 700 may extend beyond the display area AA. At least one of encapsulating dam 106 may be disposed outside the display area AA. The encapsulating dam 106 may include an insulating material. For example, the encapsulating dam 106 may include an organic insulating material. The encapsulating dam 106 may be disposed on the first over-coat layer 160. For example, the encapsulating dam 106 may include the same material as the second over-coat layer 170. The encapsulating dam 106 may be formed by the same process as the second over-coat layer 170. Thus, in the display apparatus according to the embodiment of the present disclosure, the process efficiency may be improved. The encapsulating dam 106 may extend along an edge of the display area AA. For example, the encapsulating dam 106 may have a closed loop shape surrounding a portion of the device substrate 100. The flow of the second encapsulating layer 720 having relatively high fluidity may be blocked by the encapsulating dam 106. For example, the second encapsulating layer 720 may be disposed only on the portion of the device substrate 100 defined by the encapsulating dam 106. The third encapsulating layer 730 may be in direct contact with the first encapsulating layer 710 on the outside of the second encapsulating layer 720. For example, the second encapsulating layer 720 may be surrounded by the first encapsulating layer 710 and the third encapsulating layer 730. The first encapsulating layer 710 may extend beyond the third encapsulating layer 730. For example, the encapsulating dame 106 may be covered by the first encapsulating layer 710.

A touch structure 810 and 820 may be disposed on the encapsulating element 700. The touch structure 810 and 820 may detect a touch of the user and/or a tool. For example, the touch structure 810 and 820 may include touch electrodes 811 and 821, and bridge electrodes 812 and 822. The touch electrodes 811 and 821 may be disposed side by side. The bridge electrodes 812 and 822 may connect between the touch electrodes 811 and 821. The touch electrodes 811 and 821 and the bridge electrodes 812 and 822 may include a conductive material. For example, the touch electrodes 811 and 821 and the bridge electrodes 812 and 822 may include a metal, such as aluminum (Al), chromium (Cr), copper (Cu), titanium (Ti), molybdenum (Mo) or tungsten (W). The touch electrodes 811 and 821 and the bridge electrodes 812 and 822 may overlap with the display area AA of the device substrate 100. The light-emitting device 600 of each pixel area PA may be disposed outside the touch electrodes 811 and 821 and the bridge electrodes 812 and 822. For example, the touch electrodes 811 and 821 and the bridge electrodes 812 and 822 may overlap with the bank insulating layer 180. The touch electrodes 811 and 821 and the bridge electrodes 812 and 822 may be spaced away from the light-emitting device 600 of each pixel area PA. Thus, in the display apparatus according to the embodiment of the present disclosure, the light emitted from the each light-emitting device 600 in a direction perpendicular to the upper surface of the device substrate 100 may be not blocked by the touch electrodes 811 and 821 and the bridge electrodes 812 and 822. Therefore, in the display apparatus according to the embodiment of the present disclosure, the reduction in the luminance of each pixel area PA due to the touch electrodes 811 and 821 and the bridge electrodes 812 and 822 may be reduced.

The touch structure 810 and 820 may include first touch assemblies 810 extending in a first direction, and second touch assemblies 820 extending in a second direction perpendicular to the first direction. Each of the first touch assemblies 810 may include first touch electrodes 811 and first bridge electrodes 812. For example, each of the first bridge electrodes 812 may connect the first touch electrodes 811 in the first direction. Each of the second touch assemblies 820 may include second touch electrodes 821 and second bridge electrodes 822. For example, each of the second bridge electrodes 822 may connect the second touch electrodes 821 in the second direction. The second touch electrodes 821 may be disposed between the first touch electrodes 811. Each of the second bridge electrodes 822 may cross one of the first bridge electrodes 812. The second bridge electrodes 822 may be insulated from the first bridge electrodes 812. For example, the second bridge electrodes 822 may be disposed on a layer different from the first bridge electrodes 812. A touch insulating layer 830 may be disposed between the first bridge electrodes 812 and the second bridge electrodes 822. The touch insulating layer 830 may include an insulating material. For example, the touch insulating layer 830 may include an inorganic insulating material, such as silicon oxide (SiO) and silicon nitride (SiN). The second touch electrodes 821 may be disposed on the same layer as the first touch electrodes 811. For example, the first touch electrodes 811, the second touch electrodes 821 and the second bridge electrodes 822 may be disposed on the touch insulating layer 830 covering the first bridge electrodes 812. The touch insulating layer 830 may include touch contact holes partially exposing each first bridge electrode 812. Each of the first touch electrodes 811 may be connected to the corresponding first bridge electrode 812 via one of the touch contact holes.

The touch electrode 811 and 821 disposed at the outermost of each touch assembly 810 and 820 may be connected to one of link lines 850. The link lines 850 may extend beyond the display area AA along the surface of the encapsulating element 700. The link lines 850 may include a conductive material. For example, the link lines 850 may include a metal, such as aluminum (Al), chromium (Cr), copper (Cu), titanium (Ti), molybdenum (Mo) or tungsten (W). The link lines 850 may include the same material as the touch electrodes 811 and 821. For example, the link lines 850 may be formed by the same process as the touch electrodes 811 and 821. The link lines 850 may be disposed on the same layer as the touch electrodes 811 and 821. For example, the link lines 850 may include a region disposed on the touch insulating layer 830. Each of the link lines 850 may be in direct contact with one of the touch electrodes 811 and 821.

A touch buffer layer 800 may be disposed between the encapsulating element 700 and the touch structure 810 and 820. The touch buffer layer 800 may reduce the damage of the encapsulating element 700 and the light-emitting devices 600 due to a process of forming the touch electrodes 811 and 821 and the bridge electrodes 812 and 822. For example, a surface of the encapsulating structure 700 toward the touch structure 810 and 820 may be completely covered by the touch buffer layer 800. The touch buffer layer 800 may extend along the third encapsulating layer 730. For example, the touch buffer layer 800 may extend beyond the encapsulating dam 106. The touch buffer layer 800 may include an insulating material. For example, the touch buffer layer 800 may include an inorganic insulating material, such as silicon oxide (SiO) and silicon nitride (SIN).

A cover insulating layer 890 may be disposed on the touch structure 810 and 820. The cover insulating layer 890 may reduce the damage of the touch structure 810 and 820 due to the external impact and moisture. For example, the touch structure 810 and 820 may be completely covered by the cover insulating layer 890. Thus, in the display apparatus according to the embodiment of the present disclosure, the external impact may be relieved by the cover insulating layer 890. The cover insulating layer 890 may include an insulating material. For example, the cover insulating layer 890 may include an inorganic insulating material and/or an organic insulating material. The cover insulating layer 890 may extend beyond the touch structure 810 and 820. For example, the cover insulating layer 890 may include a region overlapping with the light-emitting devices 600. The cover insulating layer 890 may extend beyond the display area AA. For example, the encapsulating dam 106 may be covered by the cover insulating layer 890.

The bending area BA may be an area wherein the device substrate 100 is bent. The bending area BA may have a relatively thin thickness. For example, the device buffer layer 110, the first gate insulating layer 212, the first interlayer insulating layer 214, the first lower passivation layer 120, the second lower passivation layer 130, the separation insulating layer 140, the second interlayer insulating layer 224 and the third lower passivation layer 150 may expose the bending area BA of the device substrate 100. For example, the bending area BA of the device substrate 100 may be in direct contact with the first over-coat layer 160.

A crack preventing layer 410 may be disposed on the first over-coat layer 160 of the bending area BA. The crack preventing layer 410 may reduce the damage of the device substrate 100 due to the external impact. For example, the crack preventing layer 410 may include a region overlapping with the bending area BA and a region disposed outside the bending area BA. The crack preventing layer 410 may include an insulating material. For example, the crack preventing layer 410 may include an organic insulating material. The crack preventing layer 410 may include the same material as the second over-coat layer 170. For example, the crack preventing layer 410 may be formed by the same process as the second over-coat layer 170. Thus, in the display apparatus according to the embodiment of the present disclosure, the process efficiency may be improved. The crack preventing layer 410 may be spaced away from the encapsulating element 700. The encapsulating dam 106 may be disposed between the encapsulating element 700 and the crack preventing layer 410. For example, the encapsulating dam 106 may be spaced away from the crack preventing layer 410. Therefore, in the display apparatus according to the embodiment of the present disclosure, the damage of the crack preventing layer 410 due to bending stress may not affect the display area AA.

Pads 104 and 804 may be disposed on the pad area PD. The pads 104 and 804 may be disposed side by side in the first direction. The pads 104 and 804 may include display pads 104 electrically connected to the signal lines GL, DL, VDD and VSS, and touch pads 804 electrically connected to the touch structure 810 and 820. The pad area PD may be connected to the display area AA by connection electrodes 900. For example, each of the display pads 104 may be connected to one of the signal lines GL, DL, VDD and VSS by one of the connection electrodes 900, and each of the touch assemblies 810 and 820 may be connected to one of the touch pads 804 by one of the connection electrodes 900 and one of the link lines 850.

The pad area PD may be disposed on a side of the display area AA. For example, the pad area PD may be disposed side by side with the display area AA in the second direction. The bending area BA may be disposed between the display area AA and the pad area PD. For example, the connection electrodes 900 may cross the bending area BA. The connection electrodes 900 may be disposed on the first over-coat layer 160. For example, the first over-coat layer 160 may extend on the pad area PD.

Each of the connection electrodes 900 may have a multi-layer structure. For example, each of the connection electrodes 900 may have a stacked structure of a lower connecting electrode 910 and an upper connecting electrode 920. The lower connecting electrode 910 may be disposed between the device substrate 100 and the upper connecting electrode 920. For example, the upper connecting electrode 920 may include a region overlapping with the lower connecting electrode 910. The lower connecting electrode 910 and the upper connecting electrode 920 may include a conductive material. For example, the lower connecting electrode 910 and the upper connecting electrode 920 may include a metal, such as aluminum (Al), chromium (Cr), copper (Cu), titanium (Ti), molybdenum (Mo) or tungsten (W). Thus, in the display apparatus according to the embodiment of the present disclosure, the disconnection of each connection electrode 900 due to the bending stress and the external impact may be prevented.

The lower connecting electrode 910 may be disposed between the first over-coat layer 160 and the crack preventing layer 410. For example, the first over-coat layer 160 may extend between the bending area BA of the device substrate 100 and the lower connecting electrode 910. The lower connecting electrode 910 may include the same material as the intermediate contact electrodes 510. For example, the lower connecting electrode 910 may be formed by the same process as the intermediate contact electrodes 510.

The upper connecting electrode 920 may be disposed on the crack preventing layer 410. The upper connecting electrode 920 may include the same material as the touch electrodes 811 and 821 which are a conductive layer disposed on the uppermost of each pixel area PA. For example, the touch buffer layer 800 may extend between the crack preventing layer 410 and the upper connecting electrode 920. The upper connecting electrode 920 may be in direct contact with one of the link lines 850. For example, the touch electrodes 811 and 821, the link lines 850 and the upper connecting electrode 920 of each connection electrode 900 may be formed at the same time. Thus, in the display apparatus according to the embodiment of the present disclosure, the damage of the upper connecting electrode 920 due to the process of patterning a conductive layer may be reduced. And, in the display apparatus according to the embodiment of the present disclosure, unintended connection between adjacent upper connection electrodes 920 due to a conductive residual layer generated by a subsequent process may be prevented. Therefore, in the display apparatus according to the embodiment of the present disclosure, the display area AA may be stably connected to the pad area PD.

The upper connecting electrode 920 may be connected to the lower connecting electrode 910. For example, a middle connecting electrode 930 may be disposed between the lower connecting electrode 910 and the upper connecting electrode 920 of each connection electrode 900. The middle connecting electrode 930 may include a conductive material. For example, the middle connecting electrode 930 may include a metal, such as aluminum (Al), chromium (Cr), copper (Cu), titanium (Ti), molybdenum (Mo) or tungsten (W). The middle connecting electrode 930 may penetrate the crack preventing layer 410. For example, the crack preventing layer 410 may include connection contact holes partially exposing the lower connecting electrode 910 of each connection electrode 900, and the middle connecting electrode 930 of each connection electrode 900 may include a region disposed in one of the connection holes. The middle connecting electrode 930 may include the same material as the first emission electrode 610 of each light-emitting device 600. For example, the touch buffer layer 800 on the bending area BA may partially expose each middle connecting electrode 930, and the upper connecting electrode 920 of each connection electrode 900 may be in direct contact with a region of the corresponding middle connecting electrode 930 exposed by the touch buffer layer 800. The connection contact holes may be disposed outside the bending area BA. For example, the middle connecting electrode 930 of each connection electrode 900 may penetrate the crack preventing layer 410 at the outside of the bending area BA. Thus, in the display apparatus according to the embodiment of the present disclosure, the deformation and the damage of the middle connecting electrodes 930 due to the bending stress and the external impact may be prevented. Therefore, in the display apparatus according to the embodiment of the present disclosure, the display area AA may be stably connected to the pad area PD.

A hole peripheral area HA may be disposed between the pixel areas PA. The hole peripheral area HA may be disposed in the display area AA. The hole peripheral area HA may include a hole area CA in which a substrate hole CH is disposed, and a separating area SA surrounding the hole area CA. The substrate hole CH may penetrate the device substrate 100. At least one separating device 300 may be disposed on the separating area SA. For example, the substrate hole CH may be disposed between the light-emitting devices 600, and the separating device 300 may be disposed between the light-emitting devices 600 and the substrate hole CH. The separating device 300 may partially separate the light-emitting layer 620 and the second emission electrode 630 of each light-emitting device 600. For example, the separating device 300 may include at least one under-cut structure UC. Thus, the display apparatus according to the embodiment of the present disclosure may reduce moisture introduced through the substrate hole CH from permeating into the pixel areas PA. The separating device 300 may be formed by a process of forming the driving circuit and the light-emitting device 600 of each pixel area PA. For example, the separating device 300 may have a stacked structure of the device buffer layer 110, the first gate insulating layer 212, the first interlayer insulating layer 214, the first lower passivation layer 120, the second lower passivation layer 130, the separation insulating layer 140, the second interlayer insulating layer 224 and the third lower passivation layer 150. The separating device 300 may further include a separation cap 420 on the third lower passivation layer 150. The separation cap 420 may include the same material as the second over-coat layer 170. For example, the separation cap 420 may be formed at the same time as the second over-coat layer 170. The separating device 300 may be spaced away from the driving circuit and the light-emitting device 600 of each pixel area PA. Therefore, in the display apparatus according to the embodiment of the present disclosure, the permeation of the moisture through the separating device 300 may be reduced.

The device substrate 100 may include a gate driver area GIP. A gate driver may be disposed on the gate driver area GIP. The gate drive area GIP may be spaced away from the display area AA, the bending area BA and the pad area PD. For example, the gate driver area GIP may be disposed side by side with the display area AA in the first direction. The gate driver area GIP may be electrically connected to the display area AA by the gate line (GL). For example, the gate driver may apply the gate signal to each pixel area PA of the display area AA. The gate driver may include at least one third thin film transistor 250. The third thin film transistor 250 on the gate driver area GIP may have the same structure as the first thin film transistor 210 and the second thin film transistor 220 of each pixel area PA. For example, the third thin film transistor 250 may include a third semiconductor pattern 251, a third gate insulating layer 252, a third gate electrode 253, a third interlayer insulating layer 254, a third source electrode 255 and a third drain electrode 256. The third thin film transistor 250 may be formed at the same time as the driving circuit of each pixel area PA. For example, the third semiconductor pattern 251, the third gate insulating layer 252, the third gate electrode 253 and the third interlayer insulating layer 254 of the third thin film transistor 250 may be formed by a process of forming the first semiconductor pattern 211, the first gate insulating layer 212, the first gate electrode 213 and the first interlayer insulating layer 214 of each pixel area PA. The third semiconductor pattern 251 of the third thin film transistor 250 may include the same material as the first semiconductor pattern 211 of each pixel area PA. For example, the third semiconductor pattern 251 of the third thin film transistor 250 may include LTPS. The third gate insulating layer 252 of the third thin film transistor 250 may include the same material as the first gate insulating layer 212 of each pixel area PA. The third gate electrode 253 of the third thin film transistor 250 may include the same material as the first gate electrode 213 of each pixel area PA. The third interlayer insulating layer 254 of the third thin film transistor 250 may include the same material as the first interlayer insulating layer 214 of each pixel area PA. The third source electrode 255 and the third drain electrode 256 of the third thin film transistor 250 may be formed by a process different from the first source electrode 215 and the first drain electrode 216 of each pixel area PA. For example, the third source electrode 255 and the third drain electrode 256 of the third thin film transistor 250 may be formed by the same process as the intermediate source electrode 265 and the intermediate drain electrode 266 of each pixel area PA. The first lower passivation layer 120, the second lower passivation layer 130, the separation insulating layer 140, the second interlayer insulating layer 224 and the third lower passivation layer 150 of each pixel area PA may extend between the third interlayer insulating layer 254 and the third source electrode 255, and between the third interlayer insulating layer 254 and the third drain electrode 256. The first over-coat layer 160, the second over-coat layer 170 and the bank insulating layer 180 may extend on the third thin film transistor 250. Thus, in the display apparatus according to the embodiment of the present disclosure, the process efficiency may be improved.

FIGS. 4A-17A, 4B-17B and 4C-17C are views sequentially showing a method of forming the display apparatus according to the embodiment of the present disclosure.

Figure 4A:
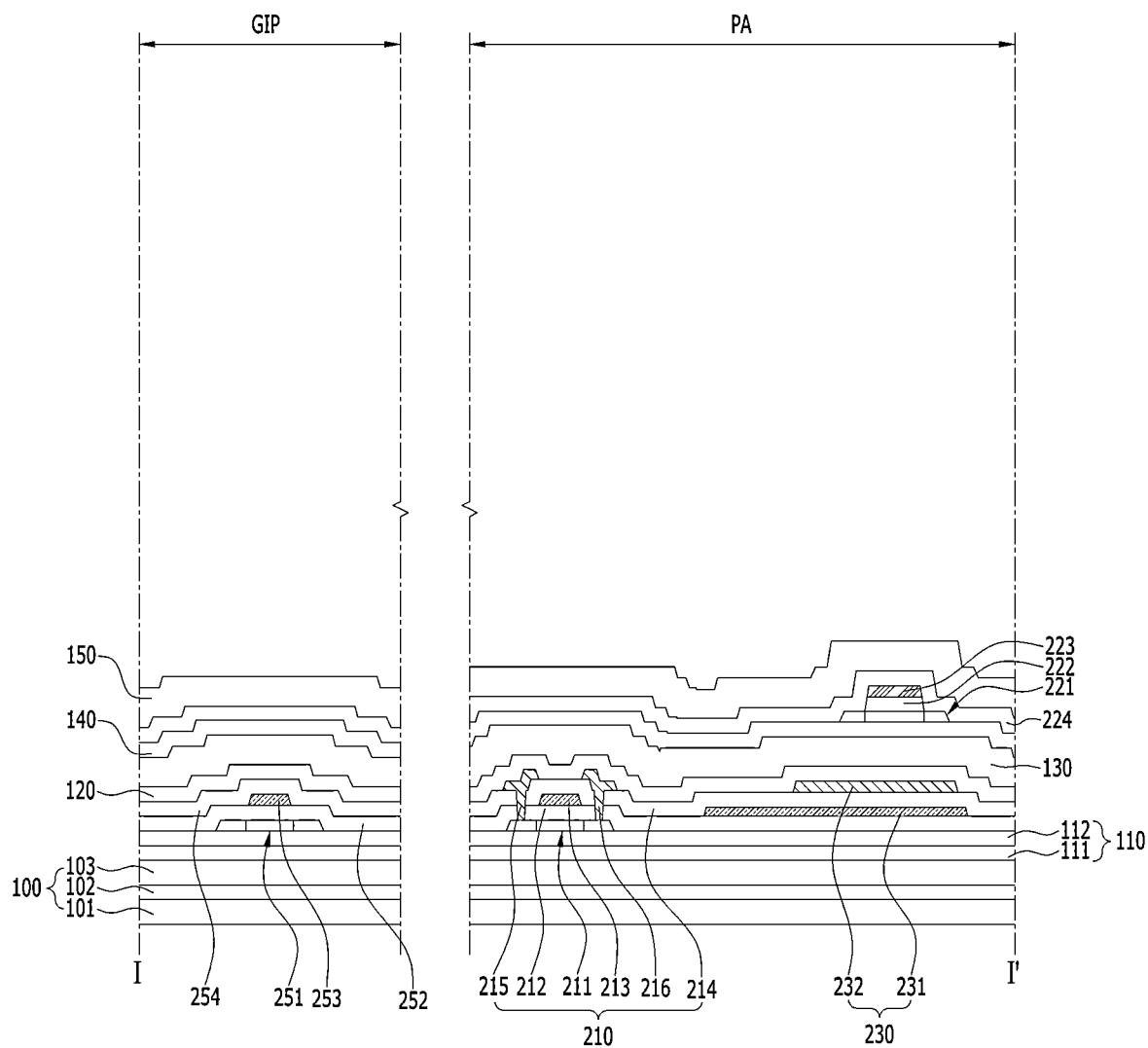
Figure 4C:
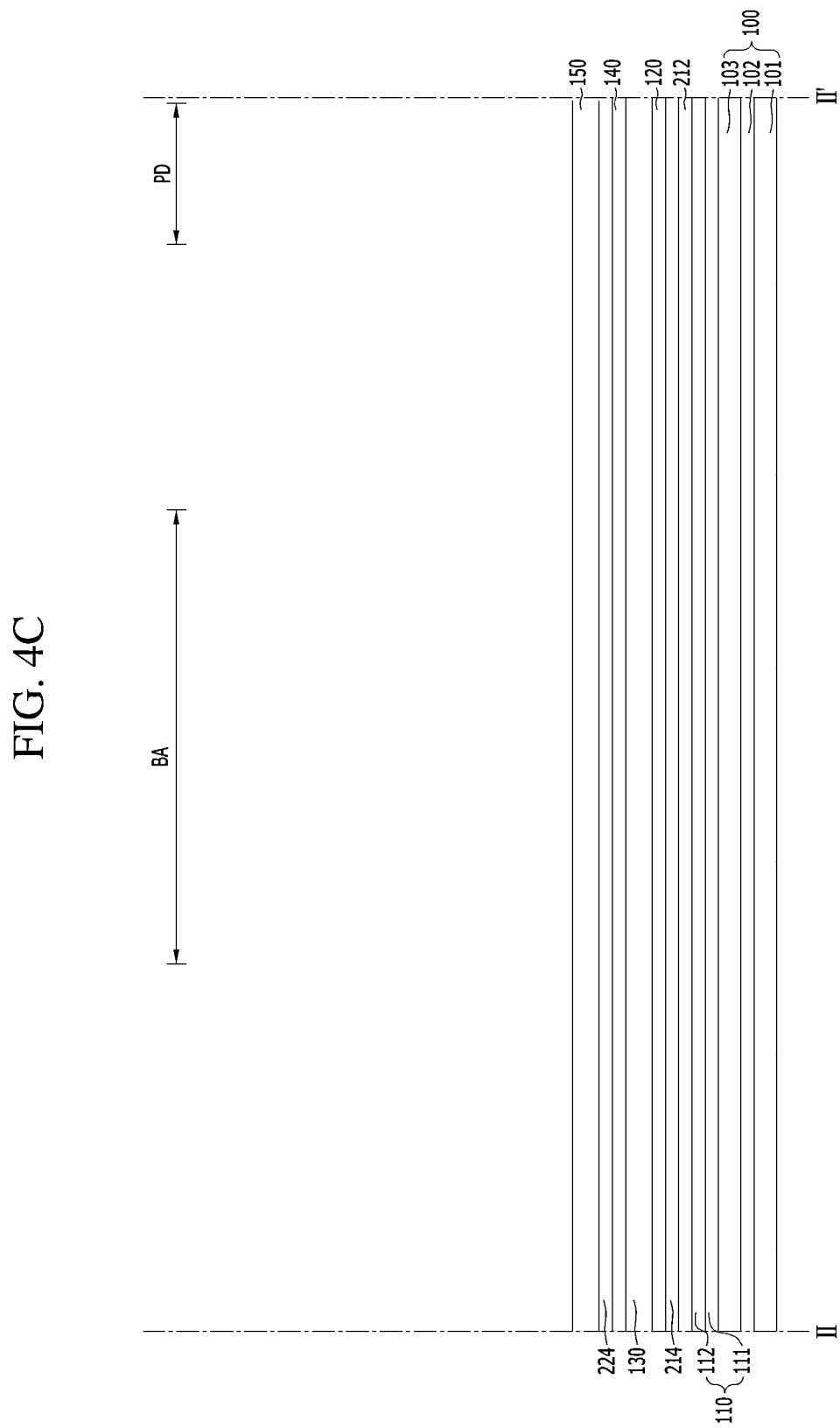

A method of forming the display device according to the embodiment of the present disclosure will be described with reference to FIGS. 1, 3A-17A, 3B-17B and 3C to 17C. First, as shown in FIGS. 4A-4C, the method of forming the display apparatus according to the embodiment of the present disclosure may include a step of preparing the device substrate 100 including the pixel area PA, the gate driver area GIP, the hole peripheral area HA, the bending area BA and the pad area PD, a step of forming the device buffer layer 110 on the device substrate 100, a step of forming the third semiconductor pattern 251, the third gate insulating layer 252, the third gate electrode 253 and the third interlayer insulating layer 254 on the gate driver area GIP of the device buffer layer 110, a step of forming the first thin film transistor 210 and the storage capacitor 230 on the pixel area PA of the device buffer layer 110, a step of stacking the first lower passivation layer 120, the second lower passivation layer 130 and the separation insulating layer 140 on the device substrate 100 in which the first thin film transistor 210, the storage capacitor 230 and the third interlayer insulating layer 254 are formed, a step of forming the second semiconductor pattern 221, the second gate insulating layer 222 and the second gate electrode 223 on the separation insulating layer 140 of the pixel area PA, and a step of stacking the second interlayer insulating layer 224 and the third lower passivation layer 150 on the device substrate 100 in which the second gate electrode 223 is formed.

The hole peripheral area HA may include a hole area CA in which the substrate hole CH is formed by a subsequent process, and the separating area SA disposed outside the hole area CA.

The device substrate 100 may be formed in a multi-layer structure. For example, the step of preparing the device substrate 100 may include a step of sequentially stacking the substrate insulating layer 102 and the second substrate layer 103 on the first substrate layer 101.

The device buffer layer 110 may be formed in a multi-layer structure. For example, the step of forming the device buffer layer 110 may include a step of forming the first buffer layer 111 on the device substrate 100, and a step of forming the second buffer layer 112 on the first buffer layer 111. The second buffer layer 112 may be formed of a material different from the first buffer layer 111. The device buffer layer 110 may be formed on the entire surface of the device substrate 100. For example, the pixel area PA, the gate driver area GIP, the hole peripheral area HA, the bending are BA and the pad area PA of the device substrate 100 may be covered by the device buffer layer 110.

A step of forming the first thin film transistor 210 may include a step of forming the first semiconductor pattern 211 on the device buffer layer 110, a step of forming the first gate insulating layer 212 covering the first semiconductor pattern 211, a step of forming the first gate electrode 213 on the first gate insulating layer 212, a step of forming the first interlayer insulating layer 214 covering the first gate electrode 213, and a step of forming the first source electrode 215 and the first drain electrode 216 on the first interlayer insulating layer 214. The storage capacitor 230 may be formed in a stacked structure of the first storage electrode 231 and the second storage electrode 232. The storage capacitor 230 may be formed at the same time as the first thin film transistor 210. For example, the step of forming the first thin film transistor 210 and the storage capacitor 230 may include a step of forming the first gate electrode 213 and the first storage electrode 231 on the first gate insulating layer 212, and a step of forming the first source electrode 215, the first drain electrode 216 and the second storage electrode 232 on the first interlayer insulating layer 214.

The third semiconductor pattern 251, the third gate insulating layer 252, the third gate electrode 253 and the third interlayer insulating layer 254 may be formed by using a process of forming the first thin film transistor 210. For example, the third semiconductor pattern 251, the third gate insulating layer 252, the third gate electrode 253 and the third interlayer insulating layer 254 may be formed at the same time as the first semiconductor pattern 211, the first gate insulating layer 212, the first gate electrode 213 and the first interlayer insulating layer 214, respectively. For example, the third semiconductor pattern 251 may include the same material as the first semiconductor pattern 211. The first gate insulating layer 212 and the first interlayer insulating layer 214 may be stacked on the hole peripheral area HA, the bending area BA and the pad area PD of the device substrate 100.

The second gate insulating layer 222 may expose the second source region and the second drain region of the second semiconductor pattern 221 by a patterning process. The second source region and the second drain region of the second semiconductor pattern 221 may be conductorized by a process of patterning the second gate insulating layer 222. For example, the second source region and the second drain region of the second semiconductor pattern 221 may be in direct contact with the etchant used in the process of patterning the second gate insulating layer 222.

Figure 5A:
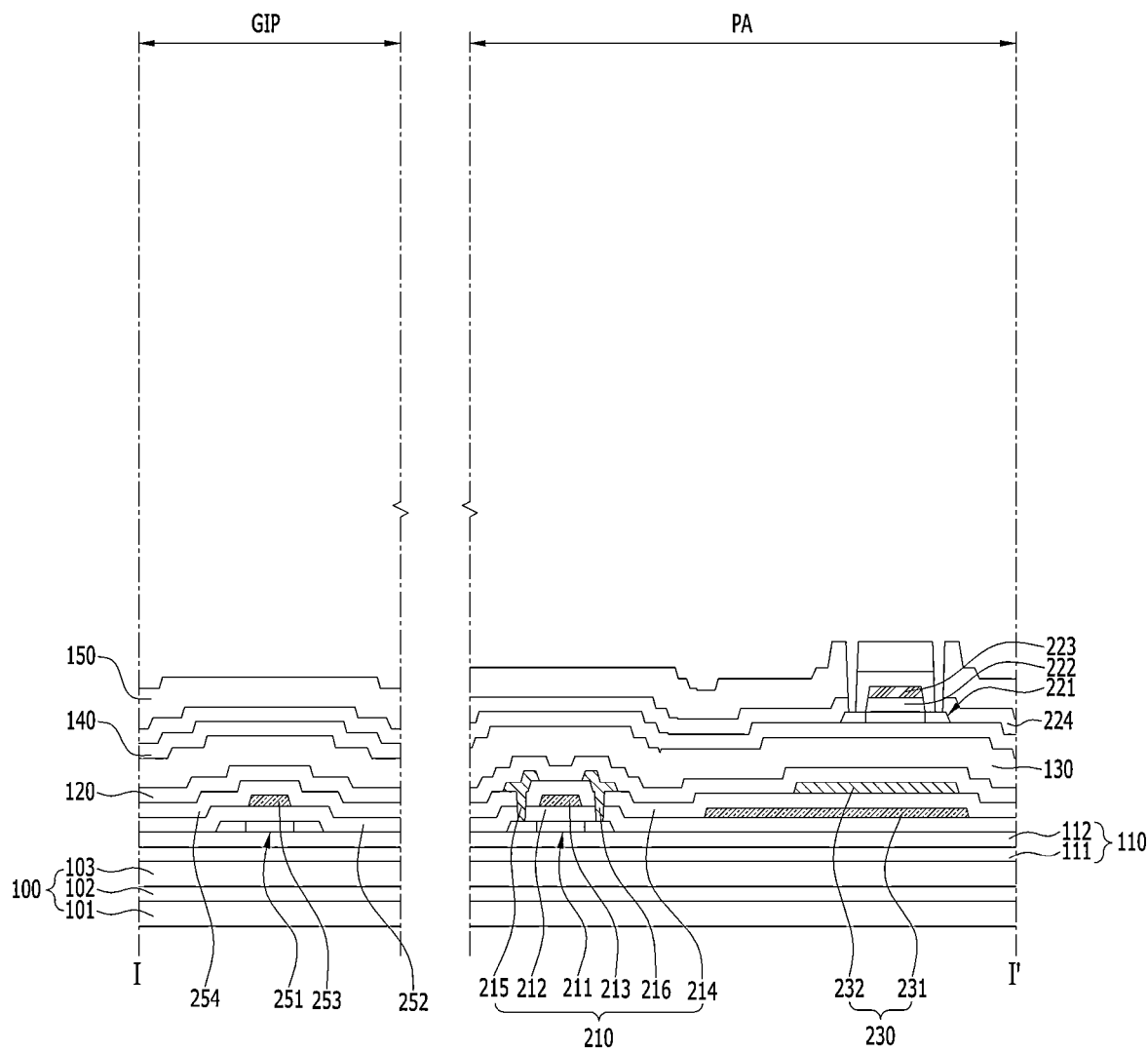
Figure 5B:
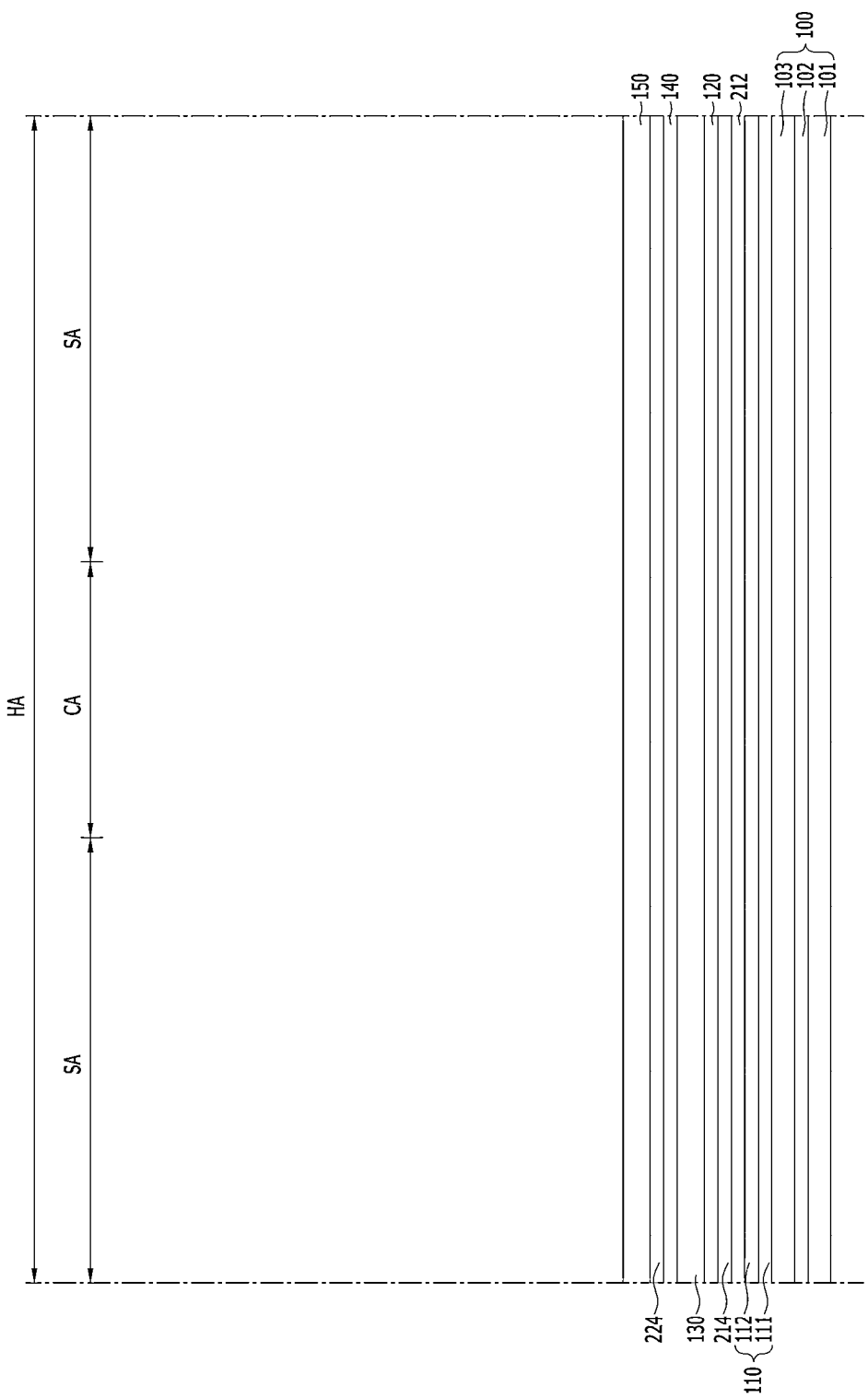
Figure 5C:
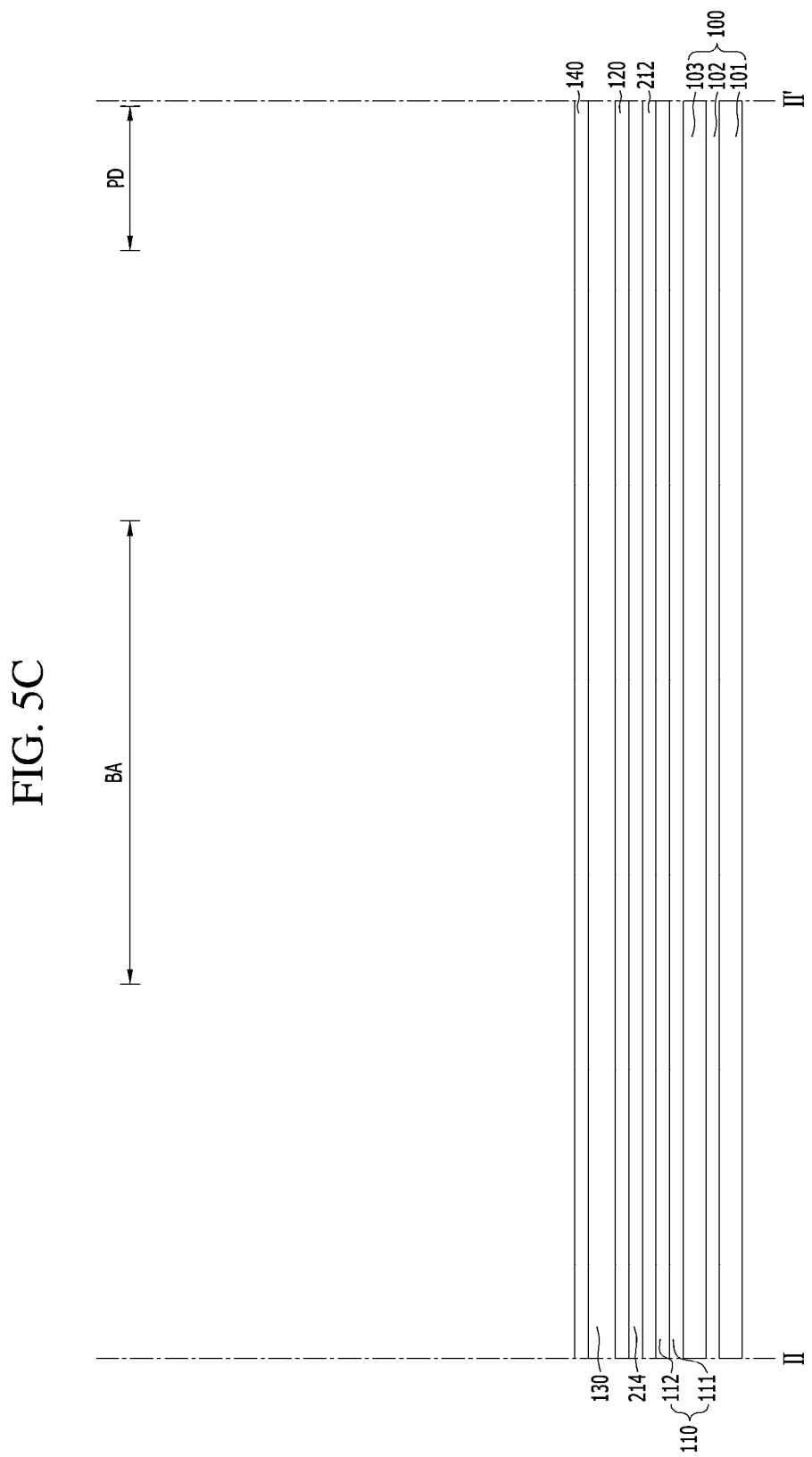

As shown in FIGS. 5A-5C, the method of forming the display apparatus according to the embodiment of the present disclosure may include a step of forming a second source contact hole and a second drain contact hole by patterning the second interlayer insulating layer 224 and the third lower passivation layer 150.

The second source contact hole may partially expose the second source region of the second semiconductor pattern 221 in the pixel area PA. The second drain contact hole may partially expose the second drain region of the second semiconductor pattern 221 in the pixel area PA. The second interlayer insulating layer 224 and the third lower passivation layer 150 on the bending area BA and the pad area PD of the device substrate 100 may be removed by the process of forming the second source contact hole and the second drain contact hole. For example, the step of forming the second source contact hole and the second drain contact hole may include a step of exposing the separation insulating layer 140 on the bending area BA and the pad area PD of the device substrate 100.

Figure 6A:
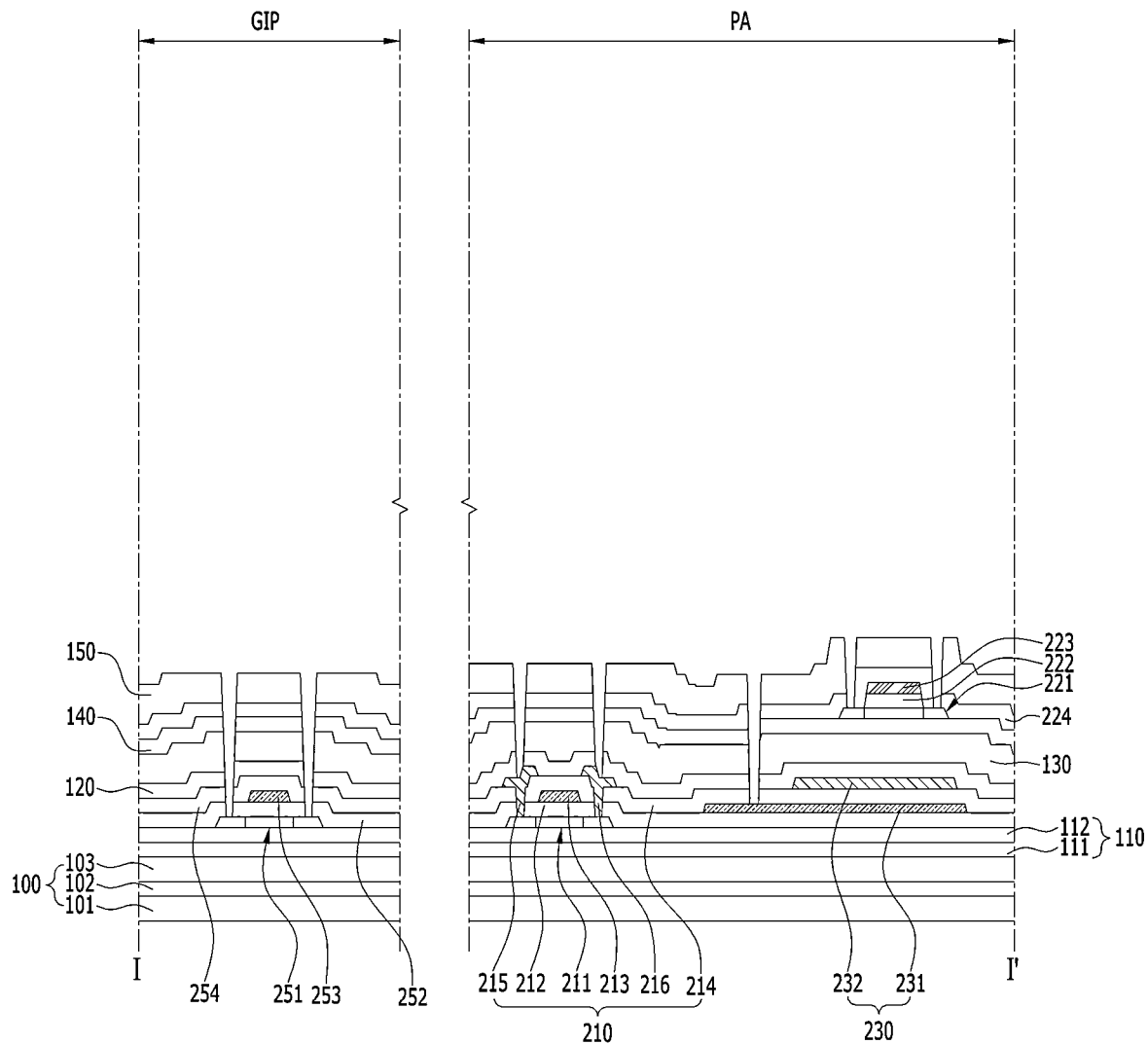
Figure 6B:
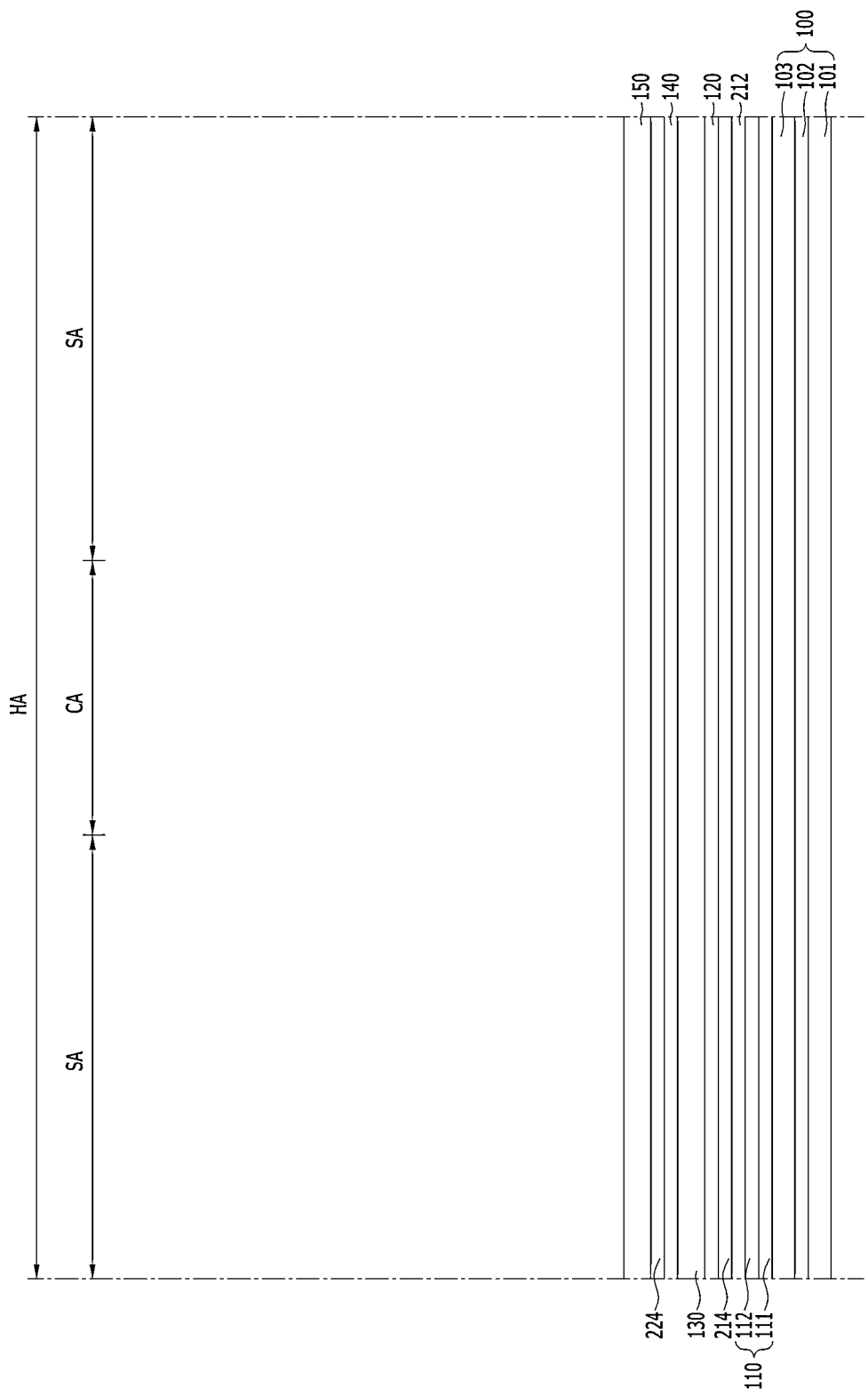
Figure 6C:
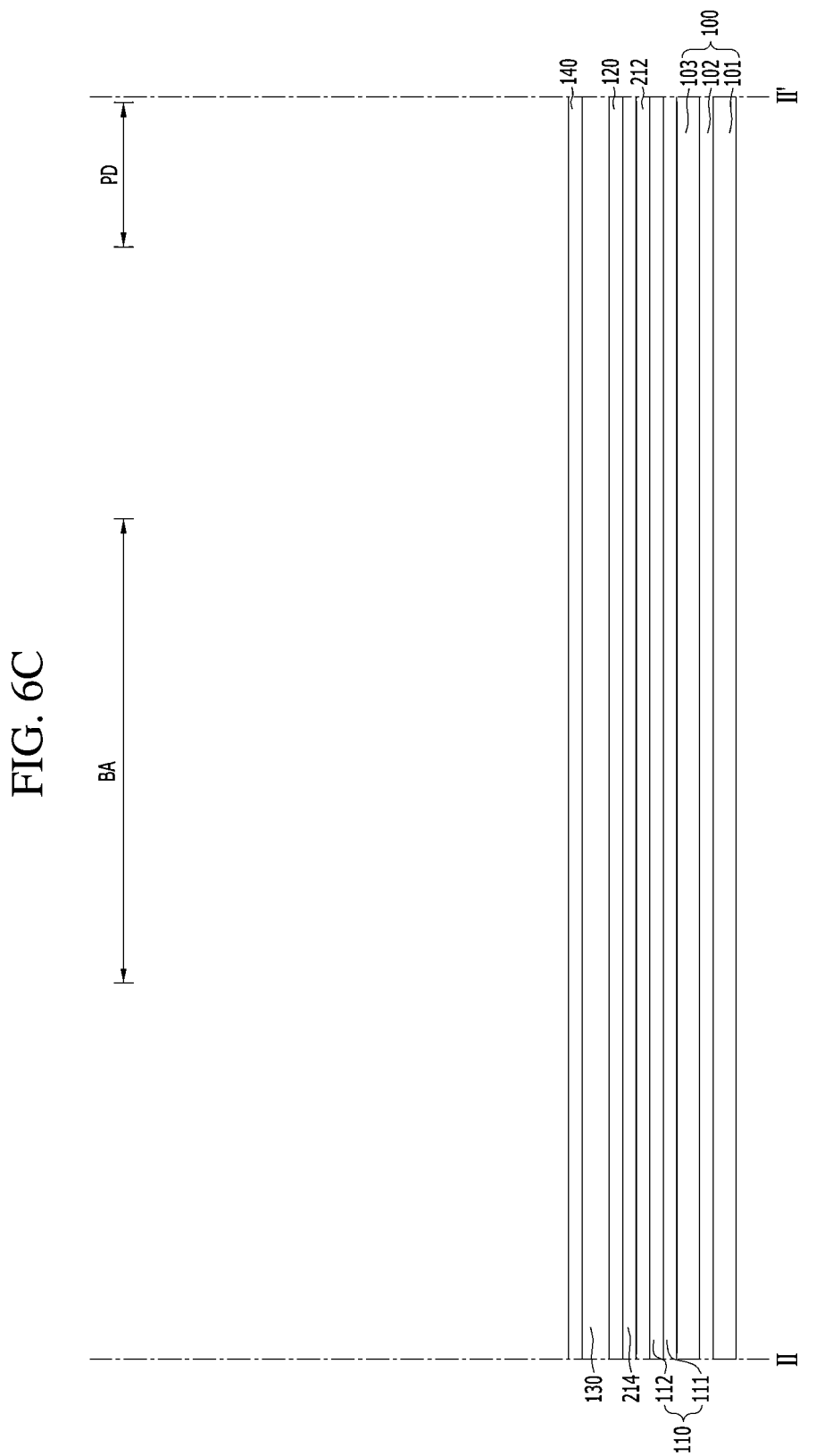

As shown in FIGS. 6A-6C, the method of forming the display apparatus according to the embodiment of the present disclosure may include a step of forming the first intermediate contact hole, the second intermediate contact hole, the storage contact hole, the third source contact hole and the third drain contact hole by patterning the third interlayer insulating layer 254, the first lower passivation layer 120, the second lower passivation layer 130, the separation insulating layer 140, the second interlayer insulating layer 224 and the third lower passivation layer 150.

The first intermediate contact hole may partially expose the first source electrode 215. The second intermediate contact hole may partially expose the first drain electrode 216. The storage contact hole may partially expose the first storage electrode 231. The third source contact hole may partially expose the third source region of the third semiconductor pattern 251. The third drain contact hole may partially expose the third drain region of the third semiconductor pattern 251. For example, the first intermediate contact hole, the second intermediate contact hole, the storage contact hole, the third source contact hole and the third drain contact hole may be formed at the same time.

Figure 7A:
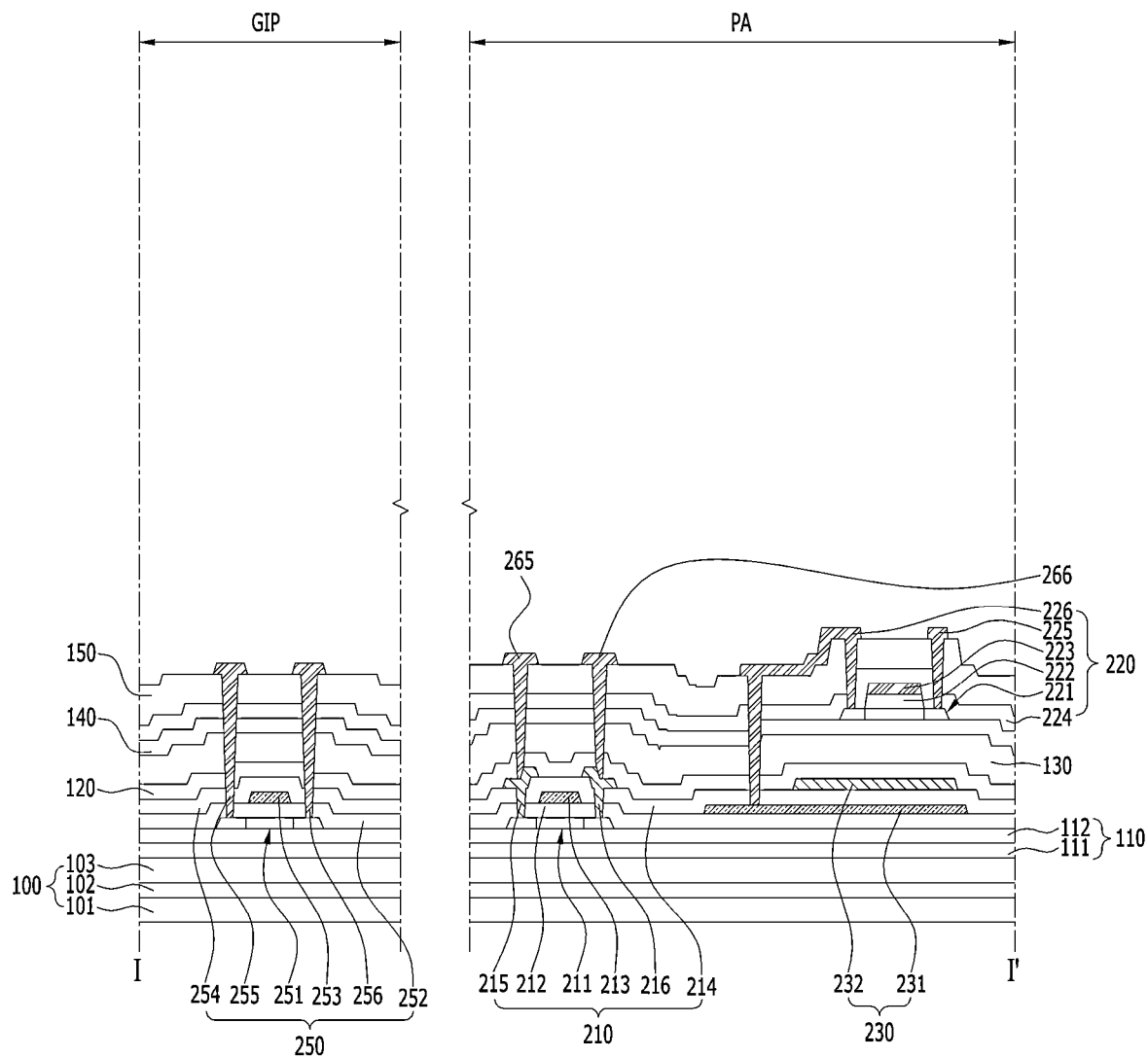
Figure 7B:
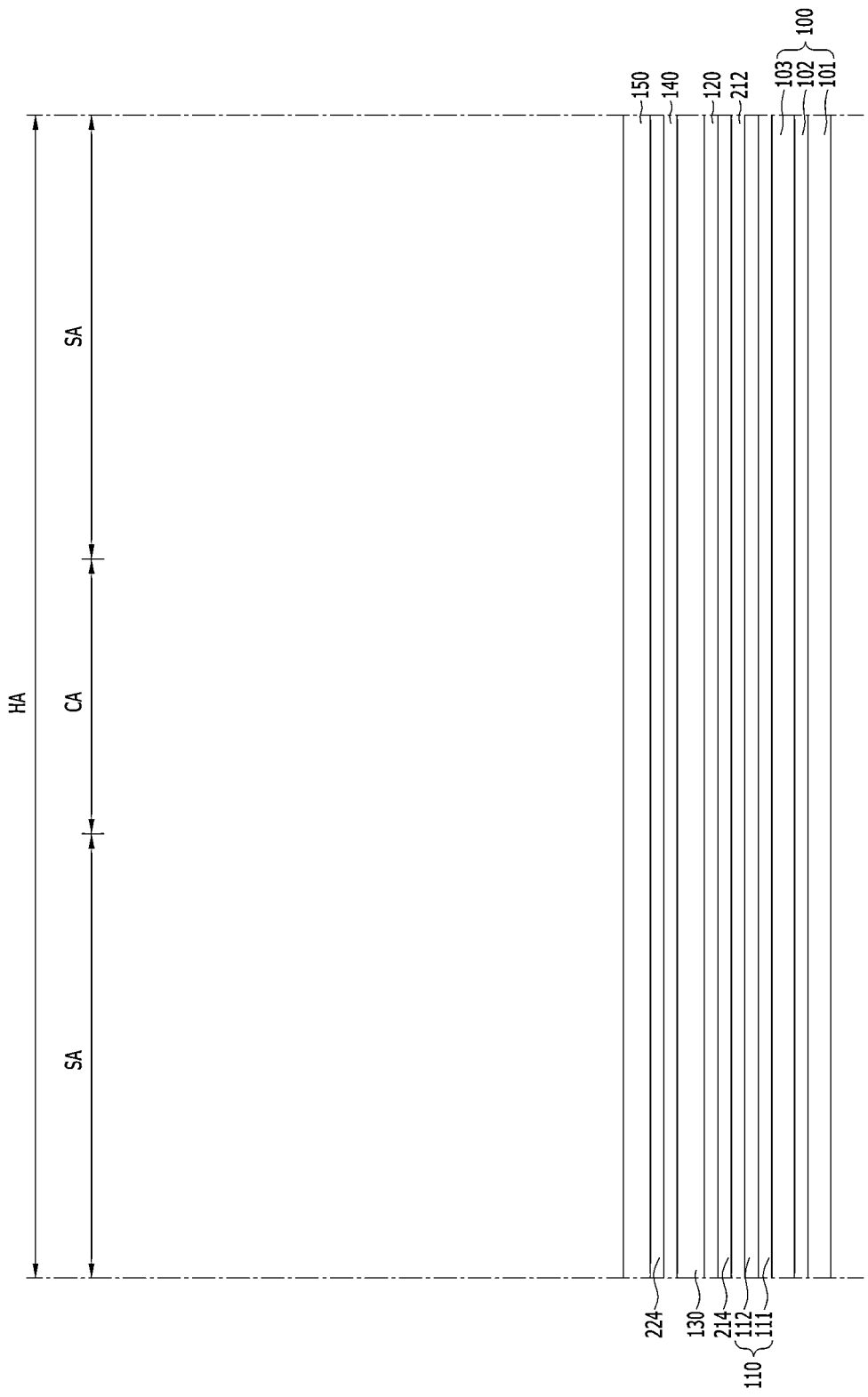
Figure 7C:
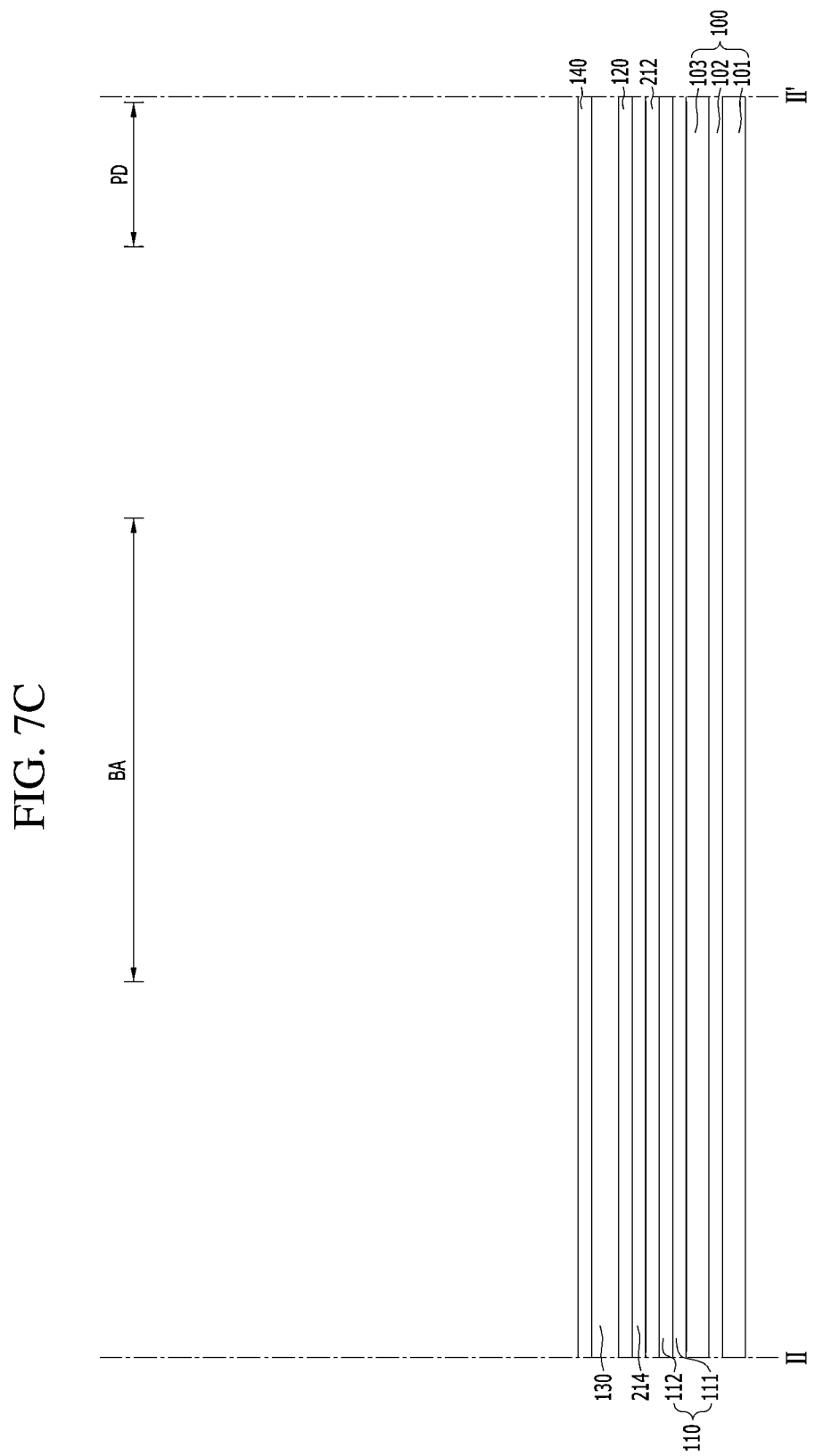

As shown in FIGS. 7A-7C, the method of forming the display apparatus according to the embodiment of the present disclosure may include a step of forming the intermediate source electrode 265, the intermediate drain electrode 266, the second source electrode 225, the second drain electrode 226, the third source electrode 255 and the third drain electrode 256 on the device substrate 100 in which the first intermediate contact hole, the second intermediate contact hole, the storage contact hole, the third source contact hole and the third drain contact hole are formed.

The intermediate source electrode 265 may be connected to the first source electrode 215 via the first intermediate contact hole. The intermediate drain electrode 266 may be connected to the first drain electrode 216 via the second intermediate contact hole. The second source electrode 225 may be connected to the second source region of the second semiconductor pattern 221 via the second source contact hole. The second drain electrode 226 may be connected to the second drain region of the second semiconductor pattern 221 via the second drain contact hole, and to the first storage electrode 231 via the storage contact hole. The third source electrode 255 may be connected to the third source region of the third semiconductor pattern 251 via the third source contact hole. The third drain electrode 256 may be connected to the third drain region of the third semiconductor pattern 251 via the third drain contact hole. The intermediate source electrode 265, the intermediate drain electrode 266, the second source electrode 225, the second drain electrode 226, the third source electrode 255 and the third drain electrode 226 may be formed at the same time. For example, the step of forming the intermediate source electrode 265, the intermediate drain electrode 266, the second source electrode 225, the second drain electrode 226, the third source electrode 255 and the third drain electrode 226 may include a step of forming a conductive layer on the device substrate 100 in which the first intermediate contact hole, the second intermediate contact hole, the storage contact hole, the third source contact hole and the third drain contact hole are formed, and a step of patterning the conductive layer by using mask pattern.

Figure 8A:
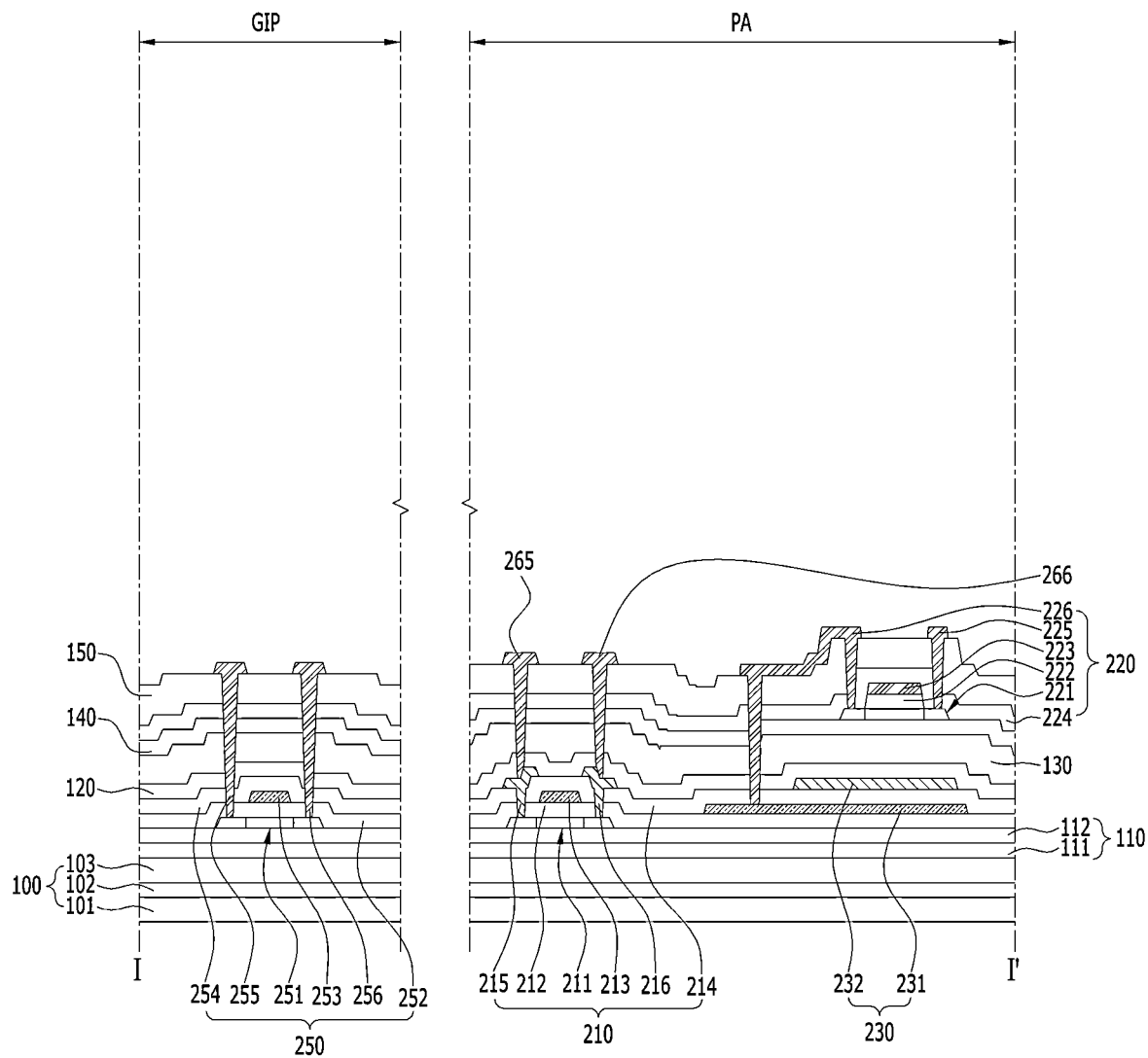

As shown in FIGS. 8A-8C, the method of forming the display apparatus according to the embodiment of the present disclosure may include a step of forming at least one separating device 300 on the separating area SA of the device substrate 100 in which the intermediate source electrode 265, the intermediate drain electrode 266, the second source electrode 225, the second drain electrode 226, the third source electrode 255 and the third drain electrode 256 are formed.

The step of forming the separating device 300 may include a step of patterning the device buffer layer 110, the first gate insulating layer 212, the first interlayer insulating layer 214, the first lower passivation layer 120, the second lower passivation layer 130, the separation insulating layer 140, the second interlayer insulating layer 224 and the third lower passivation layer 150 which are stacked on the separating area SA of the device substrate 100. The device buffer layer 110, the first gate insulating layer 212, the first interlayer insulating layer 214, the first lower passivation layer 120, the second lower passivation layer 130, the separation insulating layer 140, the second interlayer insulating layer 224 and the third lower passivation layer 150 on the hole area CA, the bending area BA and the pad area PD of the device substrate 100 may be removed by a process of forming the separating device 300. For example, the step of forming the separating device 300 may include a step of exposing the hole area CA, the bending area BA and the pad area PD of the device substrate 100. A side of the separating device 300 disposed closest to the hole area CA may have a relatively gradual slope.

Figure 9A:
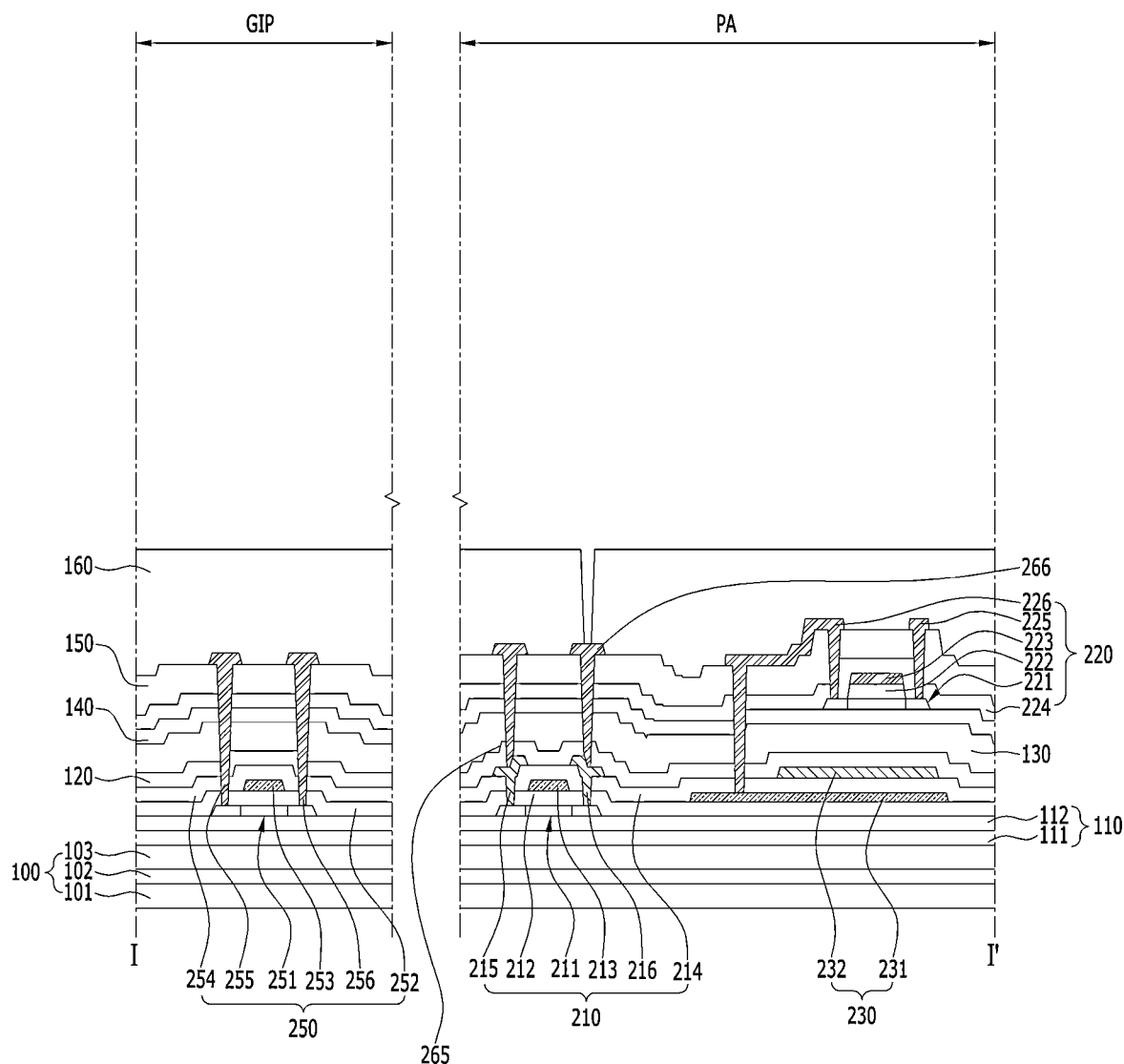
Figure 9C:
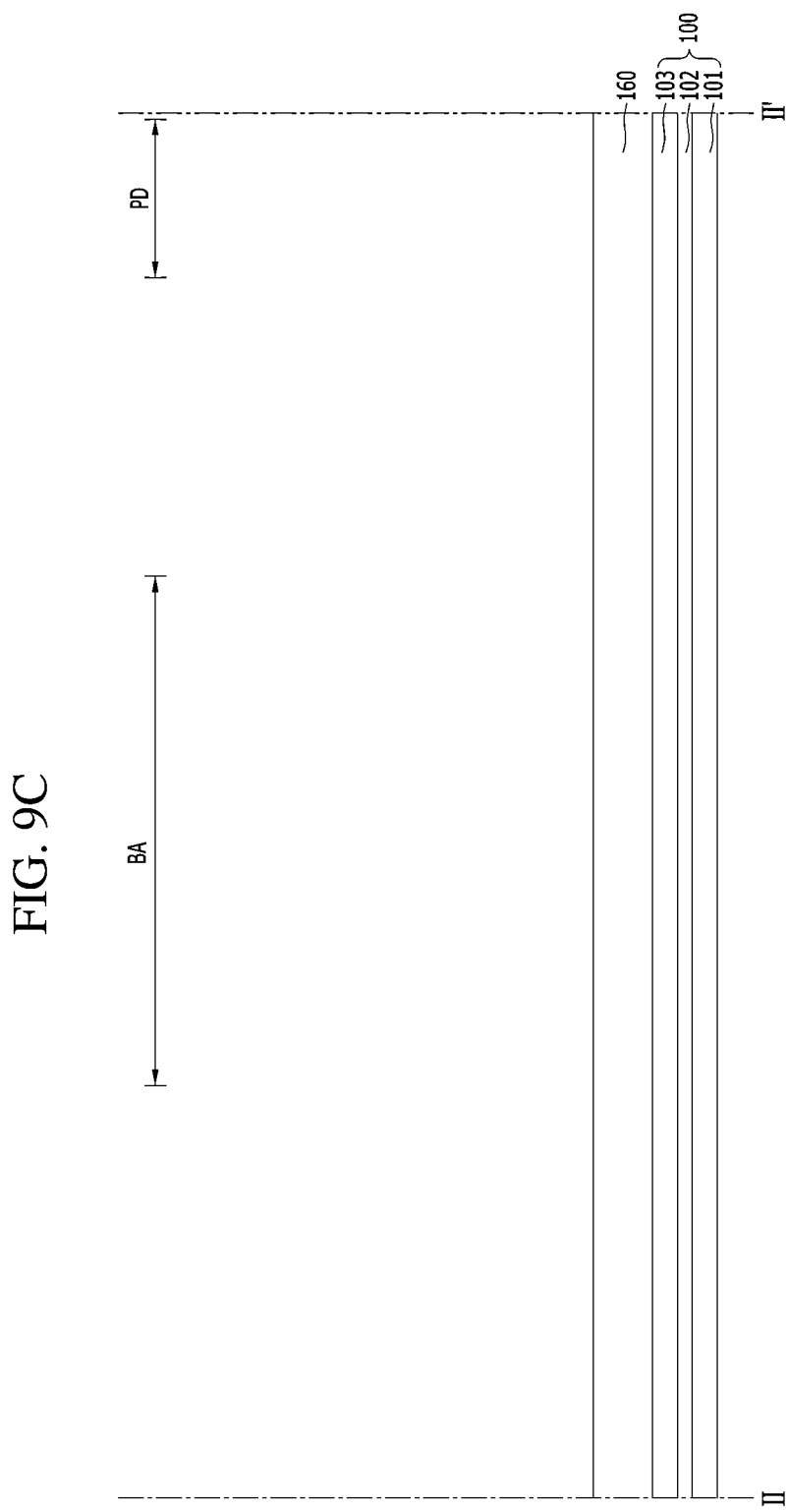

As shown in FIGS. 9A-9C, the method of forming the display apparatus according to the embodiment of the present disclosure may include a step of forming the first over-coat layer 160 on the pixel area PA, the gate driver area GIP, the bending area BA and the pad area PD of the device substrate 100 in which the separating device 300 is formed, and a step of forming a first electrode contact hole in the first over-coat layer 160.

The bending area BA and the pad area PD of the device substrate 100 may be in direct contact with the first over-coat layer 160. The first electrode contact hole may partially expose the intermediate drain electrode 266 of the pixel area PA. The first over-coat layer 160 may be not formed on the separating device 300. For example, the step of forming the first electrode contact hole may include a step of removing the first over-coat layer 160 on the hole peripheral area HA of the device substrate 100.

Figure 10A:
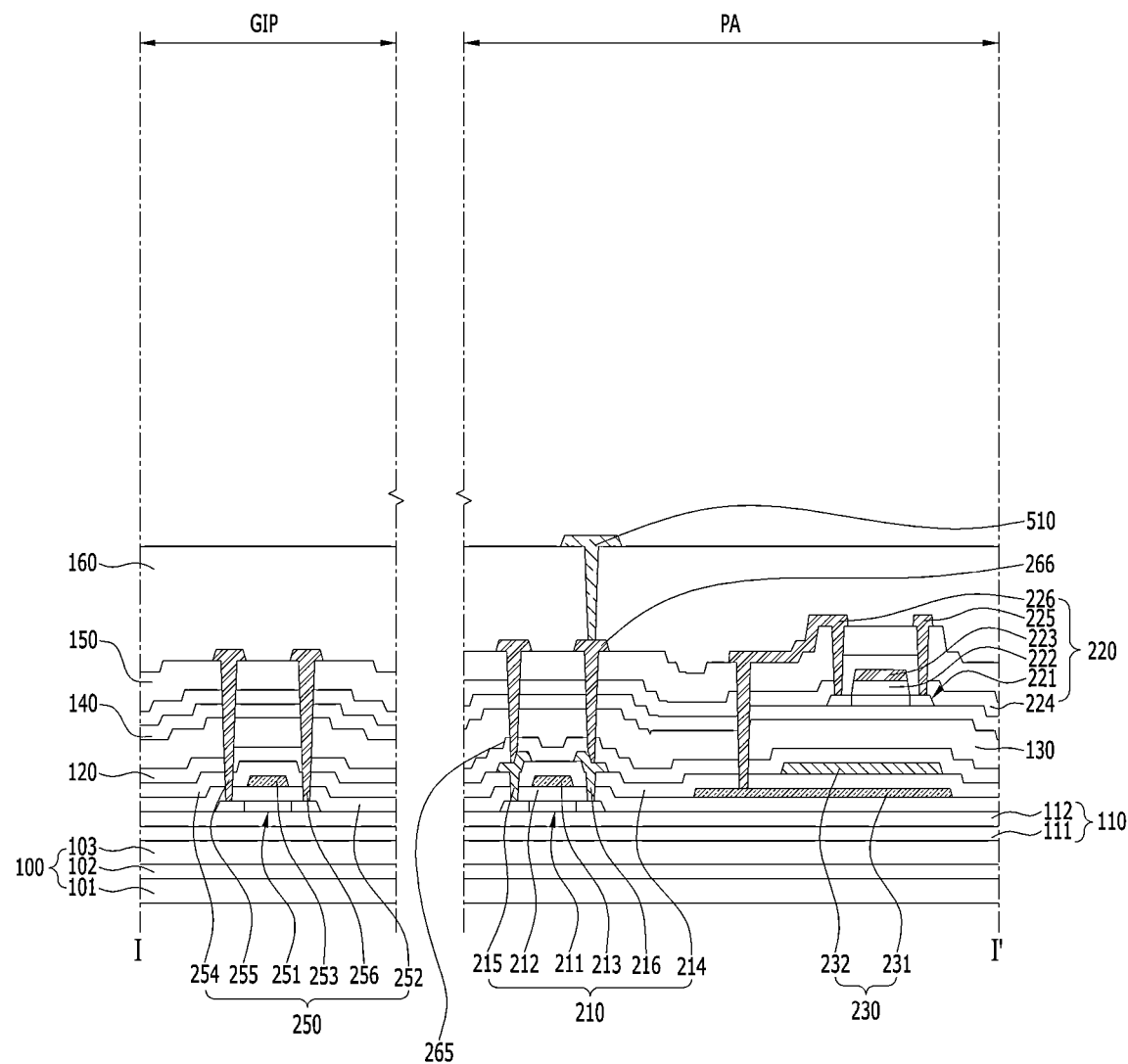
Figure 10B:
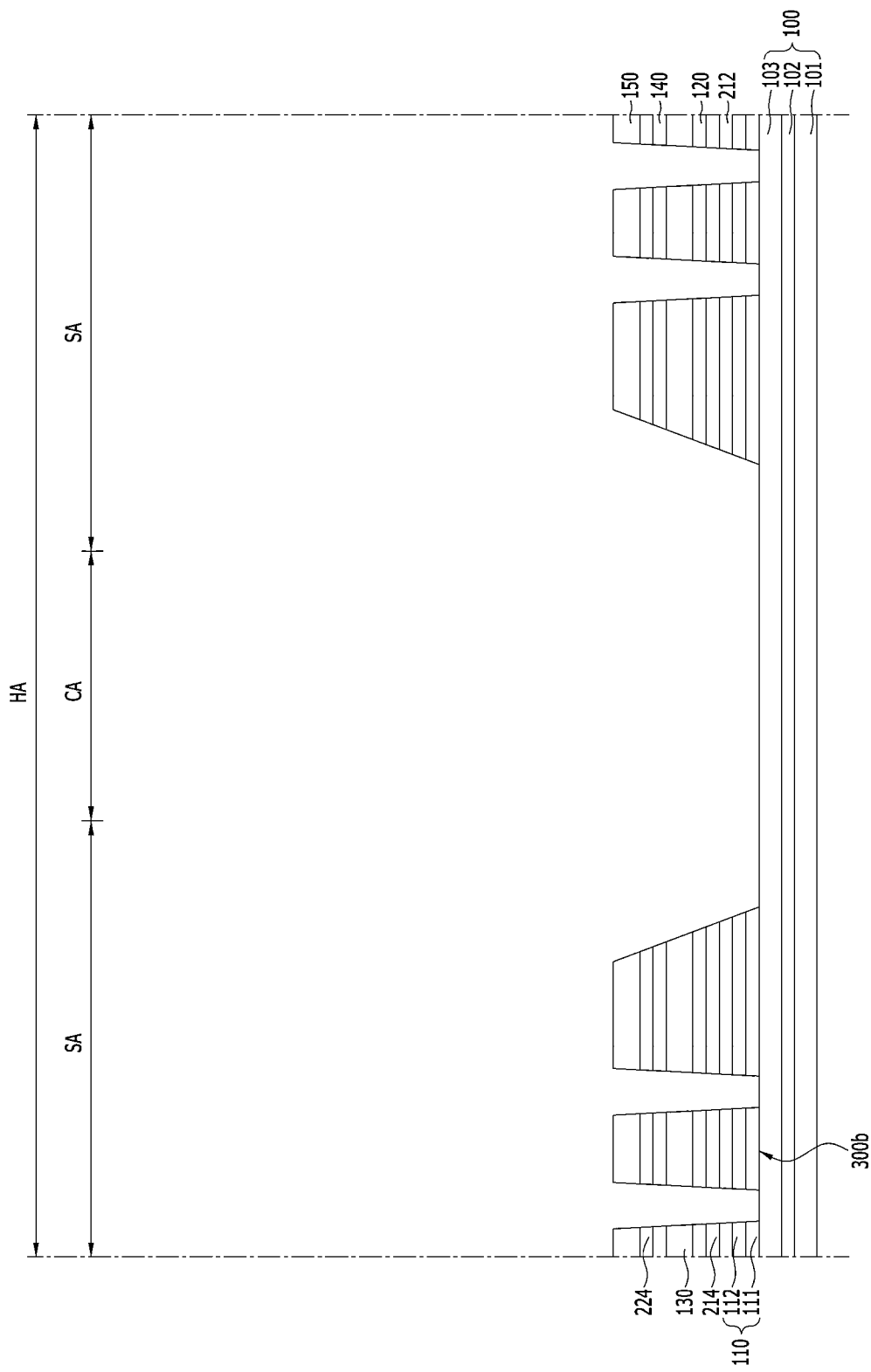

As shown in FIGS. 10A-10C, the method of forming the display apparatus according to the embodiment of the present disclosure may include a step of forming the intermediate contact electrodes 510 and the lower connecting electrode 910 on the device substrate 100 in which the first electrode contact hole is formed.

The intermediate contact electrode 510 may be formed on the pixel area PA. The intermediate contact electrode 510 may be connected to the intermediate drain electrode 266 via the first electrode contact hole. The lower connecting electrode 910 may include a region overlapping with the bending area BA. For example, the lower connecting electrode 910 may cross the bending area BA. The lower connecting electrode 910 may be formed at the same time as the intermediate contact electrode 510. For example, the step of forming the intermediate contact electrodes 510 and the lower connecting electrode 910 may include a step of forming a conductive layer on the device substrate 100 in which the first electrode contact hole is formed, and a step of patterning the conductive layer.

Figure 11A:
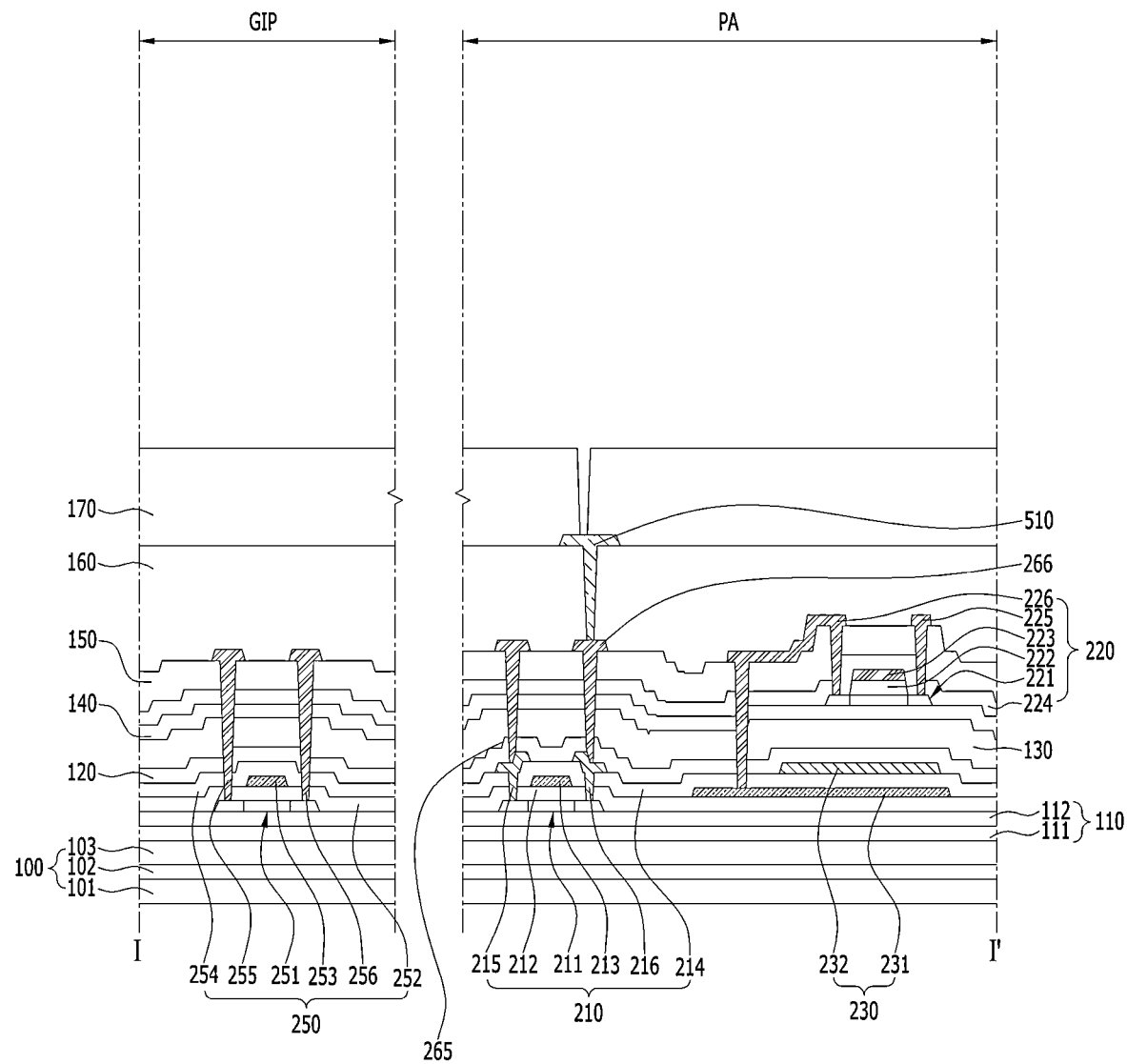
Figure 11B:
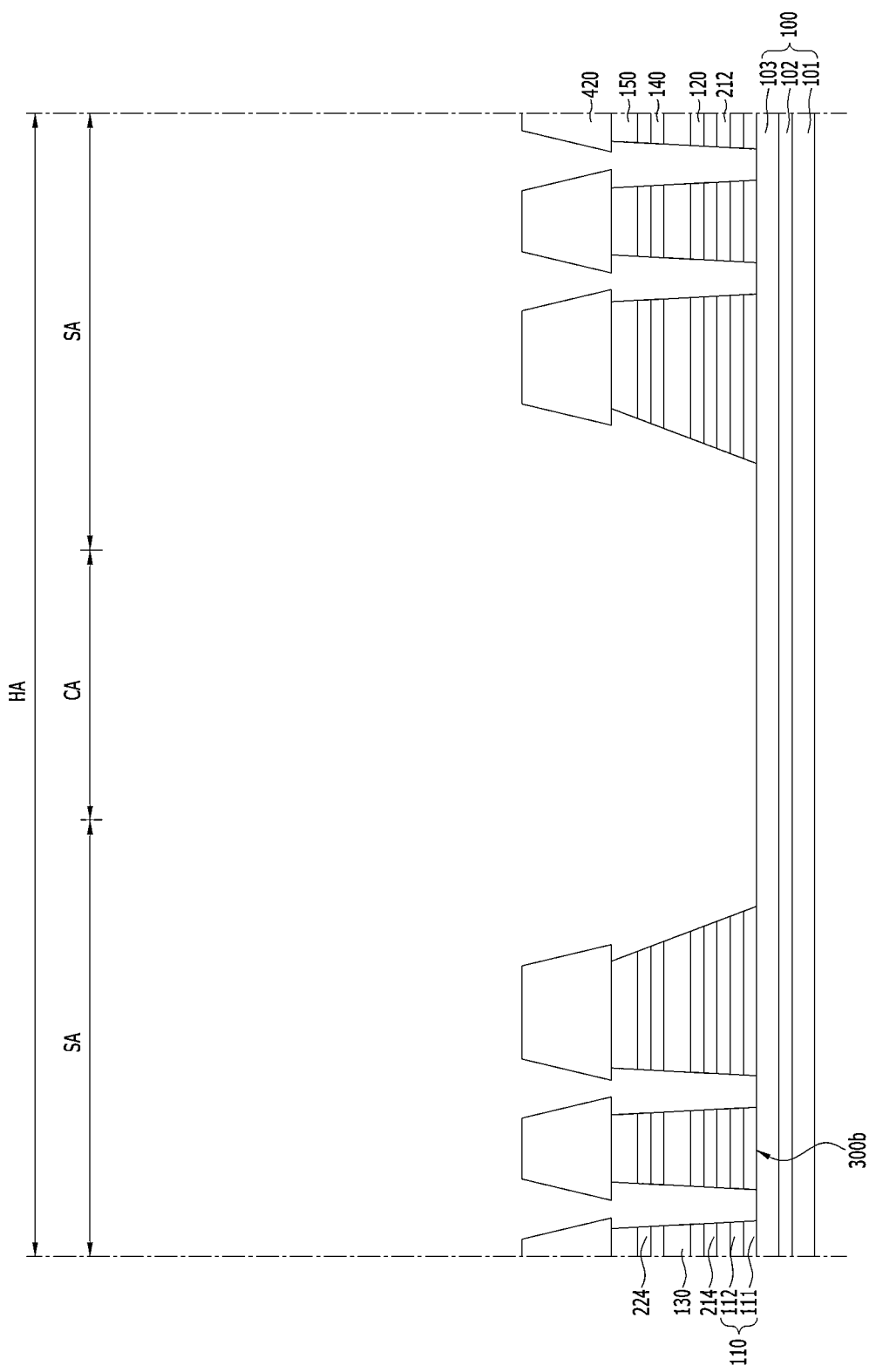
Figure 11C:
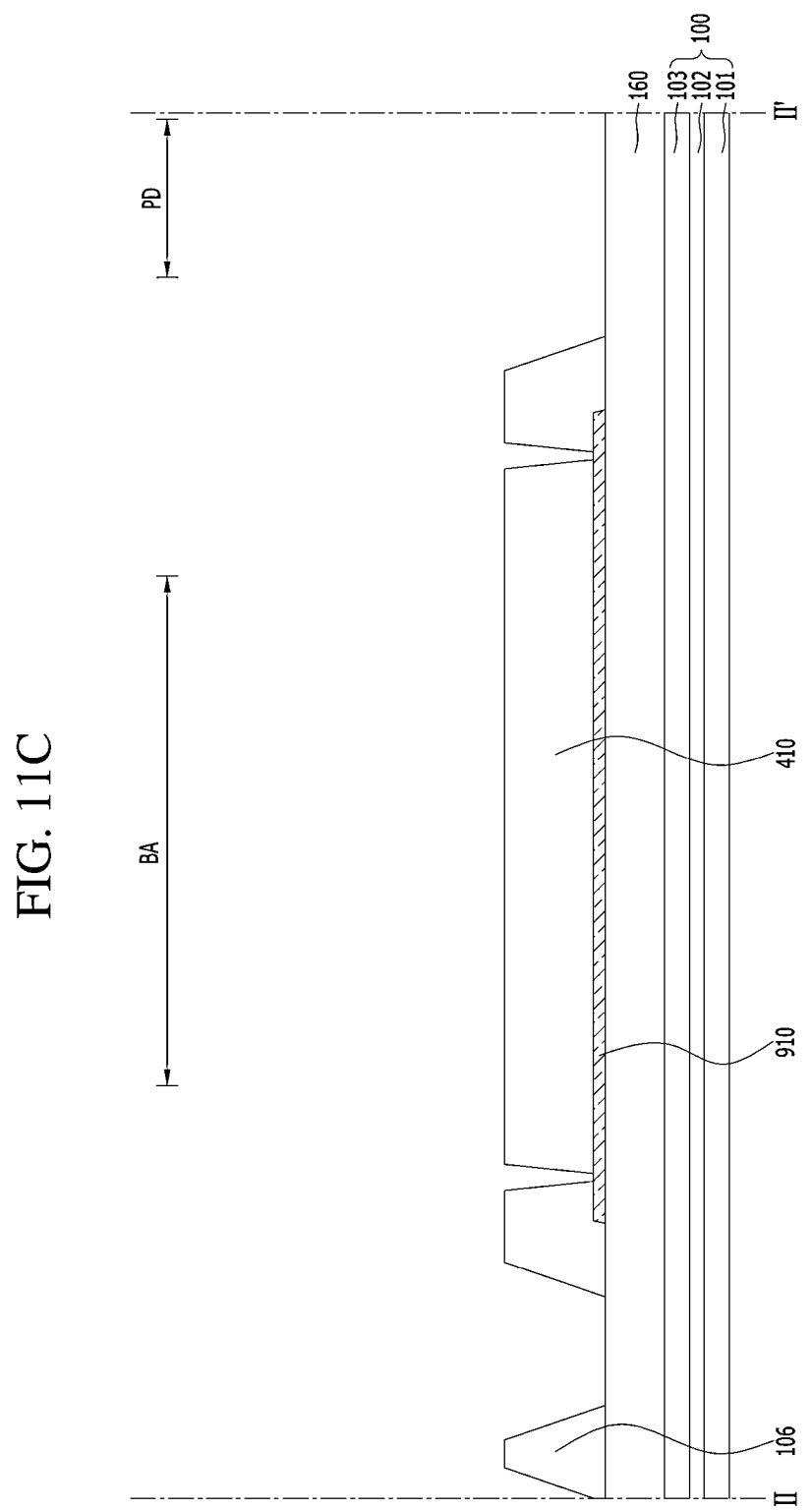

As shown in FIGS. 11A-11C, the method of forming the display apparatus according to the embodiment of the present disclosure may include a step of forming the second over-coat layer 170, the encapsulating dam 106, the crack preventing layer 410 and the separating cap 420 on the device substrate 100 in which the intermediate contact electrode 510 and the lower connecting electrode 910 are formed.

The second over-coat layer 170 may include a second electrode contact hole partially exposing the intermediate contact electrode 510. The crack preventing layer 410 may include the connection contact hole exposing a portion of the lower connecting electrode 910. The crack preventing layer 410 may be spaced away from the encapsulating dam 106. The separating cap 420 may be formed on the separating area SA. For example, the separating cap 420 may constitute the separating device 300. The separating device 300 may be spaced away from the second over-coat layer 170, the encapsulating dam 106 and the crack preventing layer 410. The second over-coat layer 170, the encapsulating dam 106, the crack preventing layer 410 and the separating cap 420 may be formed at the same time. For example, the step of forming the second over-coat layer 170, the encapsulating dam 106, the crack preventing layer 410 and the separating cap 420 may include a step of forming an organic insulating material layer on the device substrate 100 in which the intermediate contact electrode 510 and the lower connecting electrode 910 are formed, and a step of patterning the organic insulating material layer by using mask pattern.

Figure 12A:
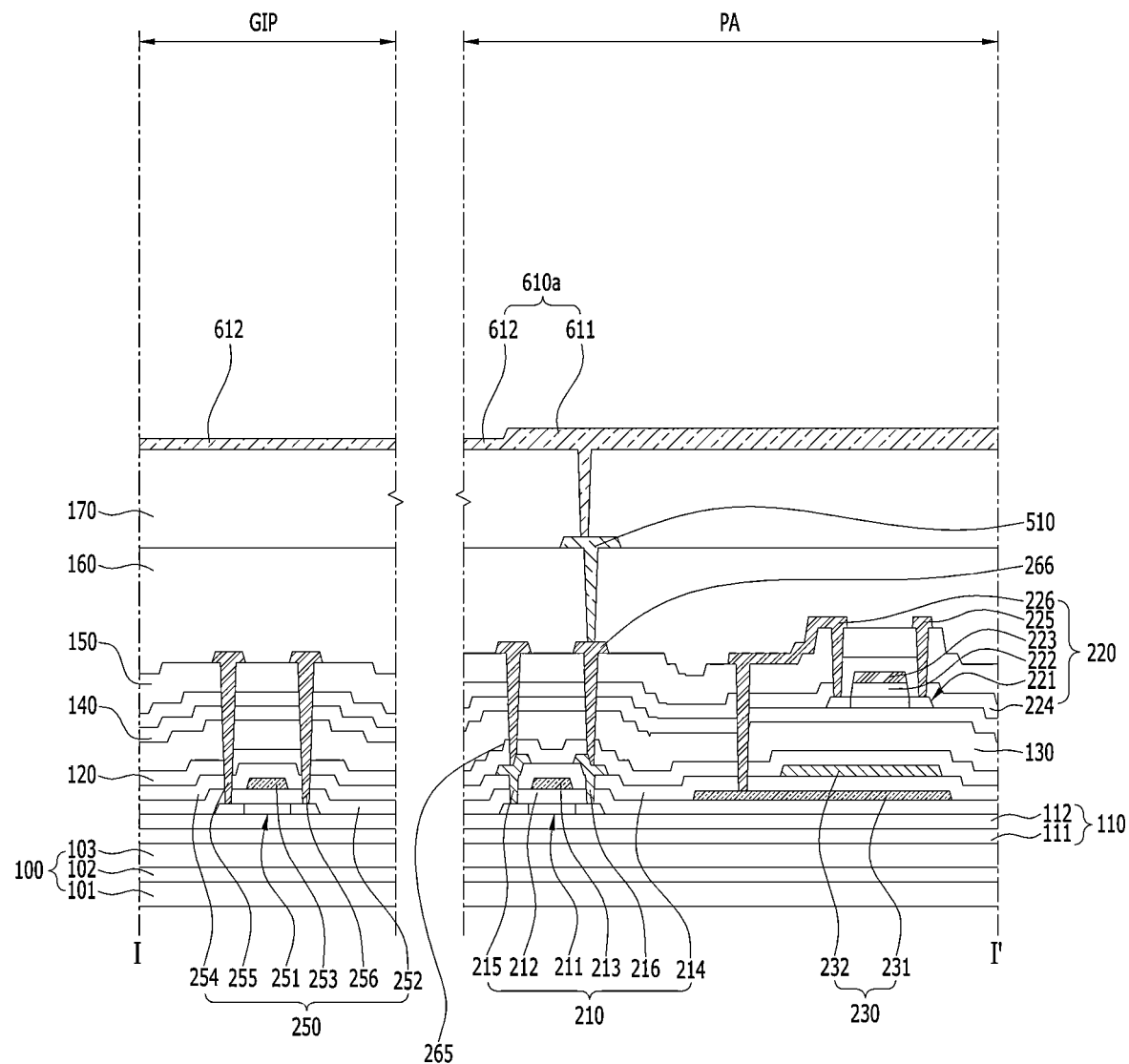
Figure 12B:
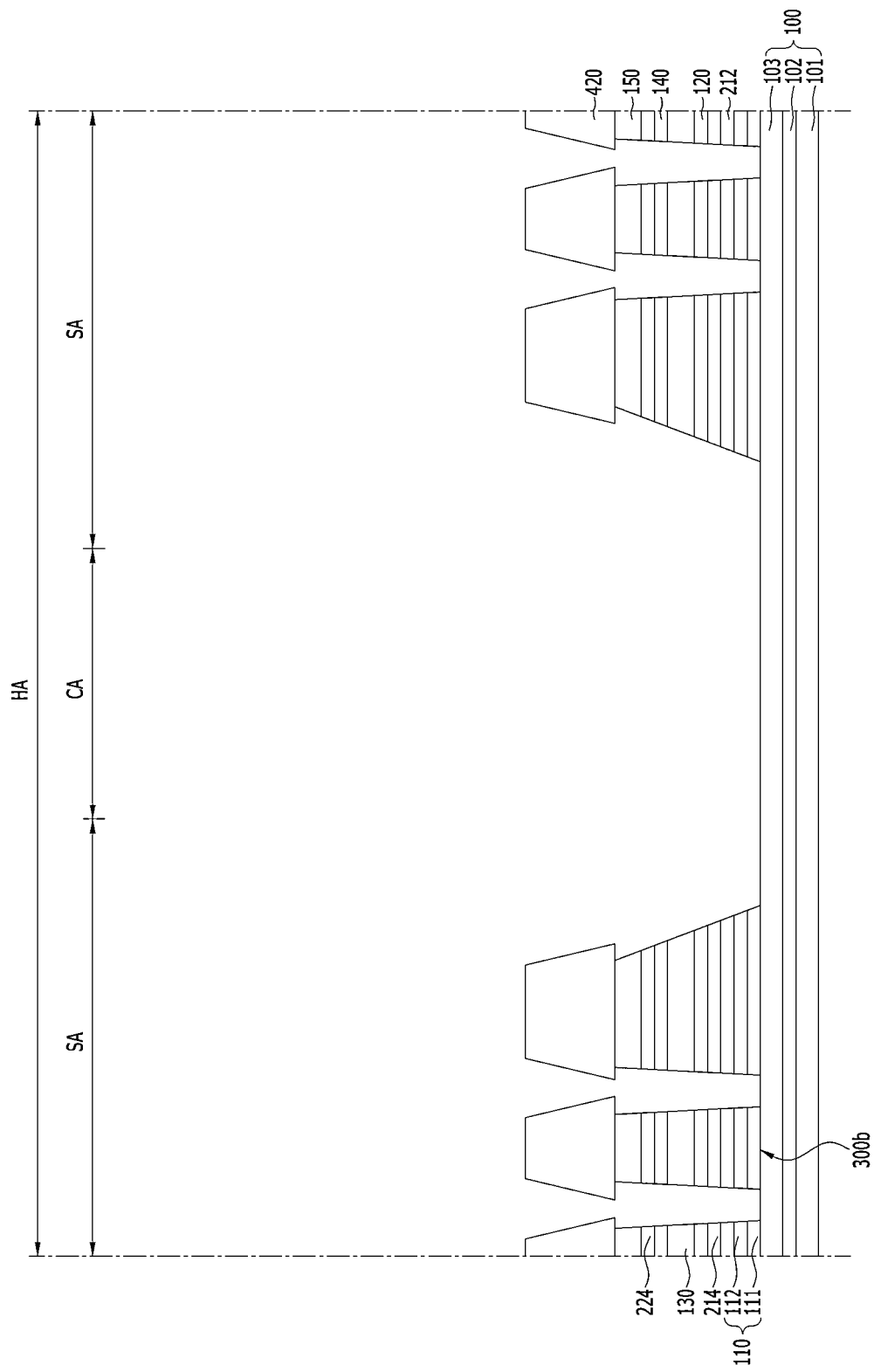
Figure 12C:
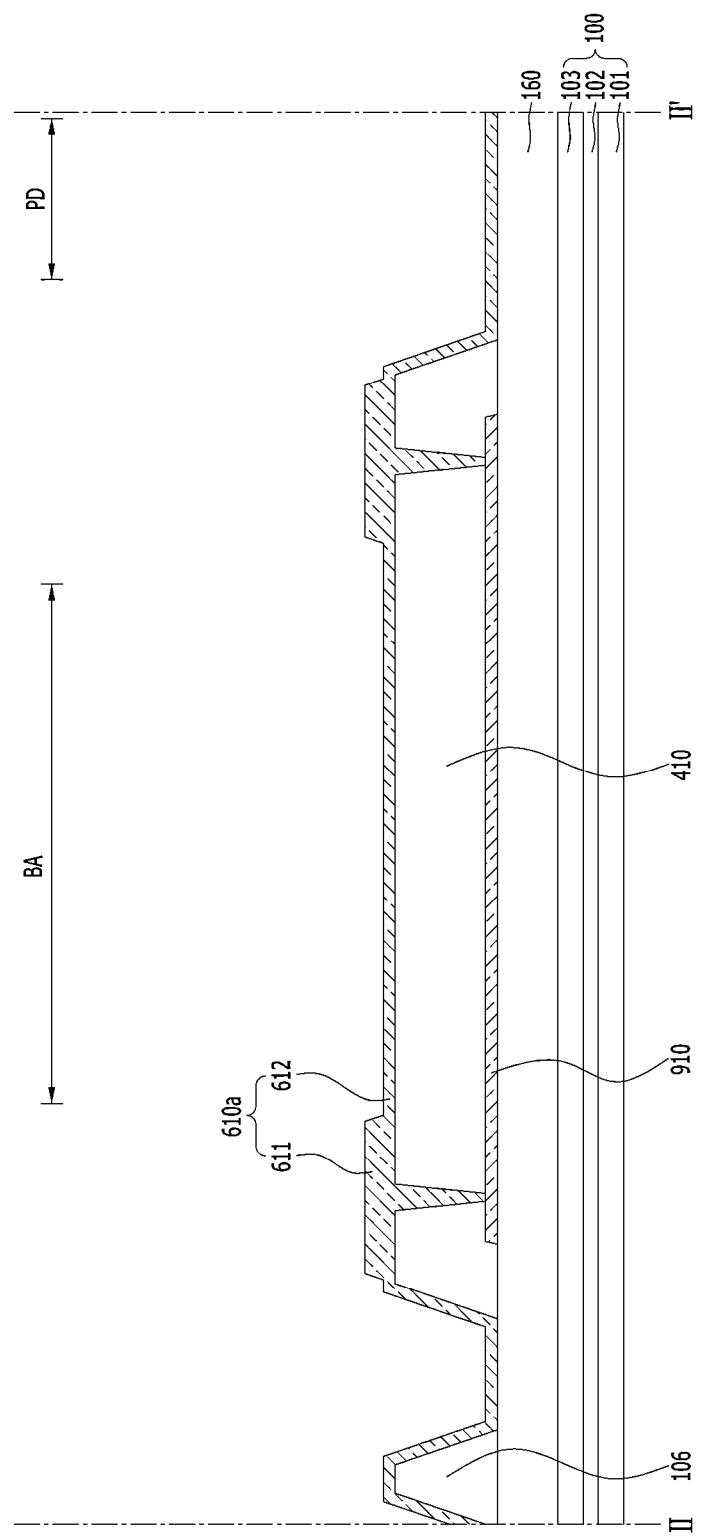

As shown in FIGS. 12A-12C, the method of forming the display apparatus according to the embodiment of the present disclosure may include a step of forming emission electrode layer 610a on the pixel area PA, the bending area BA and the pad area PD of the device substrate 100 in which the second over-coat layer 170, the encapsulating dam 106, the crack preventing layer 410 and the separating cap 420 are formed.

The emission electrode layer 610a may be not formed on the hole peripheral area HA of the device substrate 100. For example, the step of forming the emission electrode layer 610a may include a step of forming a conductive layer on the device substrate 100 in which the second over-coat layer 170, the encapsulating dam 106, the crack preventing layer 410 and the separating cap 420 are formed, and a step of removing the emission electrode layer 610a on the hole peripheral area HA of the device substrate 100. A conductive residual layer on the hole peripheral area HA of the device substrate 100 which is left in a process of forming the intermediate contact electrode 510 and the lower connecting electrode 910, may be removed by a process of forming the emission electrode layer 610a.

The emission electrode layer 610a may include a first electrode region 611 and a second electrode region 612 having a thinner than the first electrode region 611. The first electrode region 611 may overlap with the first emission electrode 610 and the middle connecting electrode 930 which are formed by a subsequent process. For example, the second electrode contact hole and the connection contact hole may be filled by the first electrode region 611.

Figure 13A:
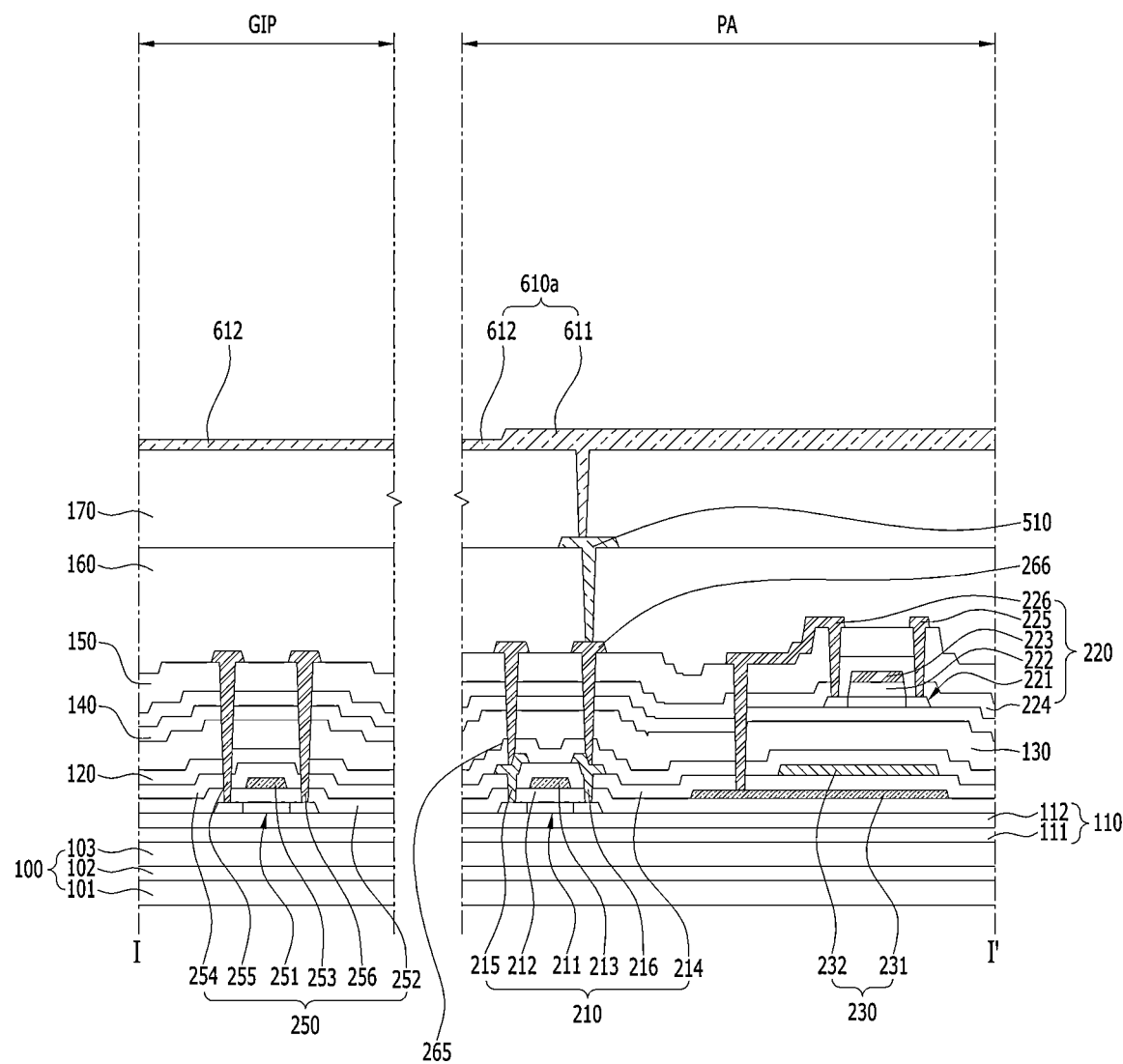
Figure 13B:
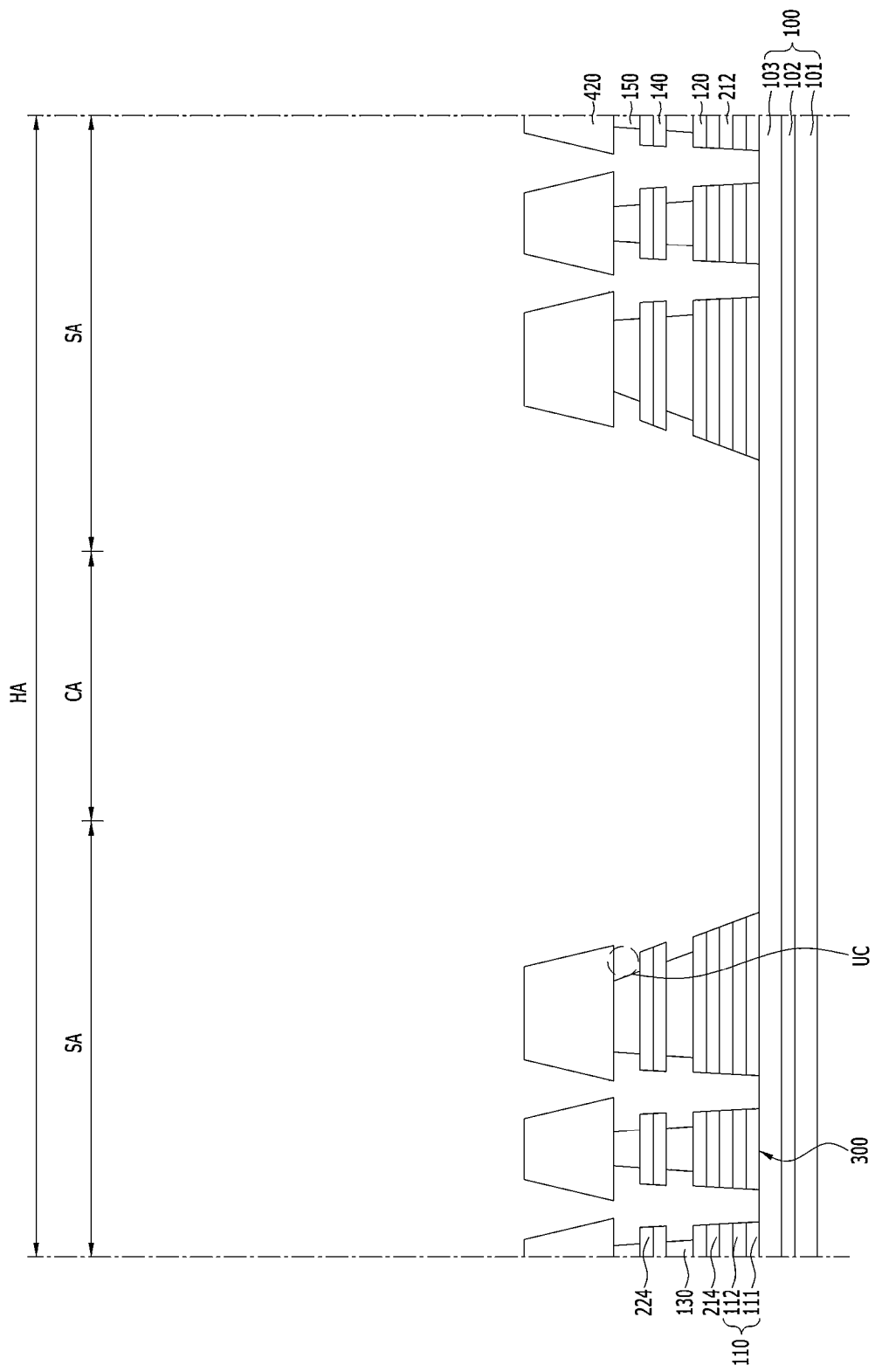
Figure 13C:
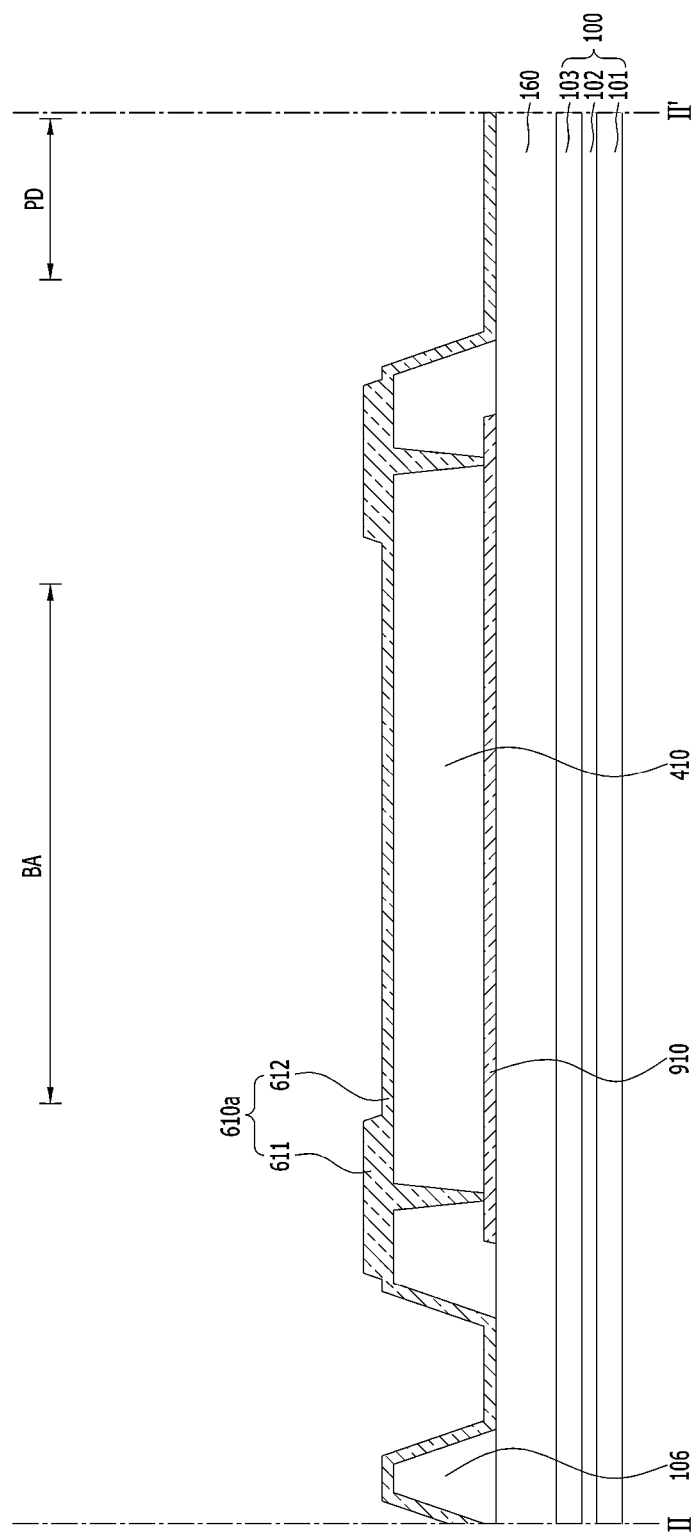

As shown in FIGS. 13A-13C, the method of forming the display apparatus according to the embodiment of the present disclosure may include a step of forming at least one under-cut structure UC in the separating device 300.

The step of forming the under-cut structure UC of the separating device 300 may include a step of partially etching some of the device buffer layer 110, the first gate insulating layer 212, the first interlayer insulating layer 214, the first lower passivation layer 120, the second lower passivation layer 130, the separation insulating layer 140, the second interlayer insulating layer 224 and the third lower passivation layer 150, which constitute the separating device 300 by using an etching selectivity thereof. For example, the step of forming the under-cut structure UC of the separating device 300 may include a step of etching edges of the second lower passivation layer 130 and the third lower passivation layer 150, which are formed of silicon nitride (SIN). The step of forming the under-cut structure UC of the separating device 300 may be performed by using the emission electrode layer 610*a* as a mask pattern. Thus, in the method of forming the display apparatus according to the embodiment of the present disclosure, the under-cut structure UC of the separating device 300 may be formed without affecting the pixel area PA, the bending area BA, and the pad area PD of the device substrate 100. Therefore, in the method of forming the display apparatus according to the embodiment of the present disclosure, the process efficiency may be improved.

Figure 14A:
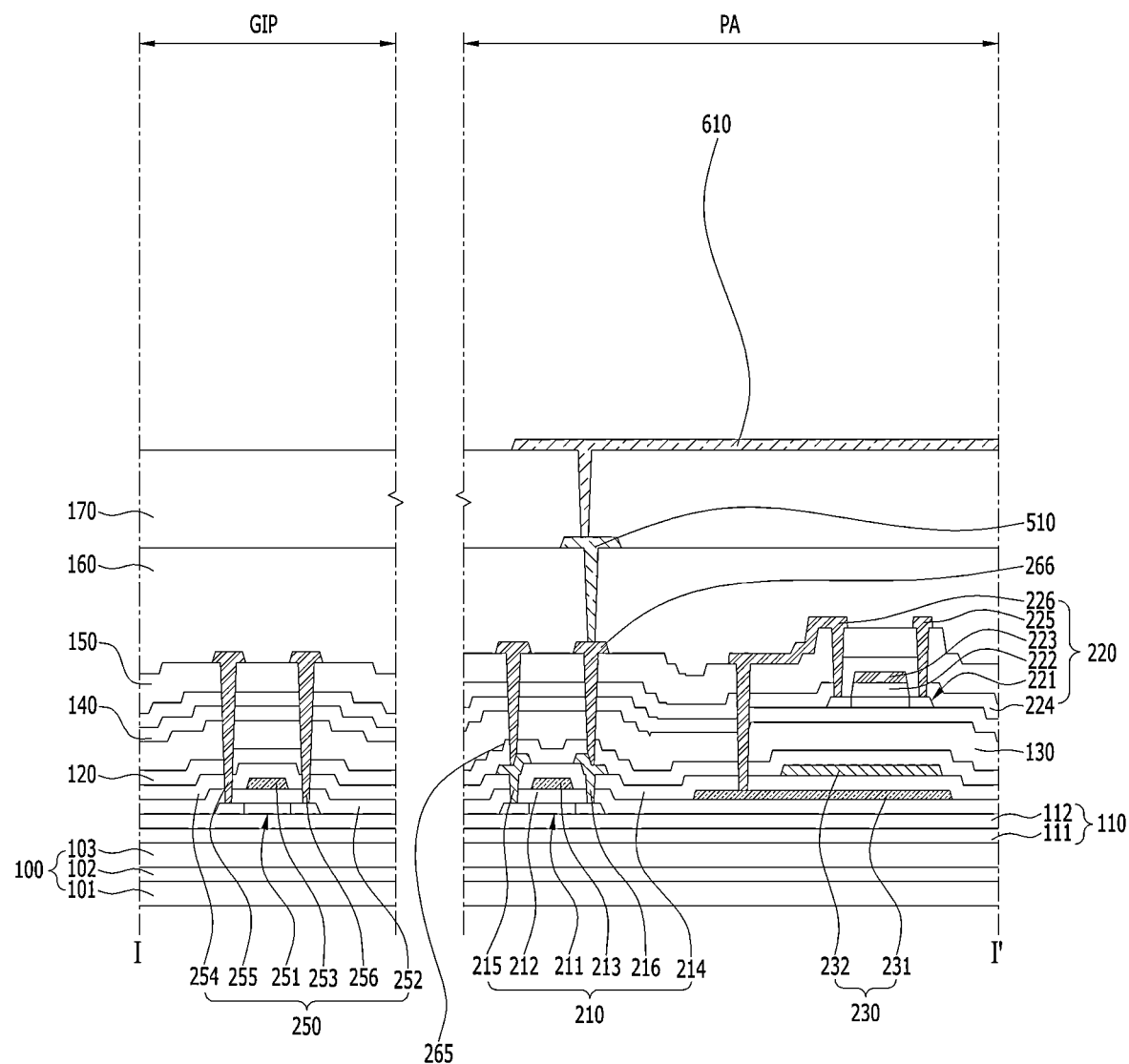
Figure 14C:
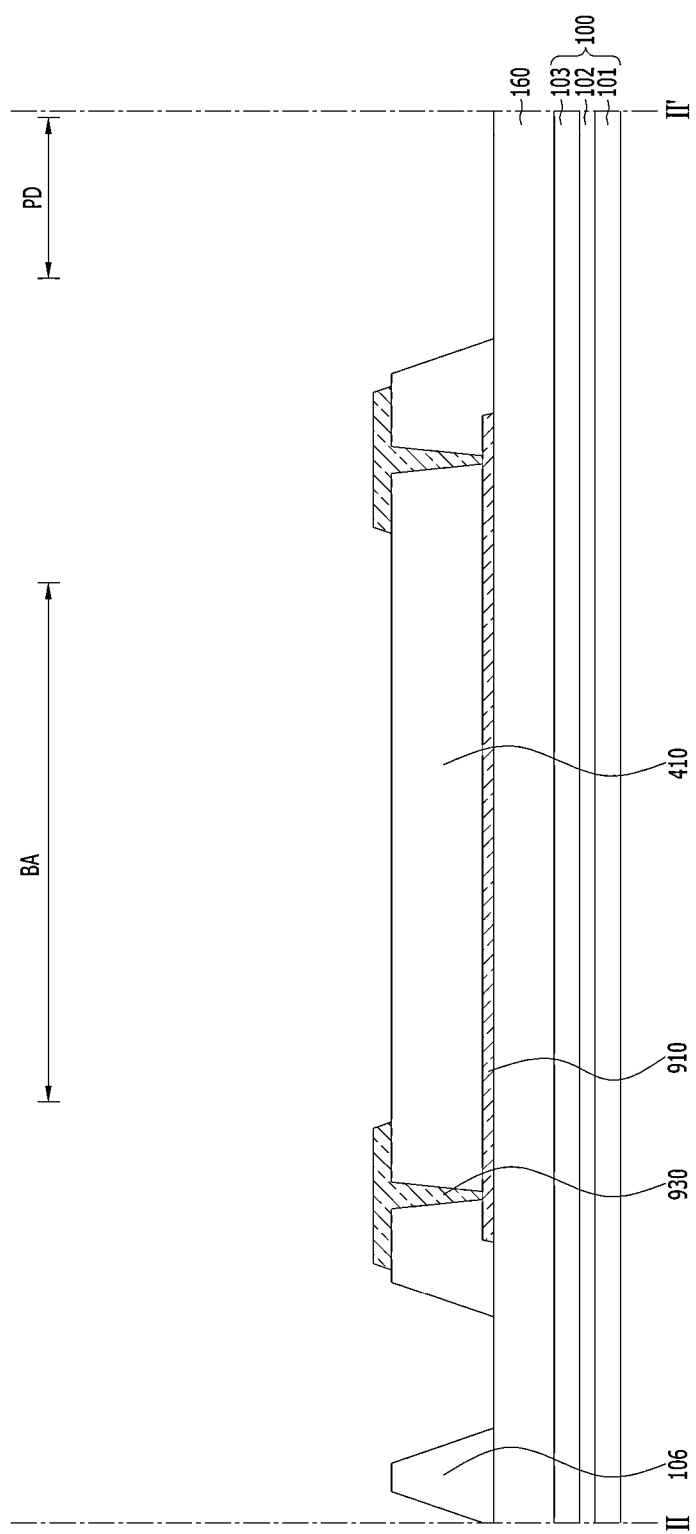

As shown in FIGS. 14A-14C, the method of forming the display apparatus according to the embodiment of the present disclosure may include a step of forming the first emission electrode 610 and the middle connecting electrode 930 on the device substrate 100.

The first emission electrode 610 may be formed on the pixel area PA of the device substrate 100. The middle connecting electrode 930 may include a region in the connection contact hole penetrating the crack preventing layer 410. For example, the step of forming the first emission electrode 610 and the middle connecting electrode 930 may include a step of removing the second electrode region 612 of the emission electrode layer 610*a*. Thus, in the method of forming the display apparatus according to the embodiment of the present disclosure, the first emission electrode 610 and the middle connecting electrode 930 may be formed without forming a new mask pattern.

Figure 15A:
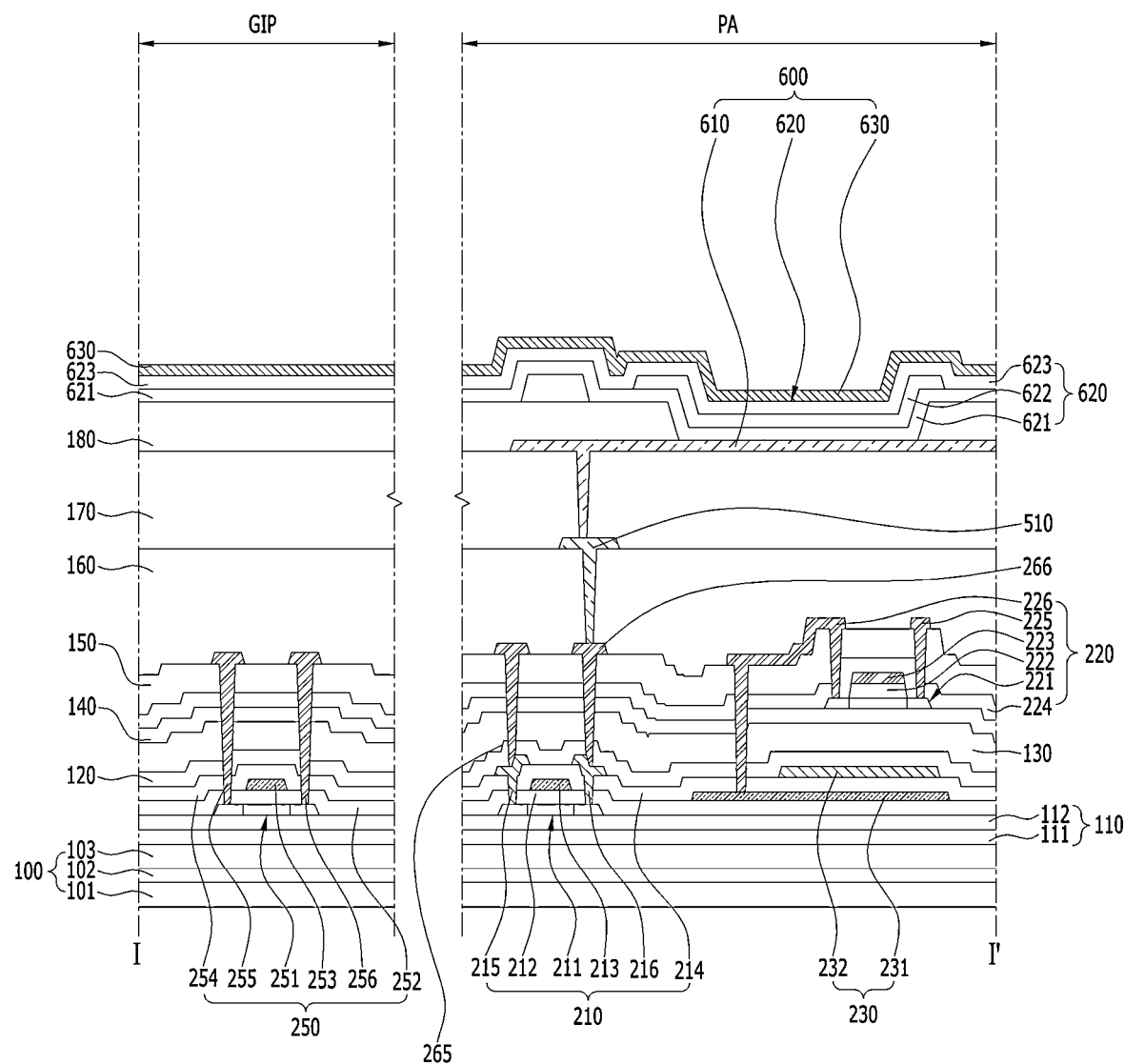
Figure 15B:
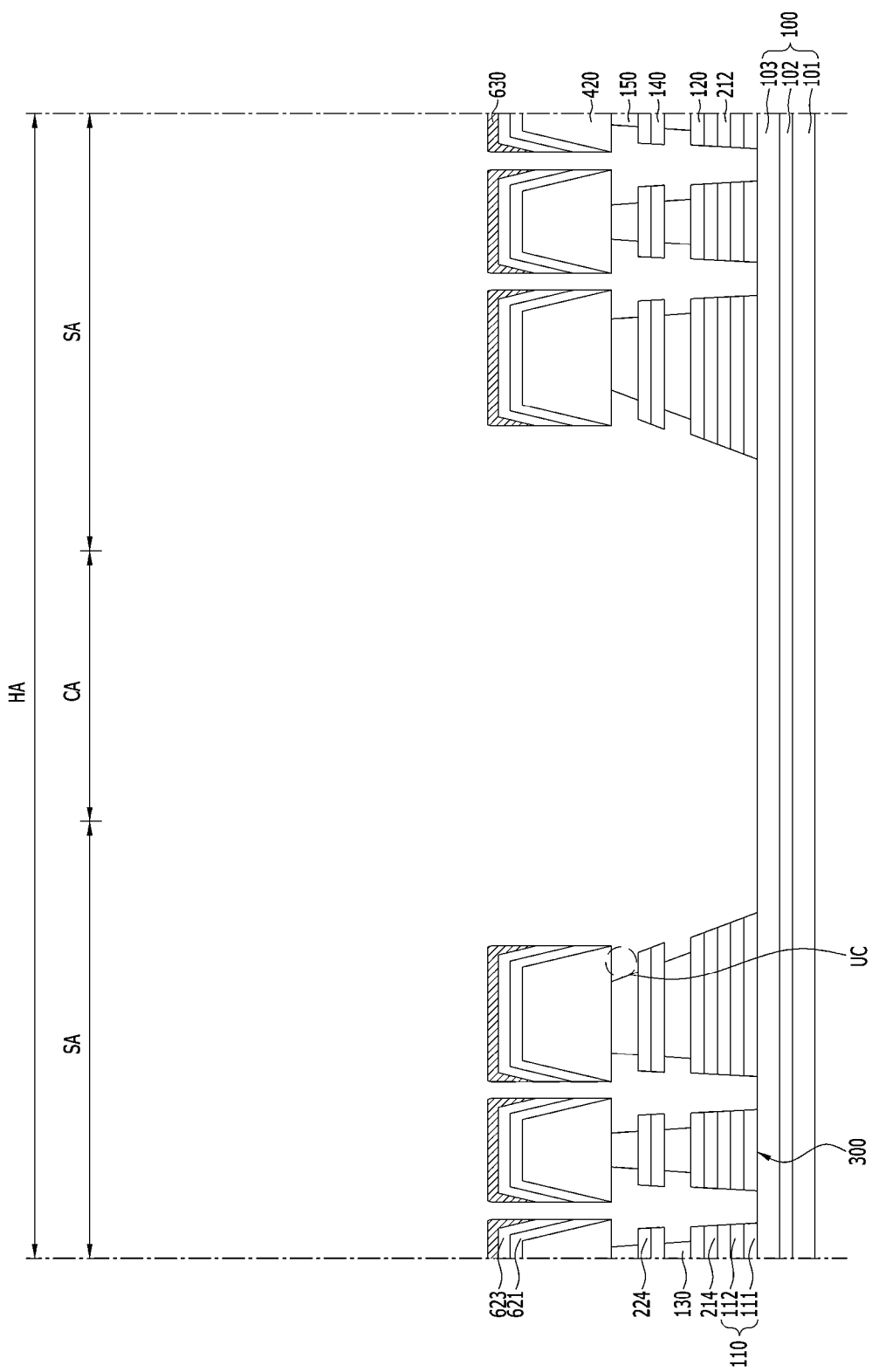
Figure 15C:
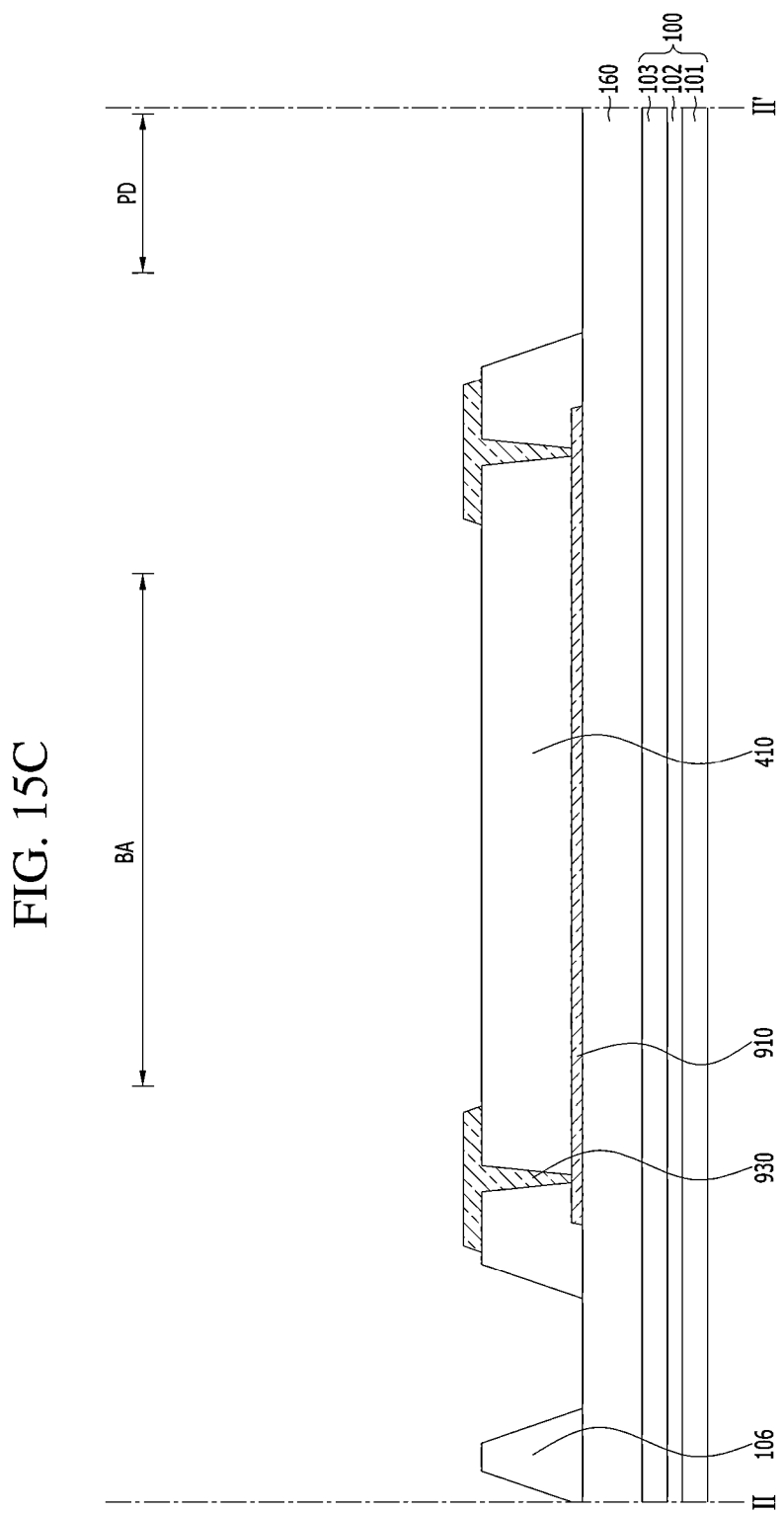

As shown in FIGS. 15A-15C, the method of forming the display apparatus according to the embodiment of the present disclosure may include a step of forming the light-emitting device 600 on the pixel area PA of the device substrate 100.

The step of forming the light-emitting device 600 may include a step of forming the bank insulating layer 180 covering an edge of the first emission electrode 610, and a step of stacking the light-emitting layer 620 and the second emission electrode 630 on a portion of the first emission electrode 610 exposed by the bank insulating layer 180. The light-emitting layer 620 and the second emission electrode 630 may be not formed on the hole area CA, the bending area BA and the pad area PD of the device substrate 100. For example, a step of forming the light-emitting layer 620 and the second emission electrode 630 may include a step of exposing the hole area CA, the bending area BA and the pad area PD of the device substrate 100. In the separating area SA of the device substrate 100, the light-emitting layer 620 and the second emission electrode 630 may be partially separated by the separating device 300 having the under-cut structure UC.

Figure 16A:
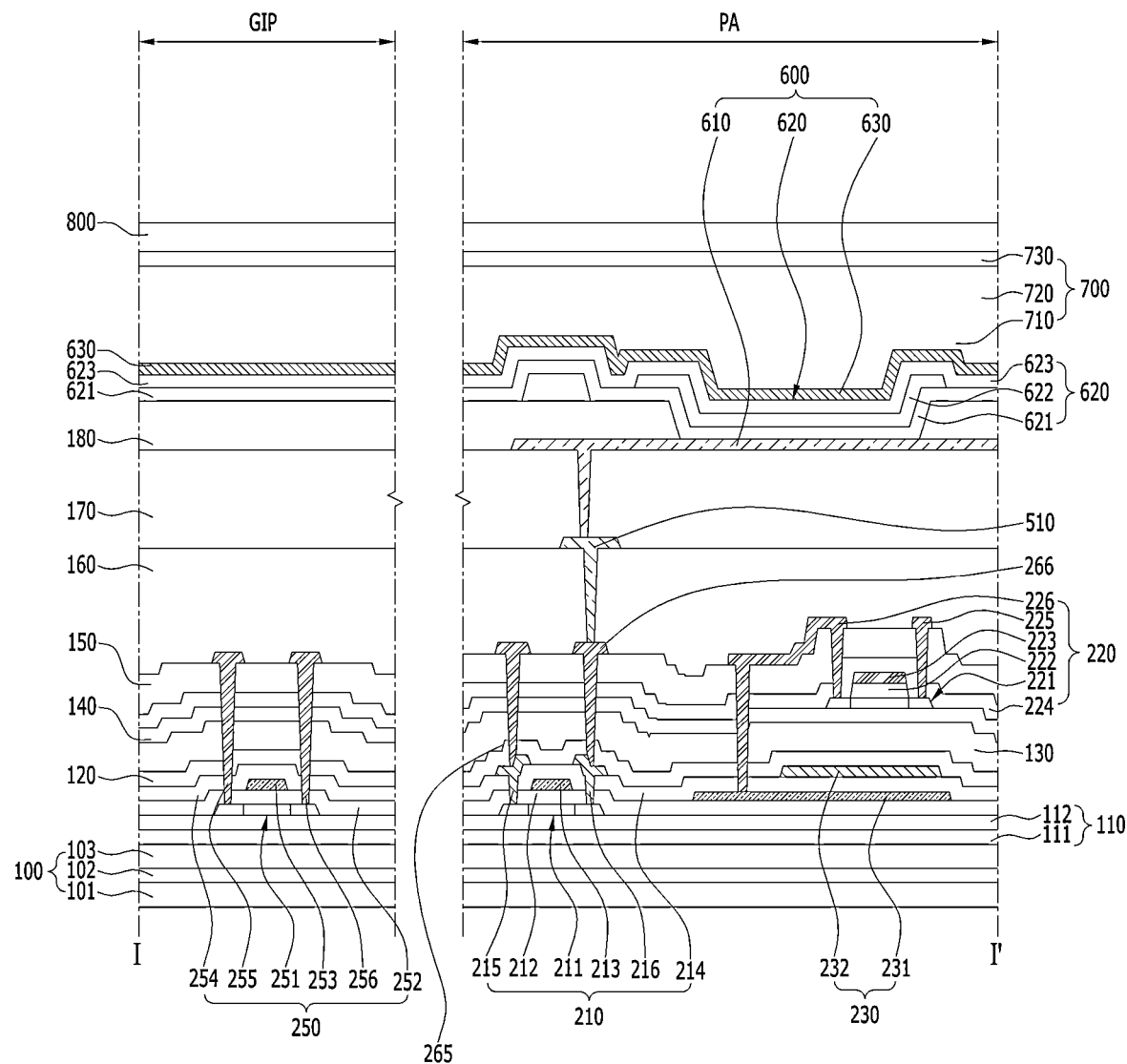
Figure 16B:
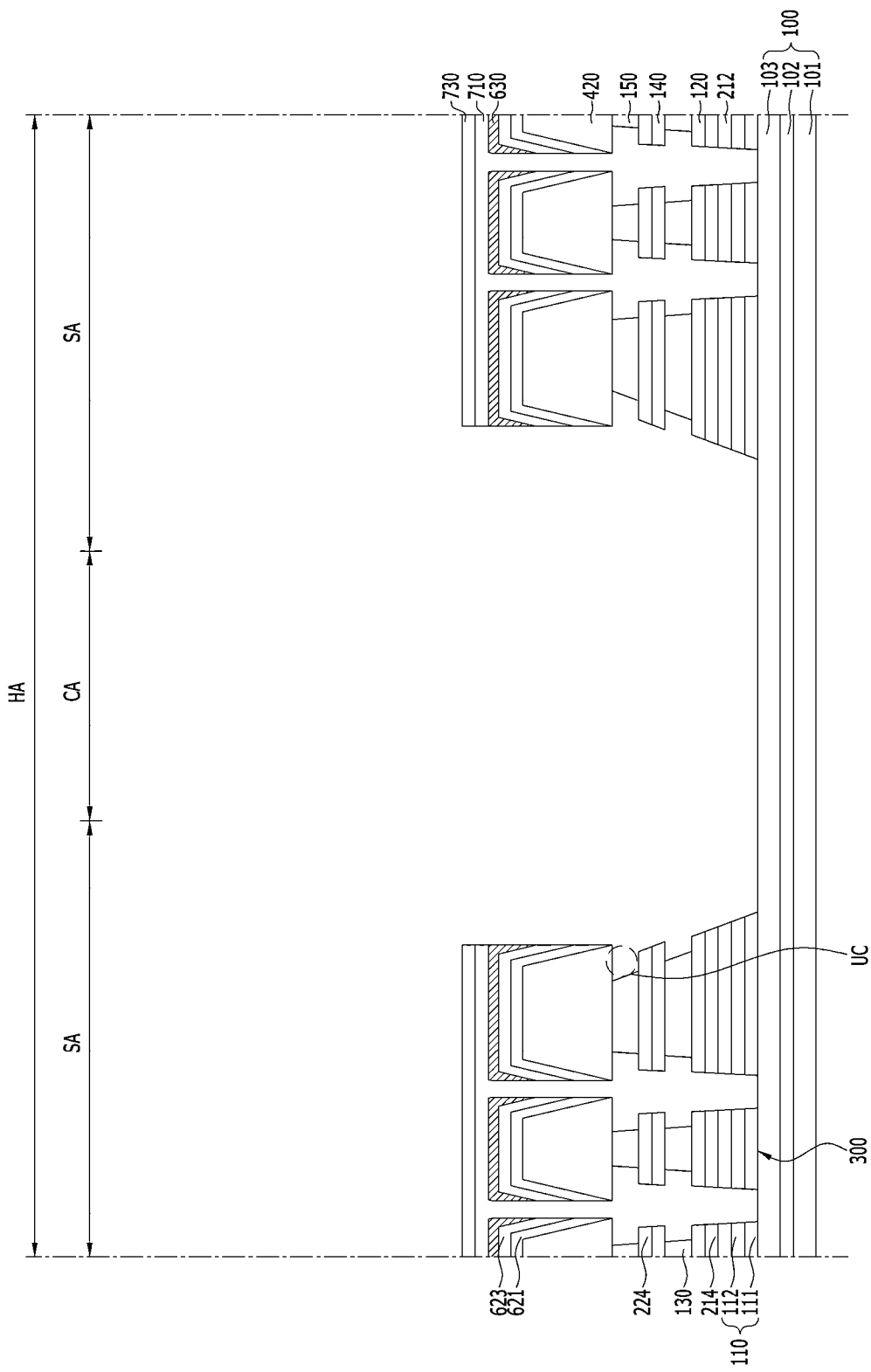
Figure 16C:
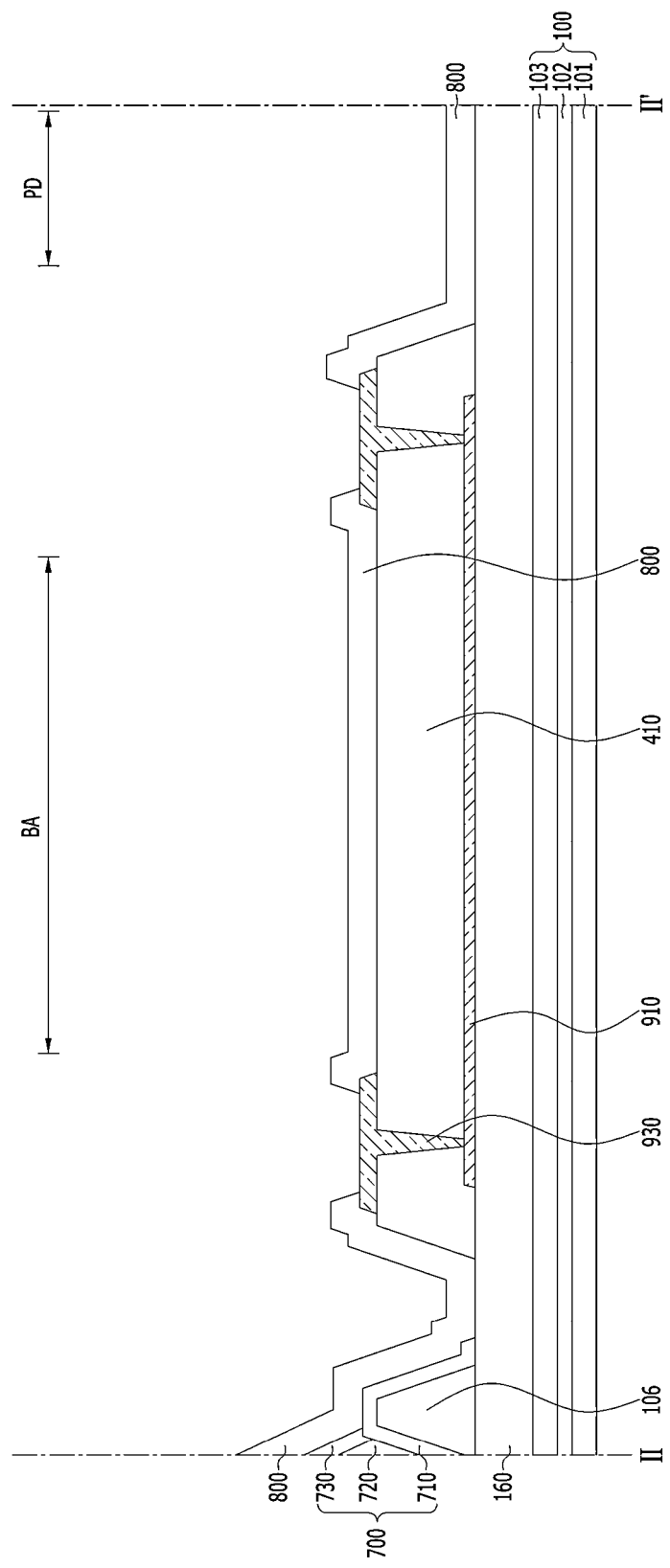
Figure 17A:
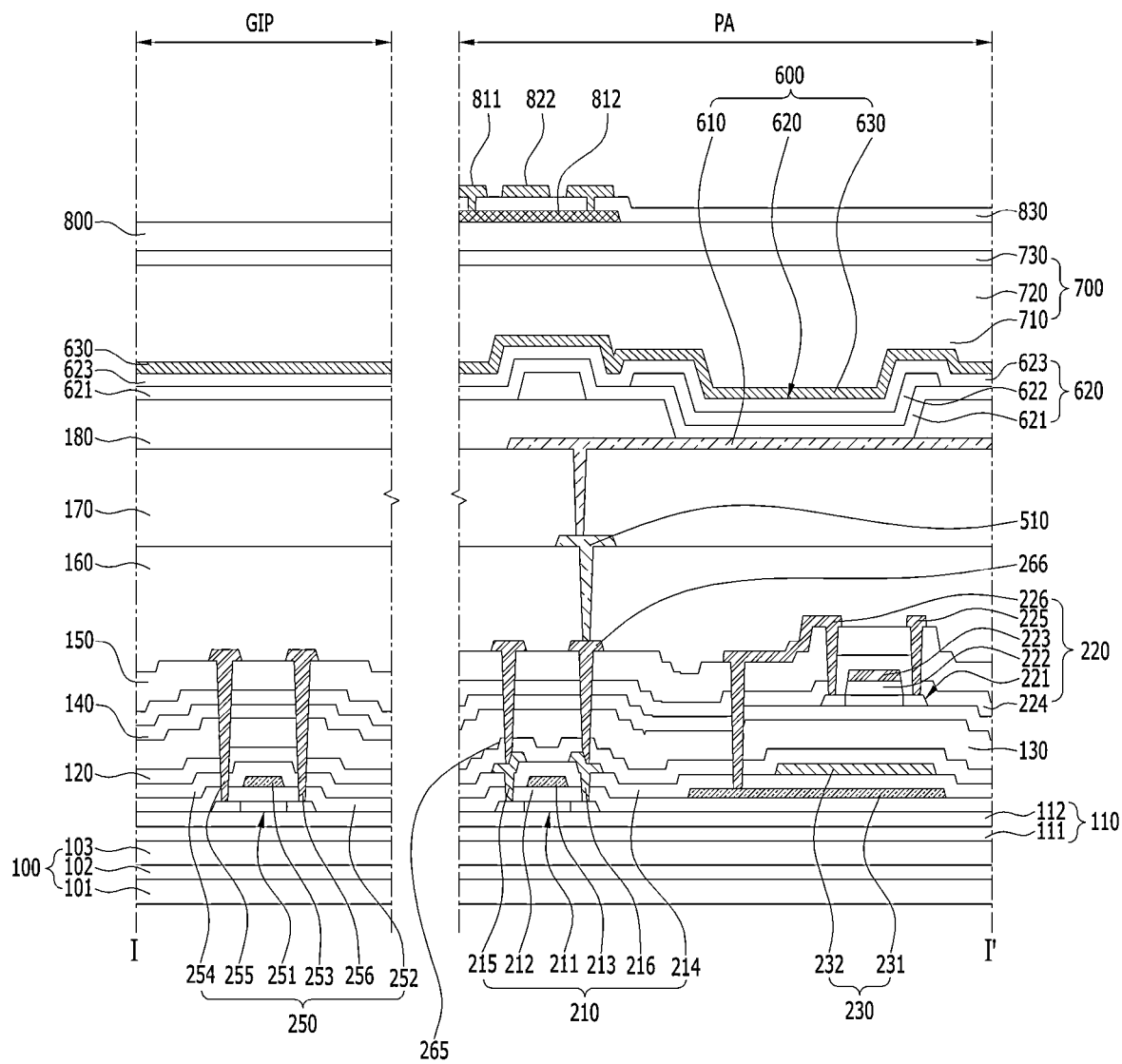
Figure 17B:
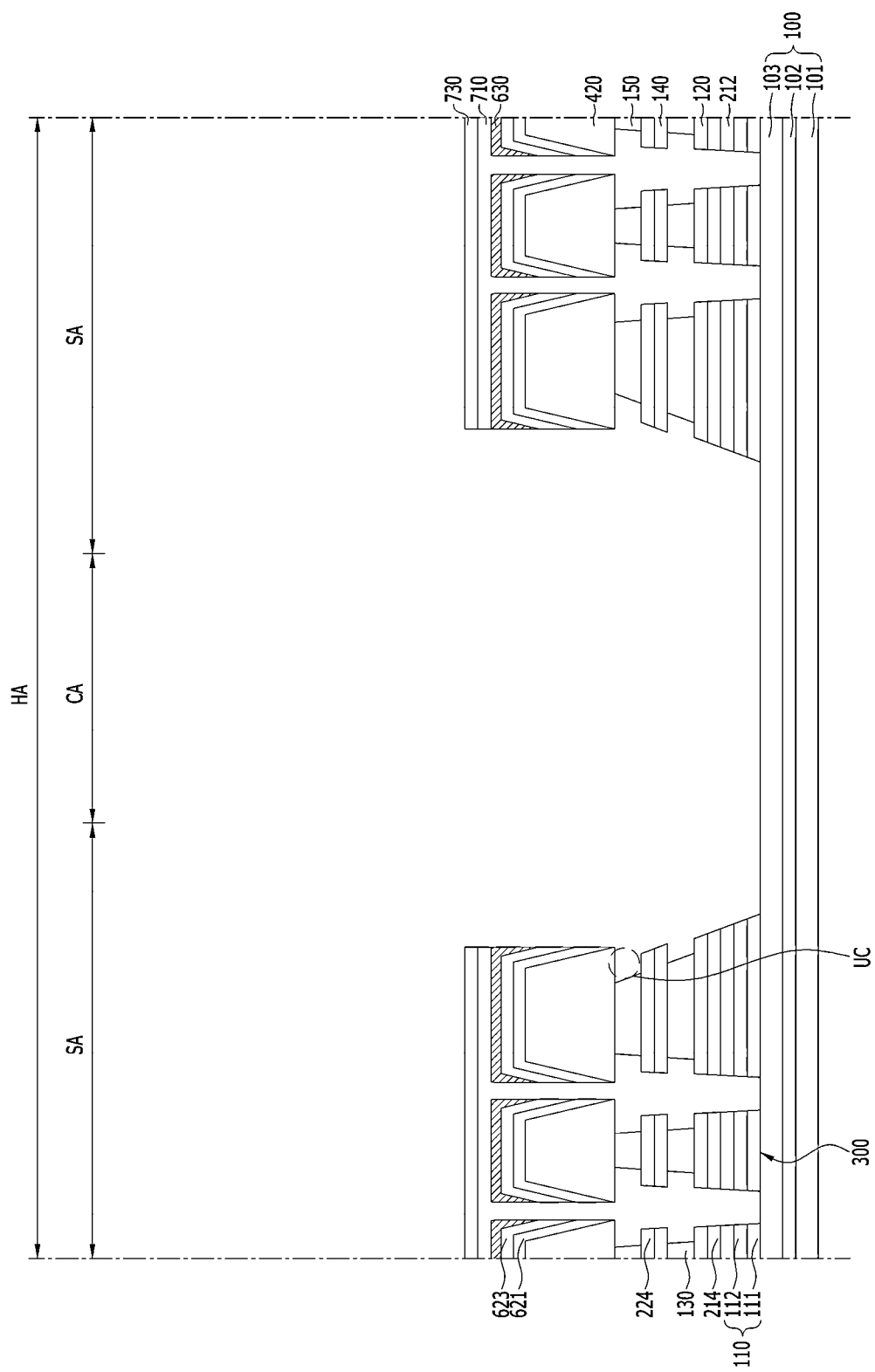
Figure 17C:
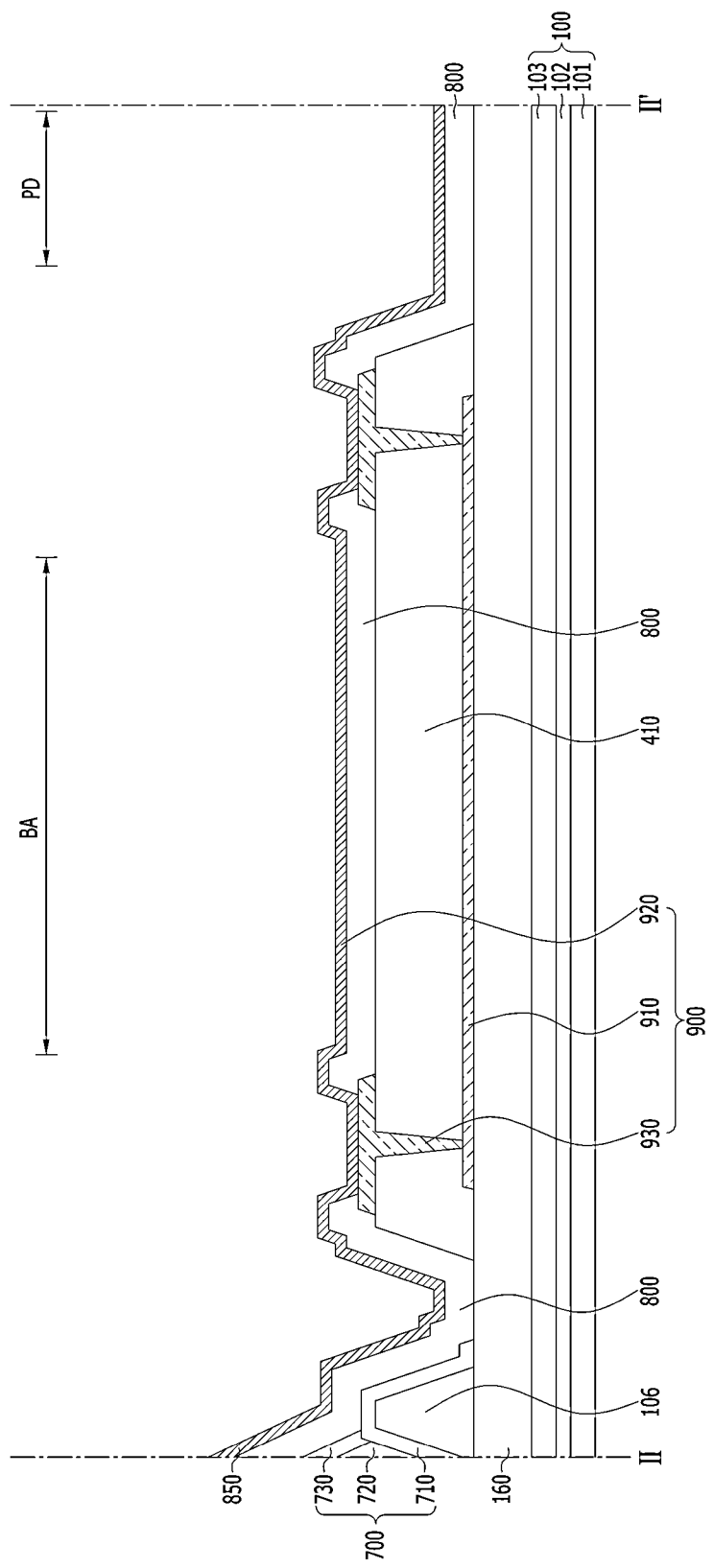

As shown in FIGS. 16A-16C, the method of forming the display apparatus according to the embodiment of the present disclosure may include a step of forming the encapsulating element 700 covering the light-emitting device 600 on the pixel area PA, a step of forming the touch buffer layer 800 on the encapsulating element 700, and a step of partially exposing the middle connecting electrode 930 by patterning the touch buffer layer 800.

The encapsulating element 700 may be not formed on the hole area CA, the bending area BA and the pad area PD of the device substrate 100. The touch buffer layer 800 may be not formed on the hole area CA of the device substrate 100. For example, the step of partially exposing the middle connecting electrode 930 may include a step of removing the encapsulating element 700 and the touch buffer layer 800 on the hole area CA of the device substrate 100.

As shown in FIGS. 1 and 17A-17C, the method of forming the display apparatus according to the embodiment of the present disclosure may include a step of forming the touch structure 810 and 820, the link line 850 and the upper connecting electrode 920 on the device substrate 100 in which the touch buffer layer 800 is formed.

The touch structure 810 and 820 may include the first touch electrode 811, the first bridge electrode 812, the second touch electrode 821 and the second bridge electrode 822. The second bridge electrode 822 may be insulated from the first bridge electrode 812. For example, the step of forming the touch structure 810 and 820 may include a step of forming the first bridge electrode 812 on the touch buffer layer 800, a step of forming the touch insulating layer 830 covering the first bridge electrode 812, a step of forming the touch contact hole partially exposing the first bridge electrode 812, and a step of forming the first touch electrode 811 connected to the first bridge electrode 812, the second touch electrode 821 disposed side by side with the first touch electrode 811, and the second bridge electrode 822 having a region overlapping with the first bridge electrode 812.

The touch insulating layer 830 may be not formed on the hole area CA, the bending area BA and the pad area PD of the device substrate 100. For example, the step of forming the touch insulating layer 830 may include a step of exposing the hole area CA, the bending area BA and the pad area PD of the device substrate 100.

The link line 850 may be in direct contact with the upper connecting electrode 920. The touch electrodes 811 and 821, the link line 850 and the upper connecting electrode 920 may be formed of the same material. For example, a step of forming the touch electrodes 811 and 821, the link line 850 and the upper connecting electrode 920 may include a step of forming a conductive layer on the device substrate 100 in which the touch insulating layer 830 is formed, and a step of patterning the conductive layer.

The upper connecting electrode 920 may be connected to a portion of the middle connecting electrode 930 exposed by the touch buffer layer 800. The upper connecting electrode 920 may cross the bending area BA. For example, the upper connecting electrode 920 may include a region overlapping with the lower connecting electrode 910. The lower connecting electrode 910, the upper connecting electrode 920 and the middle connecting electrode 930 may constitute the connection electrode 900 electrically connecting the display area AA to the pad area PD across the bending area BA. Thus, in the method of forming the display apparatus according to the embodiment of the present disclosure, the disconnection of the connection electrode 900 due to the bending stress and the external impact may be effectively reduced.

As shown in FIGS. 1 and 3A-3C, the method of forming the display apparatus according to the embodiment of the present disclosure may include a step of forming the cover insulating layer 890 covering the touch structure 810 and 820, the link line 850 and the upper connecting electrode 920, a step of defining the pads 104 and 804 in the pad area PD by patterning the cover insulating layer 890, and a step of forming the substrate hole CH at the hole area CA of the device substrate 100.

Accordingly, the display apparatus according to the embodiment of the present disclosure and the method thereof may include the connection electrode 900 connecting the display area AA to the pad area PD across the bending area BA, wherein the connection electrode 900 may have a stacked structure of the lower connecting electrode 910 and the upper connecting electrode 920, and wherein the upper connecting electrode 920 may be formed at the same time as the touch electrodes 811 and 821 which are a conductive layer disposed on the uppermost of the pixel area PA. Thus, in the display apparatus according to the embodiment of the present disclosure and the method thereof, the damage of the upper connecting electrode 920 due to the process of patterning a conductive layer may be prevented. And, in the display apparatus according to the embodiment of the present disclosure and the method thereof, the unintended connection between adjacent upper connection electrodes 920 due to a conductive residual layer generated by a subsequent process may be reduced. Furthermore, in the display apparatus according to the embodiment of the present disclosure and the method thereof, the conductive residual layer on the hole peripheral area HA may be removed by a process of forming the first emission electrode 610 and the middle connecting electrode 930. Thereby, in the display apparatus according to the embodiment of the present disclosure and the method thereof, the disconnection of the connection electrode 900 due to the bending stress and the external impact may be prevented, and the display area AA may be stably connected to the pad area PD. Also, in the display apparatus according to the embodiment of the present disclosure and the method thereof, the process efficiency may be improved.

In the result, the display apparatus according to the embodiments of the present disclosure and the method thereof may include the connection electrode across the bending area, wherein the connection electrode may have a stacked structure of the lower connecting electrode and the upper connecting electrode, and the upper connecting electrode may include the same material as the touch electrode on the encapsulating element covering the light-emitting device. Thus, in the display apparatus according to the embodiment of the present disclosure and the method thereof, the disconnection of the connection electrode due to the bending stress and the external impact may be reduced. Therefore, in the display apparatus according to the embodiment of the present disclosure and the method thereof, the display area AA may be stably connected to the pad area PD by the connection electrode.

What is claimed is:

1. A display apparatus comprising:
a device substrate including a display area and a bending area;
a first thin film transistor including a first semiconductor film, a first gate electrode, a first source electrode, and a first drain electrode in the display area;
a second thin film transistor including a second semiconductor film, a second gate electrode, a second source electrode, and a second drain electrode in the display area, the second semiconductor film on a layer different from the first semiconductor film in the display area;
a light-emitting device on the display area of the device substrate;
a passivation layer positioned between the second gate electrode and the second source electrode and positioned between the second gate electrode and the second drain electrode in the display area;
a first over-coat layer positioned on the passivation layer and positioned between the second source electrode and the light-emitting device and between the second drain electrode and the light-emitting device in the display area;
a second over-coat layer between the first over-coat layer and the light-emitting device in the display area;
an intermediate contact electrode positioned between the first over-coat layer and the second over-coat layer in the display area, and the light-emitting device and the first thin film transistor being electrically connected to each other through the intermediate contact electrode;
a lower connecting electrode on the bending area on the device substrate, the lower connecting electrode crossing the bending area; and
a crack preventing layer on the lower connecting electrode in the bending area; and
wherein the crack preventing layer includes a same material as the first over-coat layer,
the first over-coat layer is further disposed between the crack preventing layer and the device substrate in the bending area,
the lower connecting electrode is between the first over-coat layer and the crack preventing layer.

2. The display apparatus according to claim 1, further comprising:
a lower insulating layer between the device substrate and the second semiconductor film;
wherein the first semiconductor film and the first gate electrode are between the device substrate and the lower insulating layer, and the second semiconductor film and the second gate electrode are between the lower insulating layer and the first over-coat layer.

3. The display apparatus according to claim 1, wherein the first semiconductor film includes a low temperature poly-Si (LTPS) and the second semiconductor film includes a metal oxide.

4. The display apparatus according to claim 1, wherein the display area of the device substrate includes a hole peripheral area comprising a substrate hole that penetrates the device substrate.

5. The display apparatus according to claim 1,
wherein the intermediate contact electrode is electrically connected to the first drain electrode of the first thin film transistor.

6. The display apparatus according to claim 5, wherein the lower connecting electrode includes a same material as the intermediate contact electrode.

7. The display apparatus according to claim 1, further comprising:
an encapsulating element on the light-emitting device; and
touch electrodes on the encapsulating element in the display area;

wherein the touch electrodes are electrically connected to the lower connecting electrode through one of link lines.

8. The display apparatus according to claim 7, wherein the crack preventing layer includes a connection contact hole exposing a portion of the lower connecting electrode, and wherein the one of link lines is electrically connected to the lower connecting electrode through the connection contact hole.

9. The display apparatus according to claim 7, further comprising:
   a cover insulating layer is on the touch electrodes in the display area;
   wherein the cover insulating layer is on the crack preventing layer in the bending area.

* * * * *